(12) United States Patent
Tajalli et al.

(10) Patent No.: US 10,693,473 B2
(45) Date of Patent: Jun. 23, 2020

(54) MULTI-MODAL DATA-DRIVEN CLOCK RECOVERY CIRCUIT

(71) Applicant: Kandou Labs, S.A., Lausanne (CH)

(72) Inventors: Armin Tajalli, Salt Lake City, UT (US); Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 73 days.

(21) Appl. No.: 15/986,582

(22) Filed: May 22, 2018

(65) Prior Publication Data

US 2018/0343011 A1 Nov. 29, 2018

Related U.S. Application Data

(60) Provisional application No. 62/509,714, filed on May 22, 2017.

(51) Int. Cl.
| | | |
|---|---|---|
| H03L 7/00 | (2006.01) | |
| H03L 7/089 | (2006.01) | |
| H03L 7/099 | (2006.01) | |
| H03L 7/081 | (2006.01) | |
| H03L 7/23 | (2006.01) | |

(Continued)

(52) U.S. Cl.
CPC ............ *H03L 7/0891* (2013.01); *H03L 7/081* (2013.01); *H03L 7/0807* (2013.01); *H03L 7/089* (2013.01); *H03L 7/0812* (2013.01); *H03L 7/0896* (2013.01); *H03L 7/093* (2013.01); *H03L 7/0995* (2013.01); *H03L 7/0998* (2013.01); *H03L 7/23* (2013.01); *H03L 2207/06* (2013.01)

(58) Field of Classification Search
None
See application file for complete search history.

(56) References Cited

U.S. PATENT DOCUMENTS 3,196,351 A 7/1965 David
3,970,795 A 7/1976 Allen
(Continued)

FOREIGN PATENT DOCUMENTS

CN 1864346 A 11/2006
CN 101854223 A 10/2010
(Continued)

OTHER PUBLICATIONS

W. Wang, J. Jiao and N. Liu, "Design and realization of local oscillator for VHF survival receiver," 2010 IEEE International Conference on Robotics and Biomimetics, Tianjin, 2010, pp. 1116-1120.doi: 10.1109/ROBIO.2010.5723484 (Year: 2010).*
Healey, Adam , et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

(Continued)

*Primary Examiner* — Daniel F. McMahon
(74) *Attorney, Agent, or Firm* — Invention Mine LLC

(57) ABSTRACT

Multi-mode non-return-to-zero (NRZ) and orthogonal differential vector signaling (ODVS) clock and data recovery circuits having configurable sub-channel multi-input comparator (MIC) circuits for forming a composite phase-error signal from a plurality of data-driven phase-error signals generated using phase detectors in a plurality of receivers configured as ODVS sub-channel MICs generating orthogonal sub-channel outputs in a first mode and a separate first and second data driven phase-error signal from two receivers of a plurality of receivers configured as NRZ receivers in a second mode.

20 Claims, 34 Drawing Sheets

(51) Int. Cl.
*H03L 7/08* (2006.01)
*H03L 7/093* (2006.01)

(56) References Cited

U.S. PATENT DOCUMENTS

| | | | |
|---|---|---|---|
| 4,163,258 A | 7/1979 | Ebihara et al. | |
| 4,499,550 A | 2/1985 | Ray et al. | |
| 4,839,907 A | 6/1989 | Saneski | |
| 5,053,974 A | 10/1991 | Penz | |
| 5,166,956 A | 11/1992 | Baltus et al. | |
| 5,266,907 A | 11/1993 | Dacus | |
| 5,311,516 A | 5/1994 | Kuznicki et al. | |
| 5,331,320 A | 7/1994 | Cideciyan et al. | |
| 5,412,689 A | 5/1995 | Chan et al. | |
| 5,449,895 A | 9/1995 | Hecht et al. | |
| 5,528,198 A | 6/1996 | Baba et al. | |
| 5,553,097 A | 9/1996 | Dagher | |
| 5,602,884 A | 2/1997 | Wieczorkiewicz et al. | |
| 5,629,651 A | 5/1997 | Mizuno | |
| 5,802,356 A | 9/1998 | Gaskins et al. | |
| 5,856,935 A | 1/1999 | Moy et al. | |
| 5,982,954 A | 11/1999 | Delen et al. | |
| 6,005,895 A | 12/1999 | Perino et al. | |
| 6,026,134 A | 2/2000 | Duffy et al. | |
| 6,084,883 A | 7/2000 | Norrell et al. | |
| 6,084,958 A | 7/2000 | Blossom | |
| 6,097,732 A | 8/2000 | Jung | |
| 6,154,498 A | 11/2000 | Dabral et al. | |
| 6,226,330 B1 | 5/2001 | Mansur | |
| 6,278,740 B1 | 8/2001 | Nordyke | |
| 6,307,906 B1 | 10/2001 | Tanji et al. | |
| 6,316,987 B1 | 11/2001 | Dally et al. | |
| 6,317,465 B1 | 11/2001 | Akamatsu et al. | |
| 6,359,931 B1 | 3/2002 | Perino et al. | |
| 6,380,783 B1 | 4/2002 | Chao et al. | |
| 6,389,091 B1 | 5/2002 | Yamaguchi et al. | |
| 6,452,420 B1 | 9/2002 | Wong | |
| 6,483,828 B1 | 11/2002 | Balachandran et al. | |
| 6,504,875 B2 | 1/2003 | Perino et al. | |
| 6,509,773 B2 | 1/2003 | Buchwald et al. | |
| 6,556,628 B1 | 4/2003 | Poulton et al. | |
| 6,621,427 B2 | 9/2003 | Greenstreet | |
| 6,621,945 B2 | 9/2003 | Bissessur | |
| 6,650,638 B1 | 11/2003 | Walker et al. | |
| 6,661,355 B2 | 12/2003 | Cornelius et al. | |
| 6,717,478 B1 | 4/2004 | Kim et al. | |
| 6,766,342 B2 | 7/2004 | Kechriotis | |
| 6,865,236 B1 | 3/2005 | Terry | |
| 6,876,317 B2 | 4/2005 | Sankaran | |
| 6,898,724 B2 | 5/2005 | Chang | |
| 6,954,492 B1 | 10/2005 | Williams | |
| 6,990,138 B2 | 1/2006 | Bejjani et al. | |
| 6,999,516 B1 | 2/2006 | Rajan | |
| 7,023,817 B2 | 4/2006 | Kuffner et al. | |
| 7,039,136 B2 | 5/2006 | Olson et al. | |
| 7,075,996 B2 | 7/2006 | Simon et al. | |
| 7,127,003 B2 | 10/2006 | Rajan et al. | |
| 7,142,612 B2 | 11/2006 | Horowitz et al. | |
| 7,167,523 B2 | 1/2007 | Mansur | |
| 7,180,949 B2 | 2/2007 | Kleveland et al. | |
| 7,184,483 B2 | 2/2007 | Rajan | |
| 7,199,728 B2 | 4/2007 | Dally et al. | |
| 7,269,212 B1 | 9/2007 | Chau et al. | |
| 7,336,112 B1 | 2/2008 | Sha et al. | |
| 7,356,213 B1 | 4/2008 | Cunningham et al. | |
| 7,358,869 B1 | 4/2008 | Chiarulli et al. | |
| 7,535,957 B2 | 5/2009 | Ozawa et al. | |
| 7,616,075 B2 | 11/2009 | Kushiyama | |
| 7,633,850 B2 | 12/2009 | Ann | |
| 7,650,525 B1 | 1/2010 | Chang et al. | |
| 7,656,321 B2 | 2/2010 | Wang | |
| 7,688,929 B2 | 3/2010 | Co | |
| 7,706,456 B2 | 4/2010 | Laroia et al. | |
| 7,746,764 B2 | 6/2010 | Rawlins et al. | |
| 7,860,190 B2 | 12/2010 | Feller | |
| 7,868,790 B2 | 1/2011 | Bae | |
| 7,869,546 B2 | 1/2011 | Tsai | |
| 7,899,653 B2 | 3/2011 | Hollis | |
| 8,036,300 B2 | 10/2011 | Evans et al. | |
| 8,050,332 B2 | 11/2011 | Chung et al. | |
| 8,055,095 B2 | 11/2011 | Palotai et al. | |
| 8,149,906 B2 | 4/2012 | Saito et al. | |
| 8,159,375 B2 | 4/2012 | Abbasfar | |
| 8,159,376 B2 | 4/2012 | Abbasfar | |
| 8,199,849 B2 | 6/2012 | Oh et al. | |
| 8,199,863 B2 | 6/2012 | Chen et al. | |
| 8,218,670 B2 | 7/2012 | Abou | |
| 8,245,094 B2 | 8/2012 | Jiang et al. | |
| 8,253,454 B2 | 8/2012 | Lin | |
| 8,279,745 B2 | 10/2012 | Dent | |
| 8,279,976 B2 | 10/2012 | Lin et al. | |
| 8,284,848 B2 | 10/2012 | Nam et al. | |
| 8,289,914 B2 | 10/2012 | Li et al. | |
| 8,295,250 B2 | 10/2012 | Gorokhov et al. | |
| 8,365,035 B2 | 1/2013 | Hara | |
| 8,472,513 B2 | 6/2013 | Malipatil et al. | |
| 8,498,368 B1 | 7/2013 | Rusted et al. | |
| 8,520,493 B2 | 8/2013 | Goulahsen | |
| 8,539,318 B2 | 9/2013 | Shokrollahi et al. | |
| 8,577,284 B2 | 11/2013 | Seo et al. | |
| 8,588,254 B2 | 11/2013 | Diab et al. | |
| 8,588,280 B2 | 11/2013 | Oh et al. | |
| 8,593,305 B1 | 11/2013 | Tajalli et al. | |
| 8,620,166 B2 | 12/2013 | Guha | |
| 8,644,497 B2 | 2/2014 | Clausen et al. | |
| 8,649,445 B2 | 2/2014 | Cronie et al. | |
| 8,687,968 B2 | 4/2014 | Nosaka et al. | |
| 8,718,184 B1 | 5/2014 | Cronie et al. | |
| 8,755,426 B1 | 6/2014 | Cronie et al. | |
| 8,773,964 B2 | 7/2014 | Hsueh et al. | |
| 8,780,687 B2 | 7/2014 | Clausen et al. | |
| 8,791,735 B1 | 7/2014 | Shibasaki | |
| 8,831,440 B2 | 9/2014 | Yu et al. | |
| 8,879,660 B1 | 11/2014 | Peng et al. | |
| 8,938,171 B2 | 1/2015 | Tang et al. | |
| 8,949,693 B2 | 2/2015 | Ordentlich et al. | |
| 8,989,317 B1 | 3/2015 | Holden et al. | |
| 8,996,740 B2 | 3/2015 | Wiley et al. | |
| 9,015,566 B2 | 4/2015 | Cronie et al. | |
| 9,036,764 B1 | 5/2015 | Hossain et al. | |
| 9,059,816 B1 | 6/2015 | Simpson et al. | |
| 9,071,476 B2 | 6/2015 | Fox et al. | |
| 9,077,386 B1 | 7/2015 | Holden et al. | |
| 9,100,232 B1 | 8/2015 | Hormati et al. | |
| 9,197,470 B2 | 11/2015 | Okunev | |
| 9,246,713 B2 | 1/2016 | Shokrollahi | |
| 9,251,873 B1 | 2/2016 | Fox et al. | |
| 9,288,082 B1 | 3/2016 | Ulrich et al. | |
| 9,288,089 B2 | 3/2016 | Cronie et al. | |
| 9,306,621 B2 | 4/2016 | Zhang et al. | |
| 9,331,962 B2 | 5/2016 | Lida et al. | |
| 9,362,974 B2 | 6/2016 | Fox et al. | |
| 9,363,114 B2 | 6/2016 | Shokrollahi et al. | |
| 9,374,250 B1 | 6/2016 | Musah et al. | |
| 9,397,868 B1 | 7/2016 | Hossain et al. | |
| 9,401,828 B2 | 7/2016 | Cronie et al. | |
| 9,432,082 B2 | 8/2016 | Ulrich et al. | |
| 9,438,409 B1 | 9/2016 | Liao et al. | |
| 9,461,862 B2 | 10/2016 | Holden et al. | |
| 9,479,369 B1 | 10/2016 | Shokrollahi | |
| 9,509,437 B2 | 11/2016 | Shokrollahi | |
| 9,520,883 B2 | 12/2016 | Shibasaki | |
| 9,537,644 B2 | 1/2017 | Jones et al. | |
| 9,565,036 B2 | 2/2017 | Zerbe et al. | |
| 9,577,815 B1 * | 2/2017 | Simpson | H04L 7/0012 |
| 9,602,111 B1 | 3/2017 | Shen et al. | |
| 9,634,797 B2 | 4/2017 | Benammar et al. | |
| 9,667,379 B2 | 5/2017 | Cronie et al. | |
| 9,710,412 B2 | 7/2017 | Sengoku | |
| 9,906,358 B1 | 2/2018 | Tajalli | |
| 9,960,902 B1 | 5/2018 | Lin et al. | |
| 10,055,372 B2 | 8/2018 | Shokrollahi | |
| 2001/0006538 A1 | 7/2001 | Simon et al. | |
| 2002/0044316 A1 | 4/2002 | Myers | |

(56) References Cited

U.S. PATENT DOCUMENTS

| | | |
|---|---|---|
| 2002/0152340 A1 | 10/2002 | Dreps et al. |
| 2002/0174373 A1 | 11/2002 | Chang |
| 2002/0181607 A1 | 12/2002 | Izumi |
| 2003/0001557 A1 | 1/2003 | Pisipaty |
| 2003/0086366 A1 | 5/2003 | Branlund et al. |
| 2003/0146783 A1 | 8/2003 | Bandy et al. |
| 2004/0057525 A1 | 3/2004 | Rajan et al. |
| 2004/0092240 A1 | 5/2004 | Hayashi |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0024117 A1 | 2/2005 | Kubo et al. |
| 2005/0084050 A1 | 4/2005 | Cheung et al. |
| 2005/0117404 A1* | 6/2005 | Savoj .......... H03D 13/004 365/189.05 |
| 2005/0128018 A1 | 6/2005 | Meltzer |
| 2005/0201491 A1 | 9/2005 | Wei |
| 2005/0213686 A1 | 9/2005 | Love et al. |
| 2005/0220182 A1 | 10/2005 | Kuwata |
| 2005/0275470 A1 | 12/2005 | Choi |
| 2006/0013331 A1 | 1/2006 | Choi et al. |
| 2006/0126751 A1 | 6/2006 | Bessios |
| 2006/0140324 A1 | 6/2006 | Casper et al. |
| 2006/0159005 A1 | 7/2006 | Rawlins et al. |
| 2006/0232461 A1 | 10/2006 | Felder |
| 2006/0291589 A1 | 12/2006 | Eliezer et al. |
| 2007/0001713 A1 | 1/2007 | Lin |
| 2007/0001723 A1 | 1/2007 | Lin |
| 2007/0030796 A1 | 2/2007 | Green |
| 2007/0047689 A1 | 3/2007 | Menolfi et al. |
| 2007/0147559 A1 | 6/2007 | Lapointe |
| 2007/0201597 A1 | 8/2007 | He et al. |
| 2008/0007367 A1 | 1/2008 | Kim |
| 2008/0104374 A1 | 5/2008 | Mohamed |
| 2008/0181289 A1 | 7/2008 | Moll |
| 2008/0192621 A1 | 8/2008 | Suehiro |
| 2008/0316070 A1 | 12/2008 | Van et al. |
| 2008/0317188 A1 | 12/2008 | Staszewski et al. |
| 2009/0046009 A1 | 2/2009 | Fujii |
| 2009/0059782 A1 | 3/2009 | Cole |
| 2009/0103675 A1 | 4/2009 | Yousefi et al. |
| 2009/0154604 A1 | 6/2009 | Lee et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0262876 A1 | 10/2009 | Arima et al. |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0156543 A1 | 6/2010 | Dubey |
| 2010/0180143 A1 | 7/2010 | Ware et al. |
| 2010/0215112 A1 | 8/2010 | Tsai et al. |
| 2010/0220828 A1 | 9/2010 | Fuller et al. |
| 2010/0235673 A1 | 9/2010 | Abbasfar |
| 2010/0296556 A1 | 11/2010 | Rave et al. |
| 2010/0309964 A1 | 12/2010 | Oh et al. |
| 2011/0002181 A1 | 1/2011 | Wang et al. |
| 2011/0014865 A1 | 1/2011 | Seo et al. |
| 2011/0025392 A1 | 2/2011 | Wu et al. |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0299555 A1 | 12/2011 | Cronie et al. |
| 2011/0302478 A1 | 12/2011 | Cronie et al. |
| 2011/0311008 A1* | 12/2011 | Slezak .......... H03M 9/00 375/353 |
| 2012/0206177 A1 | 8/2012 | Colinet et al. |
| 2012/0213299 A1 | 8/2012 | Cronie et al. |
| 2012/0327993 A1 | 12/2012 | Palmer |
| 2013/0010892 A1 | 1/2013 | Cronie et al. |
| 2013/0013870 A1 | 1/2013 | Cronie et al. |
| 2013/0088274 A1 | 4/2013 | Gu |
| 2013/0091392 A1 | 4/2013 | Valliappan et al. |
| 2013/0114392 A1 | 5/2013 | Sun et al. |
| 2013/0207706 A1 | 8/2013 | Yanagisawa |
| 2013/0243127 A1 | 9/2013 | Ito et al. |
| 2013/0259113 A1 | 10/2013 | Kumar |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0177645 A1 | 6/2014 | Cronie et al. |
| 2014/0254642 A1 | 9/2014 | Fox et al. |
| 2014/0286381 A1 | 9/2014 | Shibasaki |
| 2015/0078479 A1 | 3/2015 | Whitby-Strevens |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0256326 A1 | 9/2015 | Simpson et al. |
| 2015/0280841 A1* | 10/2015 | Gudovskiy .......... H04B 17/20 375/226 |
| 2015/0333940 A1 | 11/2015 | Shokrollahi |
| 2015/0349835 A1 | 12/2015 | Fox et al. |
| 2015/0365263 A1 | 12/2015 | Zhang et al. |
| 2015/0380087 A1 | 12/2015 | Mittelholzer et al. |
| 2015/0381768 A1 | 12/2015 | Fox et al. |
| 2016/0020824 A1 | 1/2016 | Ulrich et al. |
| 2016/0036616 A1* | 2/2016 | Holden .......... H04L 27/2637 375/260 |
| 2016/0056980 A1 | 2/2016 | Wang et al. |
| 2016/0134267 A1 | 5/2016 | Adachi |
| 2016/0218894 A1 | 7/2016 | Fox et al. |
| 2016/0380787 A1 | 12/2016 | Hormati et al. |
| 2017/0272285 A1 | 9/2017 | Shokrollahi et al. |
| 2017/0310456 A1 | 10/2017 | Tajalli |
| 2018/0083763 A1 | 3/2018 | Black et al. |
| 2018/0375693 A1 | 12/2018 | Zhou et al. |
| 2019/0103903 A1 | 4/2019 | Yang |

FOREIGN PATENT DOCUMENTS

| | | |
|---|---|---|
| CN | 203675093 U | 6/2014 |
| EP | 0740423 A2 | 10/1996 |
| JP | 2003163612 A | 6/2003 |
| WO | 2009084121 A1 | 7/2009 |
| WO | 2010031824 A1 | 3/2010 |

OTHER PUBLICATIONS

M. W. Riley, J. D. Warnock and D. F. Wendel, "Cell Broadband Engine processor: Design and implementation," in IBM Journal of Research and Development, vol. 51, No. 5, pp. 545-557, Sep. 2007. (Year: 2007).*

Abbasfar, Aliazam, "Generalized Differential Vector Signaling", IEEE International Conference on Communications, ICC '09, Jun. 14, 2019, 1-5 (5 pages).

Anonymous, "Constant-weight code", Wikipedia.org, retrieved on Feb. 6, 2017, (3 pages).

Counts, Lew, et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor, et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Farzan, Kamran, et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

(56) References Cited

OTHER PUBLICATIONS

Holden, Brian, "An exploration of the technical feasibility of the major technology options for 400GE backplanes", IEEE 802.3 400GE Study Group, Geneva, CH, Jul. 16, 2013, 1-18 (18 pages).

Holden, Brian, "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian, "Using Ensemble NRZ Coding for 400GE Electrical Interfaces", IEEE 802.3 400GE Study Group, May 17, 2013, 1-24 (24 pages).

Jiang, Anxiao, et al., "Rank Modulation for Flash Memories", IEEE Transactions of Information Theory, vol. 55, No. 6, Jun. 2009, 2659-2673 (16 pages).

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

Oh, Dan, et al., "Pseudo-Differential Vector Signaling for Noise Reduction in Single-Ended Signaling Systems", DesignCon 2009, Rambus Inc., Jan. 2009, (22 pages).

Poulton, John, "Multiwire Differential Signaling", UNC-CH Department of Computer Science Version 1.1, Aug. 6, 2003, 1-20 (20 pages).

She, James, et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo, et al., "A Method for the Analysis of Signals: the Square-Wave Method", Revista de Matematica: Teoria y Aplicationes, vol. 15, No. 2, Mar. 2008, 109-129 (21 pages).

Slepian, David, "Permutation Modulation", Proceedings of the IEE, vol. 53, No. 3, Mar. 1965, 228-236 (9 pages).

Wang, Xin, et al., "Applying CDMA Technique to Network-on-Chip", IEEE Transactions on Very Large Scale Integration (VLSI) Systems, vol. 15, No. 10, Oct. 1, 2007, 1091-1100 (10 pages).

\* cited by examiner n(a) = 000 001 001 002 ... 126 126 127
n(b) = 127 127 126 126 ... 001 000 000

MULTI-MODAL DATA-DRIVEN CLOCK RECOVERY CIRCUIT

CROSS-REFERENCE TO RELATED APPLICATIONS

This application claims the benefit of U.S. Provisional Application No. 62/509,714, filed May 22, 2017, naming Armin Tajalli and Ali Hormati, entitled "Multi-Modal Data-Driven Clock Recovery Circuit", the contents of which are hereby incorporated herein by reference in its entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/288,717, filed Apr. 22, 2016, naming Armin Tajalli, entitled "High Performance Phase Locked Loop", hereinafter identified as [Tajalli IV].

U.S. Provisional Patent Application No. 62/395,993, filed Sep. 16, 2016, naming Armin Tajalli, entitled "Matrix Phase Detector Element for Phase Locked Loop", hereinafter identified as [Tajalli VI].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli V].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 Oct. 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

U.S. Pat. No. 7,492,850, filed Aug. 31, 2005 by Christian Ivo Menolfi and Thomas Helmut Toifl, entitled "Phase locked loop apparatus with adjustable phase shift" (hereafter called [Menolfi].)

"A Calibration-Free Fractional-N Ring PLL Using Hybrid Phase/Current-Mode Phase Interpolation Method", by Romesh Kumar Nandwana et al, IEEE Journal of Solid-State Circuits Vol. 50, No. 4, April 2015, ppg. 882-895, (hereafter called [Nandwana].)

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Methods and systems are described for receiving, at a data-driven phase comparator circuit, a plurality of data signals in parallel from a plurality of multi-input comparators (MICs) connected to a multi-wire bus, wherein at least one MIC is connected to at least three wires of the multi-wire bus, and one or more phases of a local oscillator signal, the data-driven phase comparator circuit comprising a plurality of partial phase comparators, generating a plurality of partial phase-error signals using the partial phase comparators, each partial phase-error signal generated by receiving (i) a corresponding phase of the local oscillator signal and (ii) a corresponding data signal of the plurality of data signals and responsive to a determination that a transition occurred in the corresponding data signal, generating the partial phase-error signal based on a comparison of the corresponding phase of the local oscillator signal and the corresponding data signal, and generating a composite phase-error signal by summing the plurality of partial phase error signals, the composite phase-error signal for setting a local oscillator generating the one or more phases of the local oscillator signal in a lock condition.

Embodiments are described in which the Phase Detection and phase adjustment elements are combined, leading to lower circuit node capacitance and reduced circuit delays, these improvements in turn enabling increased loop stability and improved PLL lock characteristics, including increased loop lock bandwidth leading to lower clock jitter and improved power supply noise rejection.

Embodiments are also described in which a Delay-Locked Loop is used to convert the received reference clock signal into multiple reference clock phases, converting the PLL phase comparison operation into multiple comparisons made between a reference clock phase and a local clock phase. A summation or weighted summation of the multiple comparison results is then used as the error feedback signal for the PLL. A further embodiment is described in which multiple comparisons are made between a single received reference clock phase and multiple local clock phases, with the weighted sum of the multiple comparison results used as the error feedback term for the PLL. In at least one such further embodiment, said weighted sums comprise a two dimensional time domain filter.

DETAILED DESCRIPTION

Figure 1:
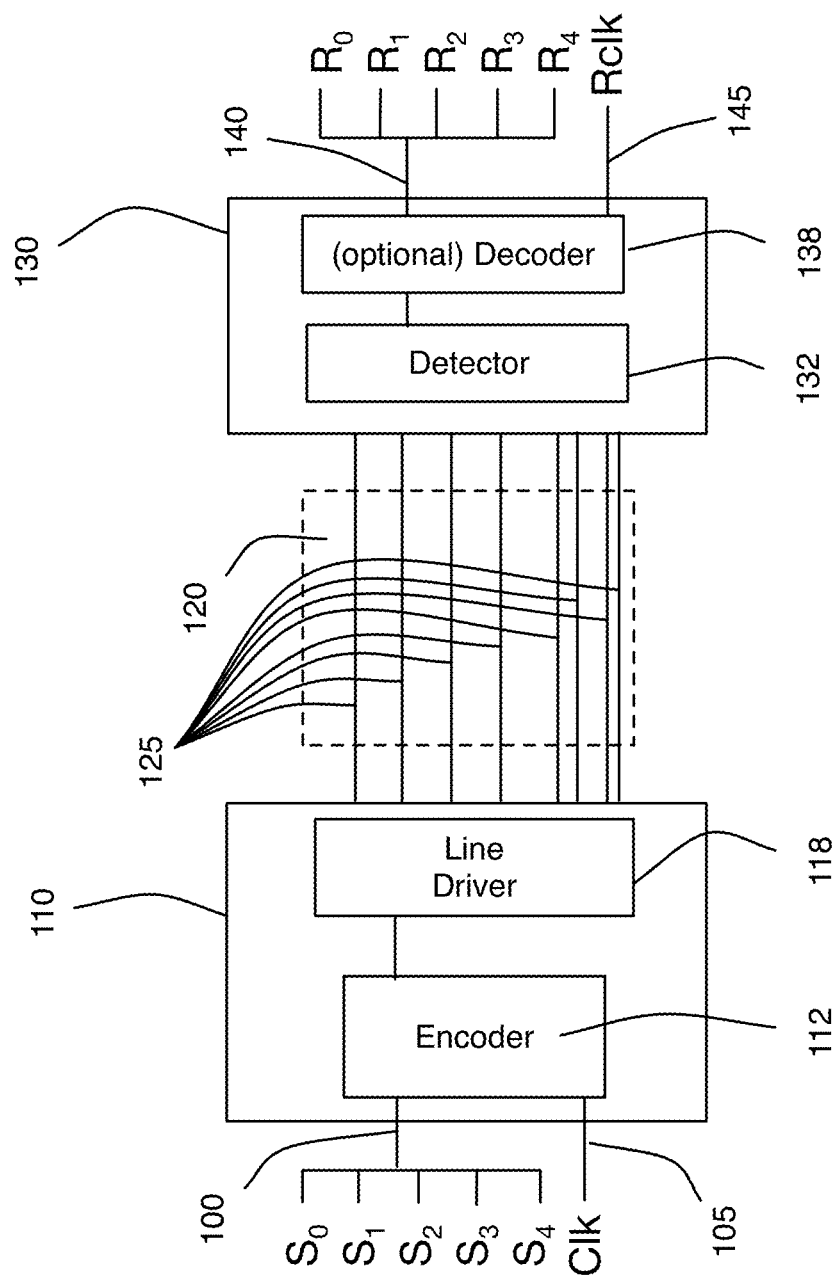
FIG. 1 is a block diagram of one embodiment capable of encoding and transmitting five data bits and a clock on an eight wire communications channel.

As described in [Cronie I], [Cronie II], [Cronie III] and [Cronie IV], vector signaling codes may be used to produce extremely high bandwidth data communications links, such as between two integrated circuit devices in a system. As illustrated by the embodiment of FIG. 1, multiple data communications channels transmit symbols of the vector signaling code, acting together to communicate codewords of the vector signaling code. Depending on the particular vector signaling code used, the number of channels comprising a communications link may range from two to eight or more, and may also communicate one or more clock signals on separate communications channels or as sub-channel components of the vector signaling code. In the example of FIG. 1, communication link 120 is illustrated as being composed of eight wires 125, collectively communicating five data values 100 and one clock 105 between transmitter 110 and receiver 130.

Individual symbols, e.g. transmissions on any single communications channel, may utilize multiple signal levels, often three or more. Operation at channel rates exceeding 10 Gbps may further complicate receive behavior by requiring deeply pipelined or parallelized signal processing, precluding reception methods that include the previous received value to be known as the current value is being received.

Embodiments described herein can also be applied to prior art permutation sorting methods not covered by the vector processing methods of [Cronie II], [Cronie III], [Cronie IV], and/or [Tajalli I]. More generally, embodiments may apply to any communication or storage methods requiring coordination of multiple channels or elements of the channel to produce a coherent aggregate result.

Receiver Data Detection

To provide context for the following examples, one typical high-speed receiver embodiment [Stewart I] is used for illustrative purposes, without limitation.

Figure 2:
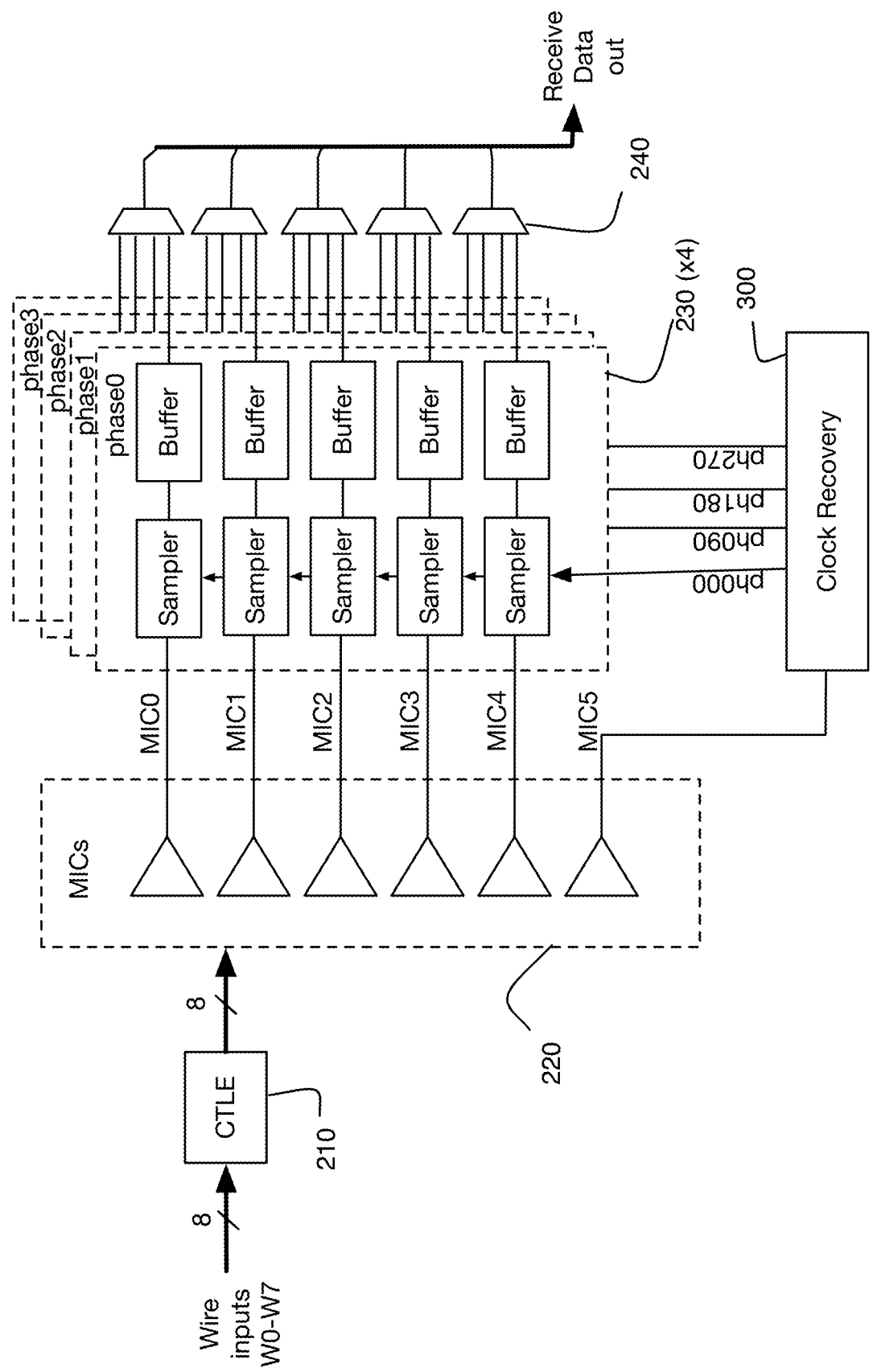
FIG. 2 is a block diagram of one embodiment of a receiver compatible with the transmitter of FIG. 1.

As illustrated in FIG. 2, the example data receiver includes eight identical Continuous Time Linear Equalization (CTLE) stages 210 operating on the signals received on the eight wires, previously shown as 120 in FIG. 1.

As described in [Tajalli I], [Holden I] and [Ulrich I], vector signaling codes may be efficiently detected by linearly combining sets of input signals using Multi-Input comparators or mixers (MIC). For the 5b6w code used by the example receiver, five such mixers acting on weighted subsets of the six received data input signals will detect the five data bits without need of further decoding. One additional mixer acting on combinations of the two received clock signals will similarly detect the clock signal. In FIG. 2, this set of six MIC mixers 220 operate on the received and equalized signals to produce detected signals MIC0-MIC5.

Because of the high data rates involved, multiple parallel phases of receive processing are shown in the example receiver. In one embodiment, the five detected data signals MIC0-MIC4 are processed in four parallel phases of receive data processing, each phase 230 including five data samplers and subsequent buffering, followed by recombination of the four phase outputs into a received data stream, shown in FIG. 2 as being performed by multiplexers 240.

Clock Recovery circuits (also known in the art as Clock Data Recovery or CDR) support such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. In the embodiment of FIG. 2, the detected clock signal is obtained at MIC5 and processed 300 to extract properly timed sampling clocks for the four data phases.

Other embodiments may forgo the dedicated wires used to communicate a separate clock signal, and instead require the receiver to extract a clock from transitions occurring on the data lines themselves. As is well understood in the art, successful application of this technique benefits from a sufficiently large transition density on the data lines (which may be alternatively interpreted as requiring a sufficiently small interval between transitions,) and/or sufficient free-running frequency stability within the PLL to maintain accurate data sample timing during non-transition intervals. [Shokrollahi I] describes suitable vector signaling codes having such guaranteed transition density. Alternatively, known art transition-enforcing encoding such as the commonly utilized 8b10b and 64b66b codes may be applied to all or some subset of the data encoded for transmission to insure a guaranteed minimum transition density at the receiver. In one embodiment, bit level transition encoding may be performed on the composite data bit stream, or may be applied to a bit stream being applied to given sub-channel, or may be applied to bits being modulated onto sub-channels in a given transmit and/or receive slice, or applied to bits being modulated onto a given sub-channel (or each sub-channel) in each slice.

PLL Overview

Phase Locked Loops are well represented in the literature. A typical PLL is composed of a phase detector that compares an external reference signal to an internal clock signal, a low pass filter that smoothes the resulting error value to produce a clock control signal, and a variable frequency clock source (typically, a Voltage Controlled Oscillator or VCO) controlled by the smoothed error value, producing the internal clock signal presented to the phase detector. In a well-know variation, such a PLL design may incorporate a clock frequency divider between the VCO and the phase detector, allowing a higher-frequency clock output to be phase locked to a lower-frequency reference signal.

In an alternative embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, such Delay Locked Loops (DLL) are considered functionally equivalent to a PLL in such an application, particularly in regard to composed elements of phase detector, phase interpolator, and charge pump.

Numerous forms of phase detectors are known to the art. A simple XOR gate as in FIG. 4A may be used to compare, as a non-limiting example, two square wave signals. One familiar with the art will observe that such a digital XOR output will be a variable-duty-cycle waveform which, when low pass filtered into an analog error signal, results in a proportional error signal centered in its analog signal range when the two input signals have a 90 degree phase offset relationship.

Figure 4A:
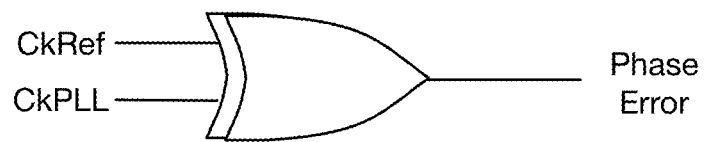
FIGS. 4A, 4B, and 4C show three Phase Detector embodiments suitable for use in a Phase Locked Loop element of a clock recovery circuit.
Figure 4B:
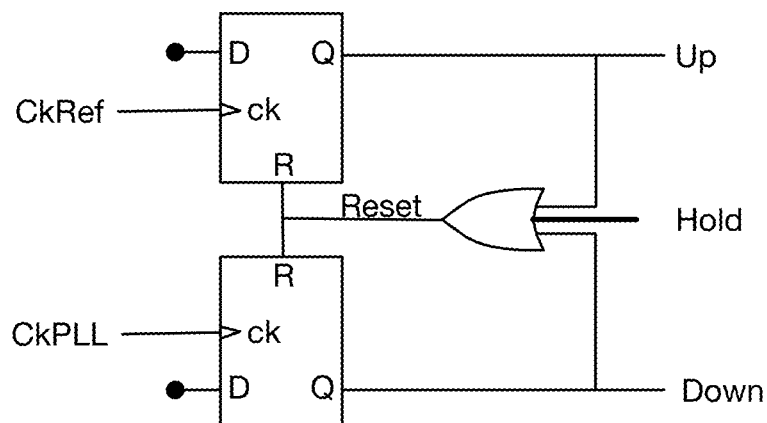

The more complex state machine phase detector of FIG. 4B is composed of two edge-triggered latches clocked respectively by the reference and internal clock signals, with the first received clock edge initiating an output signal on one of the "early" or "late" outputs. Either output becoming active will subsequently cause the latches to reset in anticipation of the next comparison interval. Alternative embodiments may incorporate a timing delay in this reset path to provide additional control of the reset pulse timing, as indicated by the "Hold" signal. The "late" and "early" phase comparison outputs are typically accepted as "pump up" and "pump down" inputs to a charge pump, the output of which is the analog error value. That is, a pump up signal may turn on a first transistor circuit that provides charge to capacitor thereby increasing the analog voltage, while a pump down signal may turn on a second transistor circuit that removes charge from a capacitor, thereby reducing the voltage. A zero degree phase offset between the two input clock signals will thus leave the analog error value unchanged and the PLL in a stable locked condition. A number of equivalent state machine phase detector embodiments are known in the art, and are equally applicable in this application, without implication of limitation. Some state machine embodiments may be sensitive to both phase and frequency differences between the input signals, facilitating more rapid PLL lock acquisition on startup.

Figure 4C:
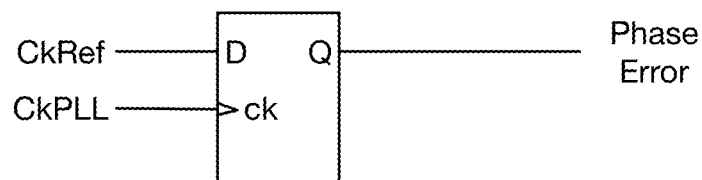

As shown in FIG. 4C, a simple edge-clocked "D" flip-flop may also be used as a phase detector. At each rising local clock edge (CkPLL), the D input samples the state of the (in this example, square wave) reference input (CkRef); if it is high (e.g. it has already transitioned,) the Q output is high indicating the reference is "early", if it is low (e.g. it has not yet transitioned,) Q is low indicating the reference is "late". This so-called "bang/bang" phase detector provides a less nuanced error result than the previous example, thus may utilize more sophisticated filtering to obtain loop stability.

As will be recognized by those familiar with the art, comparable functional operation may be obtained regardless of the phase detector type incorporated in a PLL design, thus to first approximation phase detector choice is not limiting. Secondary design behaviors, including lock time, stability, power consumption, etc. must also be considered as part of the design process.

Receiver Clock Recovery

Figure 3:
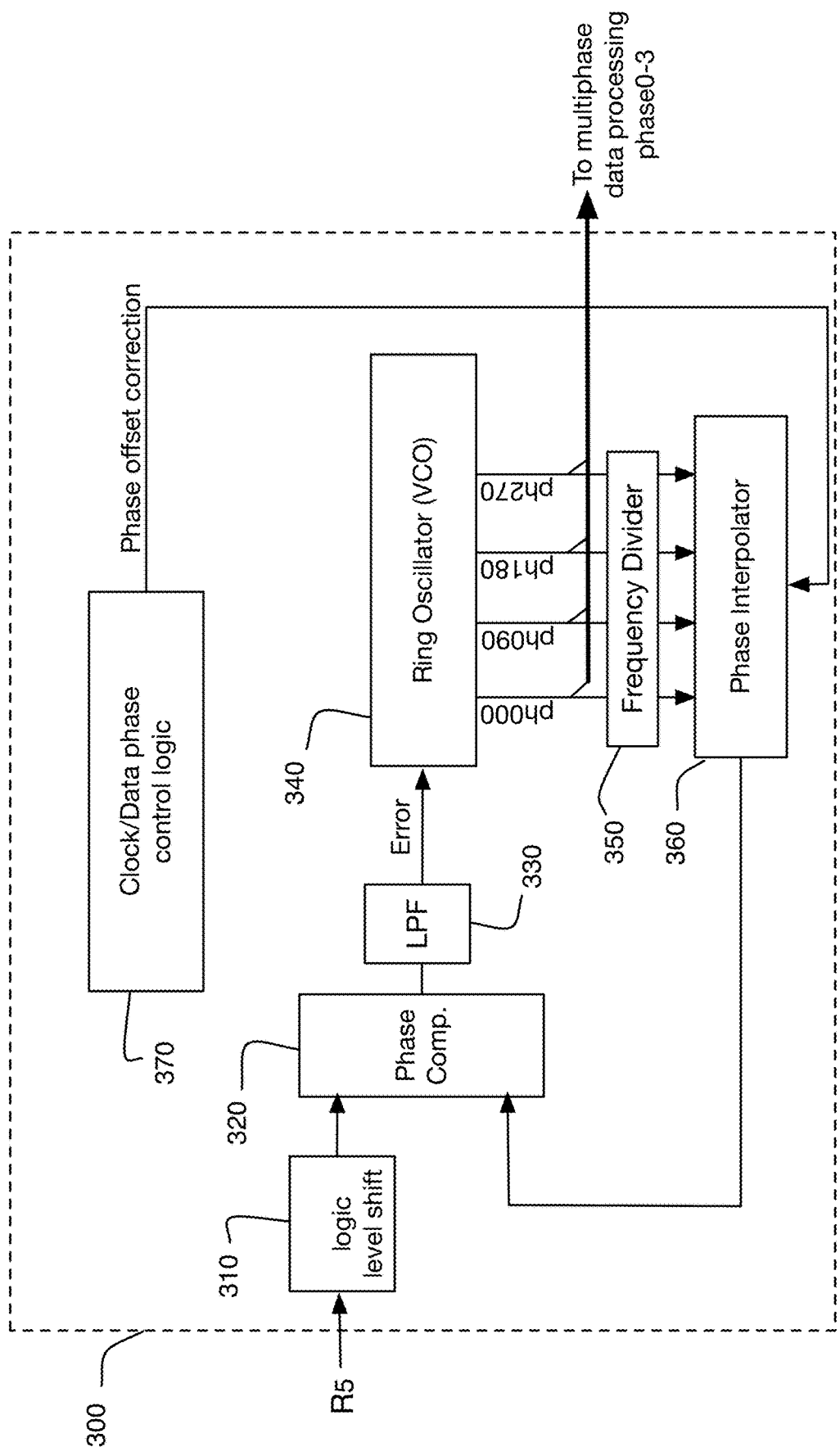
FIG. 3 is a block diagram detailing one embodiment of the clock recovery circuit used by the receiver of FIG. 2.

The example receiver utilizes a PLL embodiment as shown in FIG. 3. This PLL accepts the received clock signal R5 as the reference to which its clocks will be phased locked. In some embodiments, logic level shift 310 is used if appropriate to interface between the signal levels provided by the detecting MIC and the preferred phase comparator input levels. Phase Comparator 320 compares the reference clock to an internal clock derived from the VCO, producing an output which is low pass filtered to provide an Error value which subsequently corrects the operating frequency of VCO 340. In some embodiments, the outputs of Phase Comparator 320 is a digital waveform requiring conversion to an analog error signal, either through implicit or explicit digital to analog conversion, or by use of an interface element such as a charge pump. Some embodiments may combine such conversion with all or part of the low pass filtering operation, as one example offered without limitation, by the digital filtering behavior shown by the switching action of a charge pump directed by digital control signals generating an analog signal output.

In one embodiment, a ring oscillator 340 composed of a sequence of identical gates in a closed loop is used as the internal Voltage Controlled Oscillator (VCO) timing source for the PLL. The VCO frequency is varied by analog adjustment of at least one of: gate propagation delay, intergate rise and fall time, and gate switching threshold within the ring oscillator. This may be implemented via switched capacitor banks, where a digital control signal is applied to selective place capacitive elements in parallel and/or series combinations to alter an RC time constant, as one nonlimiting example. Still further, a current source that drives a gate of the ring oscillator may be increased or decreased to alter the output switching rise-time/fall-time, and thereby adjust the effective delay. Outputs taken at equal intervals (i.e. separated by equal numbers of ring oscillator gates) along the sequence of gates comprising the ring oscillator provide the four data phase sampling clocks, herein identified as the 0, 90, 180, and 270 degree clocks.

In one embodiment, the ring oscillator is composed of eight identical sets of logic gates (e.g., a set of inverter circuits), thus the phase difference from one such set to the next is 45 degrees. In this embodiment, the 0, 90, 180, and 270 degree outputs may be obtained, as examples, from the second, fourth, sixth, and eighth outputs. As these clocks are cyclical, the final tap may be considered as logically adjacent to the initial tap, a 0 degree and a 360 degree phase offset being equivalent. As many variations of such designs are known in the art, neither the number of elements in the ring oscillator nor the specific taps at which particular outputs are made should be construed as implying a limitation. As one example, the location of the 0 degree tap is arbitrary, as one familiar with the art will recognize that normal PLL behavior will phase align the ring oscillator with the external phase reference regardless of its initial phase. Similarly, equivalent designs may be obtained in which the output clock phases do not have square wave duty cycles; as one example being produced by the action of AND or OR gates with inputs from different tap locations. In the example receiver, it is desired that the VCO operate at a multiple of the received reference clock frequency, thus Frequency Divider 350 divides the VCO outputs by a comparable amount prior to the Phase Detector. In one embodiment, binary (factor of two) dividers are used at 350 to obtain the correct sampling clock rate. In another embodiment, no divider is utilized and the VCO outputs are presented to the phase interpolator directly.

Each of the four phases of sampling clocks is appropriately timed to sample received data for one of the four parallel processing phases. In particular, internal clock ph000 is aligned to optimally trigger data samplers in the phase0 phase of processing, clock ph090 in phase1, clock ph180 in phase2, and clock ph270 in phase3.

To allow the overall phase of the locked PLL signals to be offset from the reference clock input phase, the local clock output presented to the phase comparator is obtained from phase interpolator 360, the output phase of which is controllably intermediate between its input clock phases. Thus, the PLL may lock with its fixed phase relationship, while the internal clock signals obtained from ring oscillator 340 will be offset from that fixed phase by the phase delay amount introduced by phase interpolator 350, as controlled by signal Phase offset correction. Phase interpolators are known in the art, examples being provided by [Buchwald I] and [Tajalli II].

In one embodiment, phase interpolator 360 receives multiple clock phases from the ring oscillator 340 having 90 degree phase differences. Said phase interpolator may be controlled to select two adjacent clock input phases and then to interpolate between them so as to produce an output at a chosen phase offset between those selected two values. For purposes of description, it may be assumed that a phase detector design is used which drives the PLL to lock with a zero phase differential between the two phase detector inputs. Thus, continuing the example, applying the 0 and 90 degree clock phases as inputs to the phase interpolator allows adjustment such that the PLL leads the reference clock input by between 0 and 90 degrees.

It will be apparent that equivalent results with comparable phase offsets may be obtained using other pairs of degree clocks and/or other phase detector designs, which as previously described may lock with different phase differentials than that of the present example. Thus neither the particular phase clocks chosen nor the particular phase detector design described herein are limiting.

In the known art, [Nandwana] describes a Fractional-N clock multiplying PLL in which a single reference clock is phase compared to two local clocks derived using different integer divisor ratios, with interpolation between the two phase error results dynamically chosen to cancel the phase quantization error.

Phase Detector with Interpolator

Figure 5:
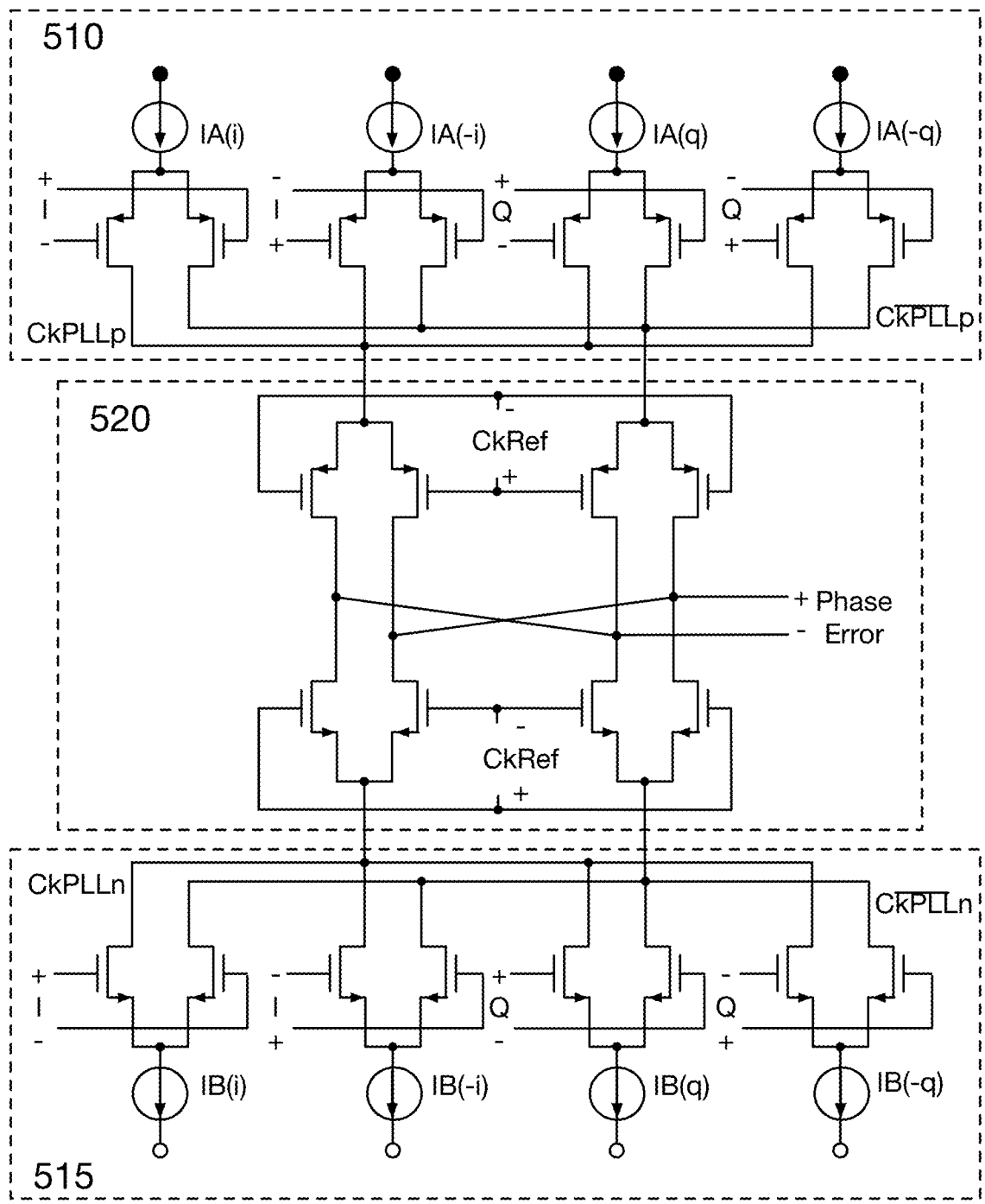
FIG. 5 is a schematic diagram of one embodiment integrating an XOR phase detector and clock phase interpolator.

As communication channel data rates increase, it becomes increasingly difficult to maintain acceptable PLL lock range and accuracy, as inherent and parasitic circuit node capacitances introduce circuit delays and constrain the effective loop response bandwidth. An embodiment providing improved response characteristics suitable for such high speed operation is illustrated in FIG. 5. As one familiar with the art will observe, this is a CMOS design providing symmetrical operation for both positive and negative output excursions, integrating elements of both phase interpolator and phase detector designs. This tight integration results in reduced node capacitances, facilitating the desirable high speed operation, and the balanced differential structure simplifies the control of charge and discharge currents.

As with conventional designs, the PLL VCO (or a clock divider driven by said VCO) provides the local oscillator inputs to phase interpolator elements 510 and 515, which together set the effective local clock phase. Four local oscillator phases with 90 degree offset are shown i.e. equivalent to two phases in quadrature relationship and their complimentary signals and thus identified as +I, +Q, and −I, −Q, permitting a full 360 degree or "four quadrant" phase adjustment. Other embodiments may utilize as few as two local oscillator phases, may use oscillator phases having other than 90 degree phase differences, or may select clock phases from an input set of more than four; as one non-limiting example, choosing at least two clock phases to be interpolated between from an input set of eight clock phases.

In a first embodiment, phase interpolator element 510 includes four mixing elements, each mixing element comprising a differential transistor pair and a controlled current source, with a common differential output driven by the four mixing elements in parallel. Thus, configuration of current source IA(i) controls the amount of local oscillator phase +I presented to the common output ckp; similarly, current source IA(−i) controls the amount of complimentary output phase −I in the output, IA(q) controls the amount of +Q, and IA(−q) controls the amount of −Q. It will be readily apparent to one familiar with the art that configuration of the four current sources can produce an output clock at Ckp having any desired phase relationship to the PLL local clock input.

Similarly, phase interpolator element 515 current sources IB(i), IB(−i), IB(q), and IB(−q) may be configured to obtain an output clock at Ckn having any desired phase relationship to the PLL local clock input. Typically, CkPLLp and CkPLLn will be configured to have complimentary relationships so as to provide phase detector 520 with balanced and complimentary positive- and negative-going current amplitudes. However, configuration with non-complimentary IA and IB values may be performed to obtain particular results. As one example offered without limitation, an embodiment separately adjusting IA and IB values might obtain higher resolution phase adjustment, compared to an embodiment maintaining perfectly complimentary IA and IB values.

The second input to the Phase Detector 520 is external reference clock CkRef+/CkRef−, producing the phase error output currents VCOctl+/VCOctl−. In one advanced embodiment, the two external reference clocks are of opposing polarity but not necessarily complementary phase, thus the positive polarity comparison and negative polarity comparison represent different phase comparisons. Such an advanced embodiment may be combined with non-complimentary IA and IB bias configurations, providing independent adjustment of local clock phase during those different phase comparisons. That is, in one embodiment, the CkRef input at the top of PD 520 is a first phase selected from the reference clock phases available in the circuit, and the IA currents are adjusted to provide a corresponding interpolated phase offset from the first selected phase, and the CkRef input at the bottom of PD 520 is a second phase selected from the reference clock phases available in the circuit, and the IB currents are adjusted to provide a corresponding interpolated phase offset from the second selected phase, wherein the amount of the relative phase offsets are the same.

Configuration of phase interpolator current source values may be performed by external control logic, including without limitation, a hardware configuration register, control processor output register, and hardware CDR adjustment logic.

Alternative Phase Detector Embodiments

Figure 12A:
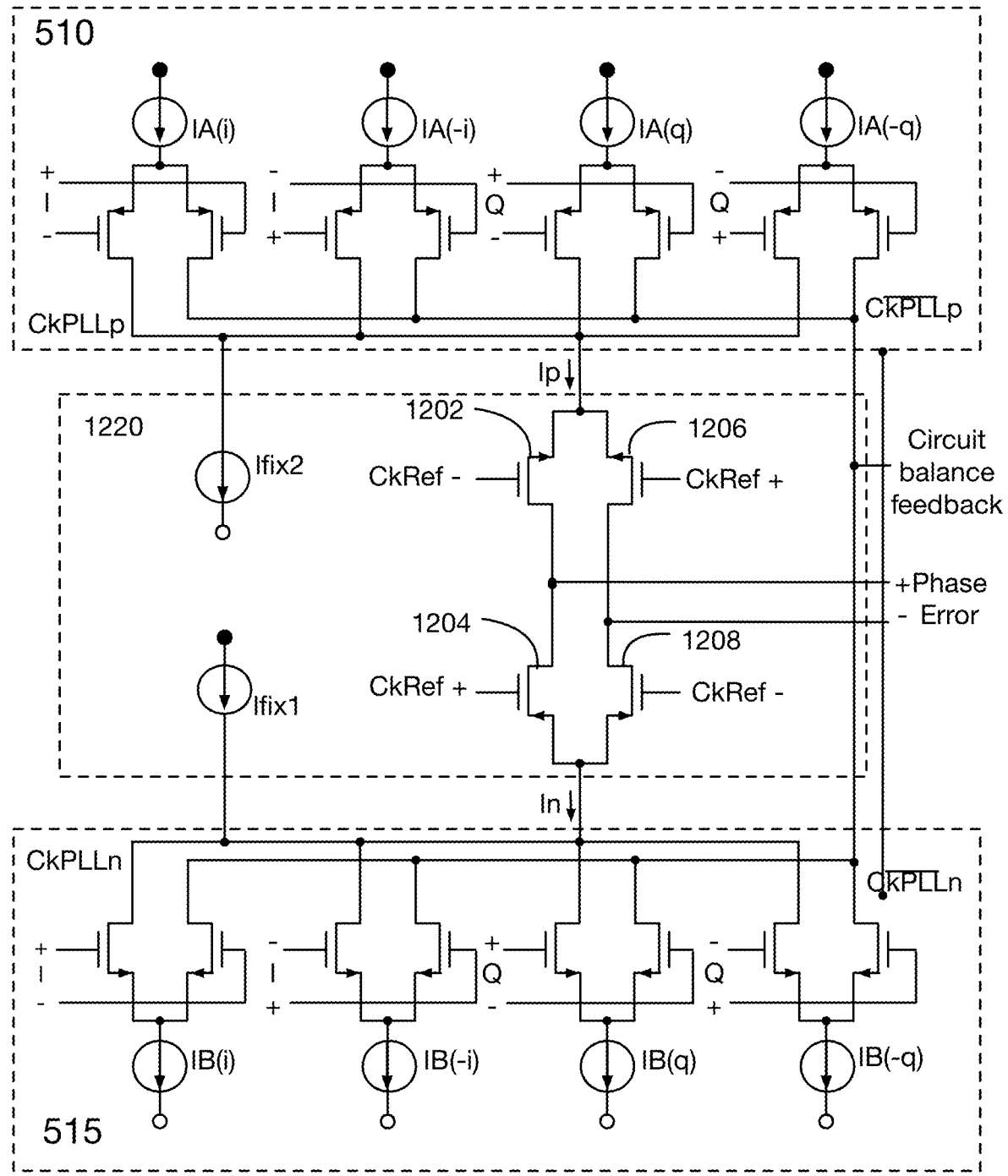
FIGS. 12A and 12B are block diagrams of an alternate embodiment of the integrated phase detector and phase interpolator of FIG. 5.

Phase Detector 520 in the embodiment of FIG. 5 is shown as an XOR-style device as in FIG. 4A, mixing local clock CkPLL and external reference clock CkRef to produce phase error output VCOctl. In the alternative embodiment of FIG. 12A, a folded phase detector is used at 1220, driven by currents produced by the combination of phase interpolator 510 and current sink Ifix2, and the combination of phase interpolator 520 and current source Ifix1. The folded phase detector embodiment shown in FIG. 12A is described in further detail below. As with the previously-described embodiment, current sources IA(i), IA(−i), IA(q), and IA(−q) are configured to produce the desired interpolation of PLL clocks i, −i, q, and −q in interpolator outputs CkPLLp and $\overline{\text{CkPLLp}}$, while current sources IB(i), IB(−i), IB(q), and IB(−q) are configured to produce the desired interpolation of PLL clocks i, −i, q, and −q in interpolator outputs CkPLLn and $\overline{\text{CkPLLn}}$. Phase comparator 1220 is also driven by received reference clocks CkRef+ and CkRef−, producing phase comparison results Phase Error (+) and Phase Error (−). In some embodiments, the circuit node labeled Circuit Balance Feedback may be monitored to determine the relative DC component of the interpolated clock signals, which may then be modified by adjustment of the configured current source values in 510 and 515. In some embodiments, each current source IA and IB receives seven control bits. It should be noted that embodiments are not limited to receiving seven control bits, and that any number of control bits may be implemented according to design constraints for PI resolution, for example. In some embodiments, current sources IA and IB are equal (e.g., IA=IB for +/−i, q). In such embodiments, the PIs 510 and 515 have 7 bits of resolution. In alternative embodiments, additional resolution may be implemented by introducing a shift in IB with respect to IA, or vice versa. In an exemplary embodiment, IA=IB+8, where 8 is a decimal shift added to the control bits of each current source IA to obtain the control bits of each current source IB. In such embodiments, the P-side PI 510 and N-side PI 515 are looking into two different VCO phases, and the phase detector collects information from different phases of the VCO. Since the PIs 510 and 515 combine information from different phases of VCO, the PLL has more detailed information about phases of PLL and the bandwidth of the PLL is higher than a conventional PLL.

Embodiments for which IA=IB+shift are a special case of a matrix phase comparator in which there are two phase comparators. The first phase comparator (NMOS-side XOR) compares the phase of reference with one set of VCO feedback phases, and a second phase comparator (PMOS-side XOR) that compares the reference clock phase with a second set of VCO feedback phases. Unlike the [Nandwana] phase comparator, the sets of VCO feedback phases here are of the same frequency, differing only in phase, and the current source values chosen to interpolate between the phase comparison results will typically be static rather than dynamically chosen on a cycle-by-cycle basis. Matrix phase comparator embodiments are described in further detail below. Therefore, in some embodiments, a PMOS+NMOS interpolator may be treated as two independent PIs, while in [Nandwana], there is only one PI. Further, if a meaningful difference to the weighs of PMOS-side and NMOS-side, then a small matrix PLL may be constructed that has extended bandwidth. In at least one embodiments, there is a 20% gain difference between the two sides, in which BW may enhance by the same factor.

Figure 13A:
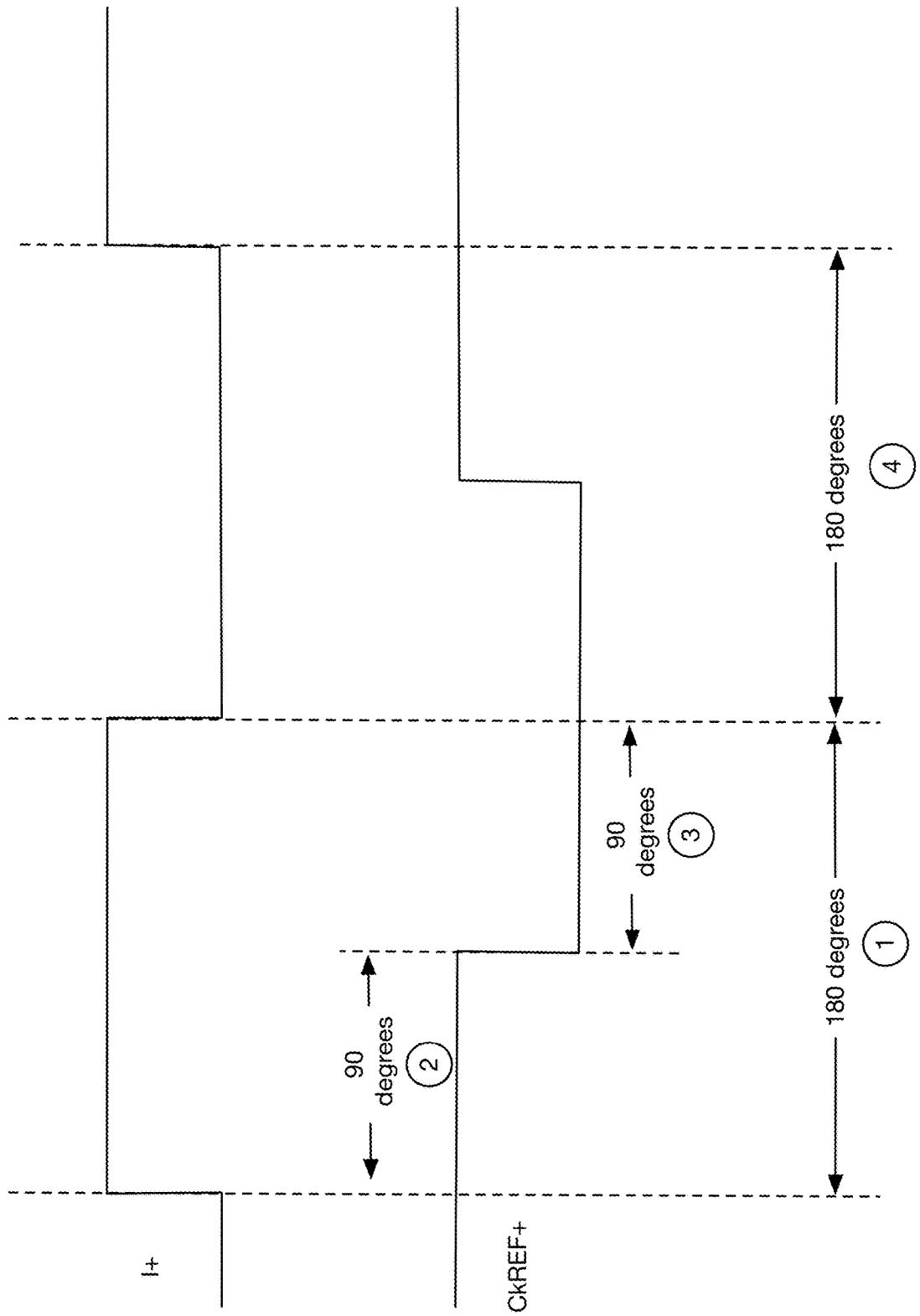
FIG. 13A is a timing diagram for a folded phase detector, in accordance with some embodiments.

In some embodiments, a folded structure as shown in FIG. 12A may be used. FIG. 12A is similar to the embodiment shown in FIG. 5, however the phase detector 520 is replaced with a folded phase detector 1220. As shown, folded phase detector 1220 includes current sources Ifix1 and Ifix2, which may be configured to provide more voltage headroom to the PMOS PI current sources IA and the NMOS PI current sources IB. Further, phase detector 1220 includes a pair of transistor branches connected to CkPLLp and CkPLLn. For purposes of illustration, consider PI 510 and 515 only having IA(i) and IB(i) turned on respectively, representing phase ph0000 from the VCO. In the case where CkRef is offset 90 degrees from ph0000, the folded phase detector 1220 will be in lock condition. As shown in FIG. 13A, during the first 180 degrees (1) of a period, for a first 90 degrees (2), current Ip is charged to the (−) terminal of the Phase Error signal through transistor 1206 using PMOS PI 510. At the same time, current In is discharged from the (−) terminal of the Phase Error signal through transistor 1208 using NMOS PI 515. Similarly, during the second 90 degrees (3), current Ip is charged from the (+) terminal of the Phase error signal through transistor 1202, while current In is discharged from the (+) terminal through transistor 1204. As shown, Ifix2 will sink a fixed amount of current being provided from PMOS PI 510, while Ifix 1 sources some current to NMOS PI 515 to prevent the current sources in the NMOS PI from sinking too much current from the Phase Error signal. Such a technique provides a reverse clipping effect. One of skill in the art may notice that equally adjusting the Ifix current magnitudes may have an effect on the range of the Phase Error signal. In some embodiments, increasing the Ifix magnitudes will lower the magnitude range of the Phase Error signal, while decreasing the Ifix magnitudes will increase the magnitude range of the Phase Error signal. This relationship can be found in FIG. 13B.

Figure 13B:
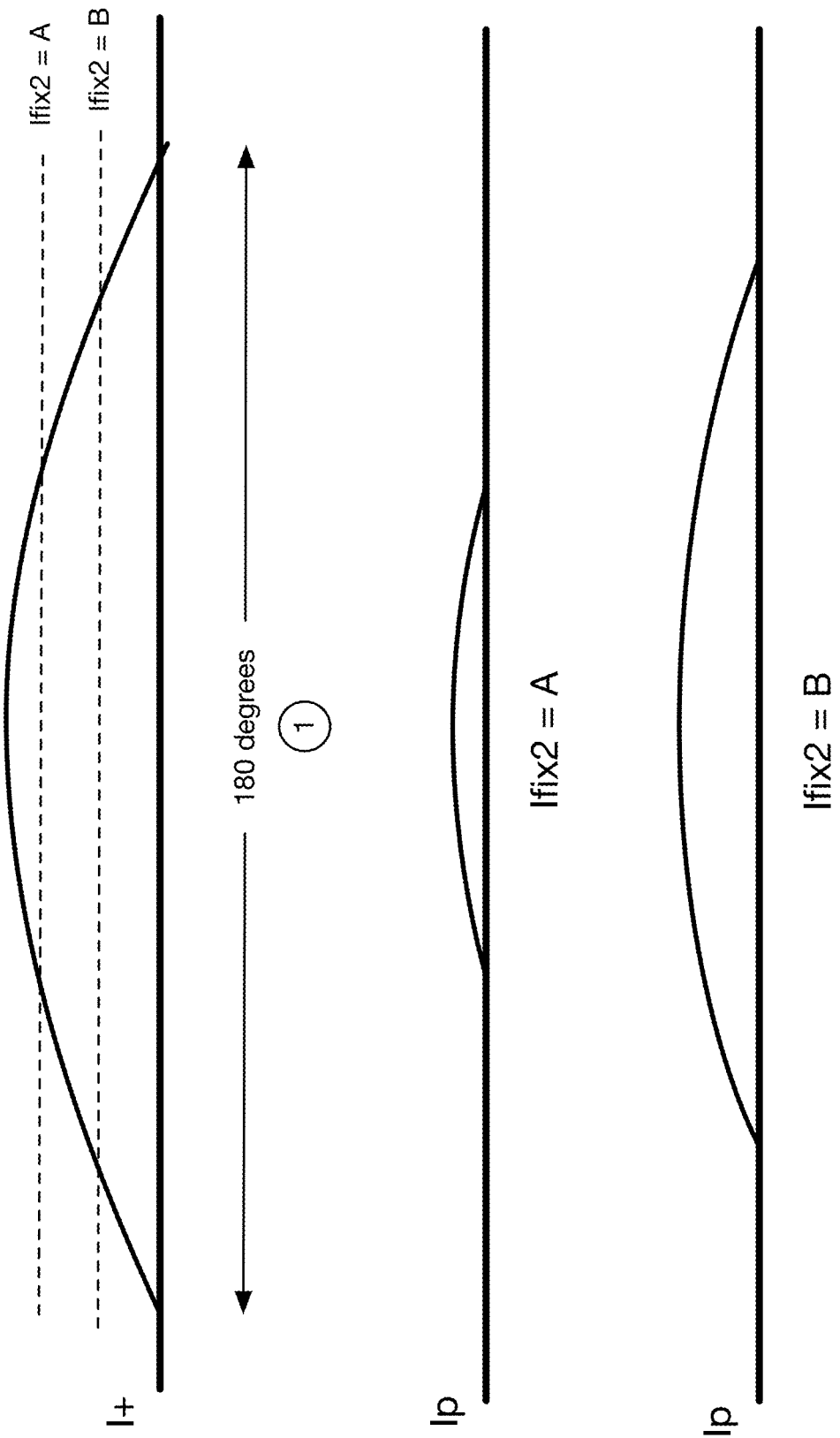
FIG. 13B is timing diagram illustrating a reverse clipping effect, in accordance with some embodiments.

FIG. 13B is a timing diagram illustrating the reverse clipping feature described above. FIG. 13B depicts the magnitude of current Ip in the first 180 degrees (1) for two values of Ifix2: A and B, where A>B. As shown, the magnitude of Ip is less in the case of Ifix2=A. When Ifix2=B, the magnitude range of Ip is relatively higher. One of skill in the art would notice a similar effect occurs in the case of In being discharged from the folded phase detector 1220.

Figure 12B:
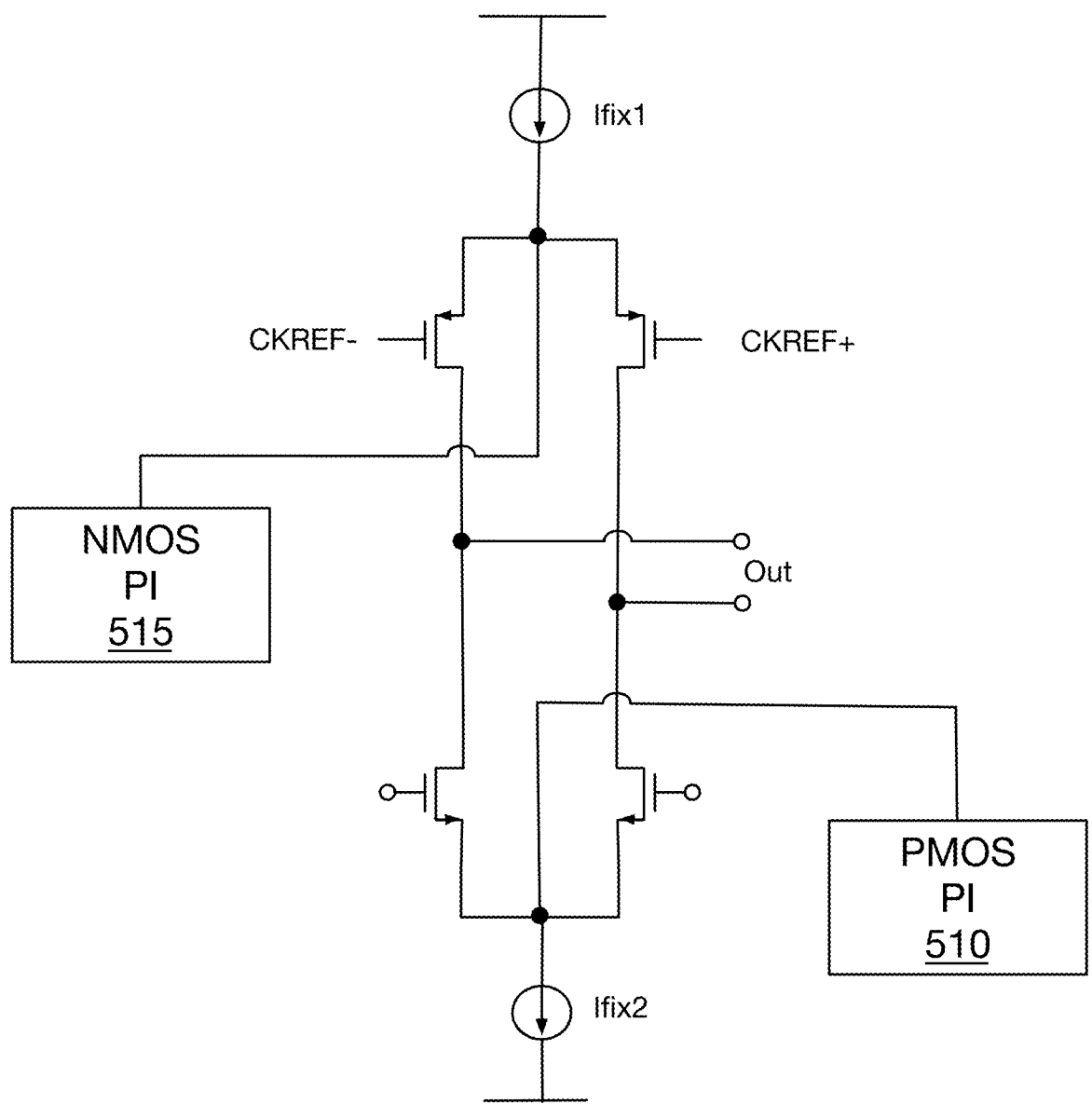

In some embodiments, the second 180 degrees (4) may be used to provide circuit balance feedback, as shown in FIG. 12A. During the circuit balance feedback phase (4), current may be charged via the PMOS PI 510 while current is discharged via the NMOS PI 515. If there is an imbalance of charge/discharge currents, a non-zero circuit balance feedback signal may indicate this imbalance, which may occur due to transistor mismatches, for example. The circuit balance feedback signal may then be used to adjust either Ifix1 or Ifix2 to balance the charge/discharge currents so that the balance feedback signal is zero. In some embodiments, the voltages of the charge-pump circuit may be monitored, and if equal, the circuit is properly balanced, i.e., Ip=In. A simplified schematic of the phase comparator circuit of FIG. 12A is shown in FIG. 12B.

The phase detector of [Tajalli V] may alternatively be used at 520 or 1220, providing equivalent phase detection with enhanced signal headroom in embodiments utilizing low power supply voltages. Other phase detectors, including all variations shown in FIGS. 4A, 4B, and 4C, may also be substituted at 520 in that embodiment.

As one example of such alternative embodiment, the State Machine Phase/Frequency Detector of FIG. 4B may be combined with the Phase Interpolator design of FIG. 5.

Figure 6A:
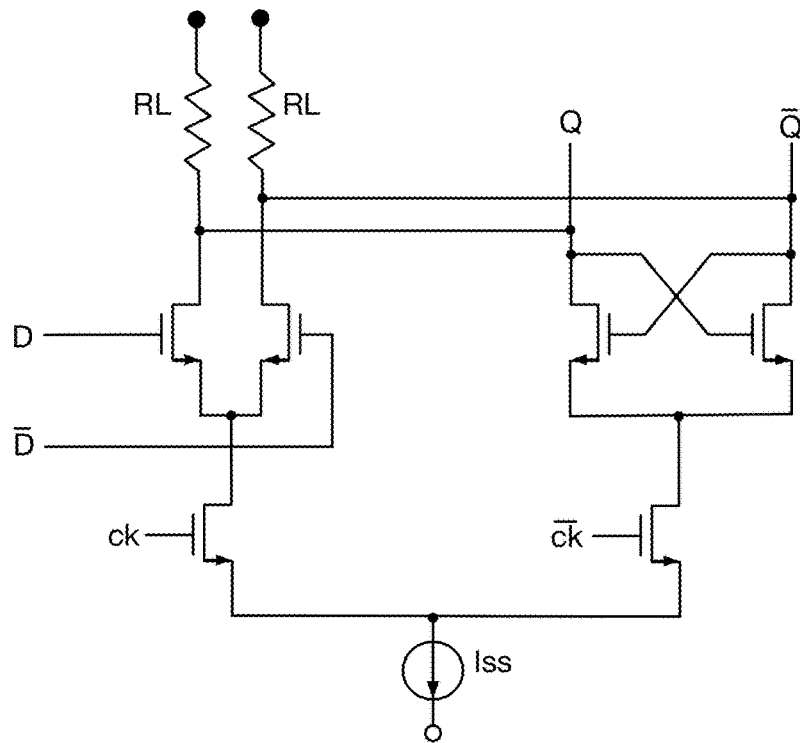
FIG. 6A is a schematic diagram of a clocked data latch and FIG. 6B is a schematic diagram of a further embodiment of a clocked data latch integrating a clock phase interpolator.
Figure 6B:
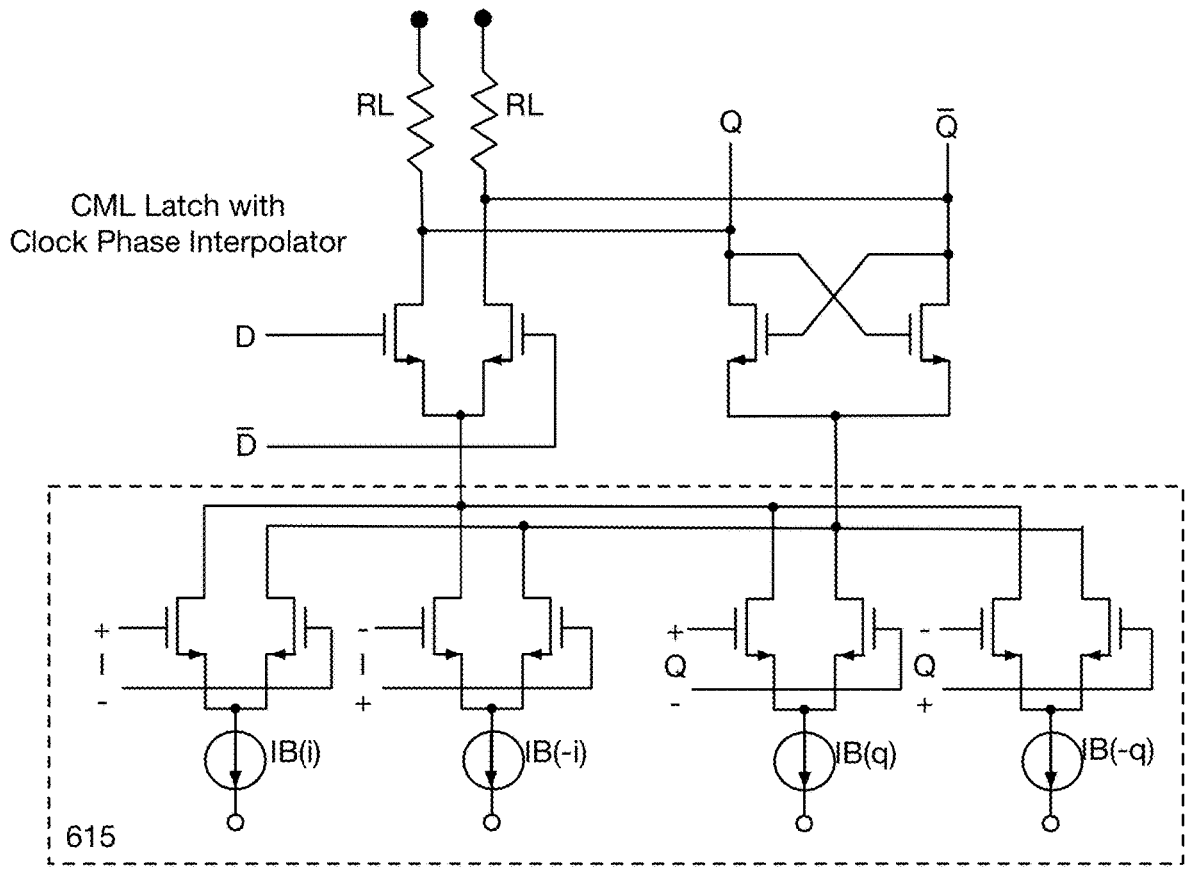

FIG. 6A shows a schematic of one embodiment of a conventional CML clocked latch, composed of a clocked feedback latch outputting results Q and $\overline{Q}$ the state of which is initialized by clocked differential inputs D and $\overline{D}$. FIG. 6B shows the same circuit in which the clock source phase is modified by phase interpolator 615, operation of which is as previously described for FIG. 5.

Figure 7A:
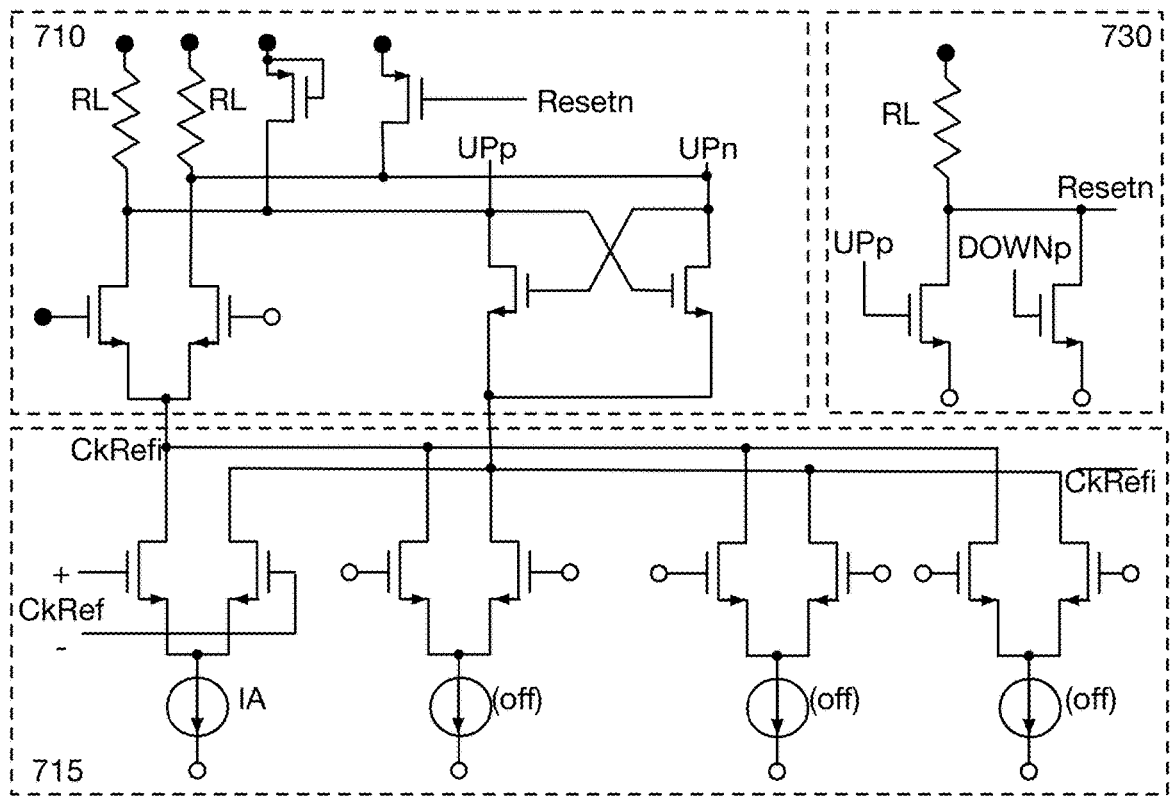
FIGS. 7A and 7B are schematic diagrams of an embodiment integrating a state machine phase detector and clock phase interpolators.
Figure 7B:
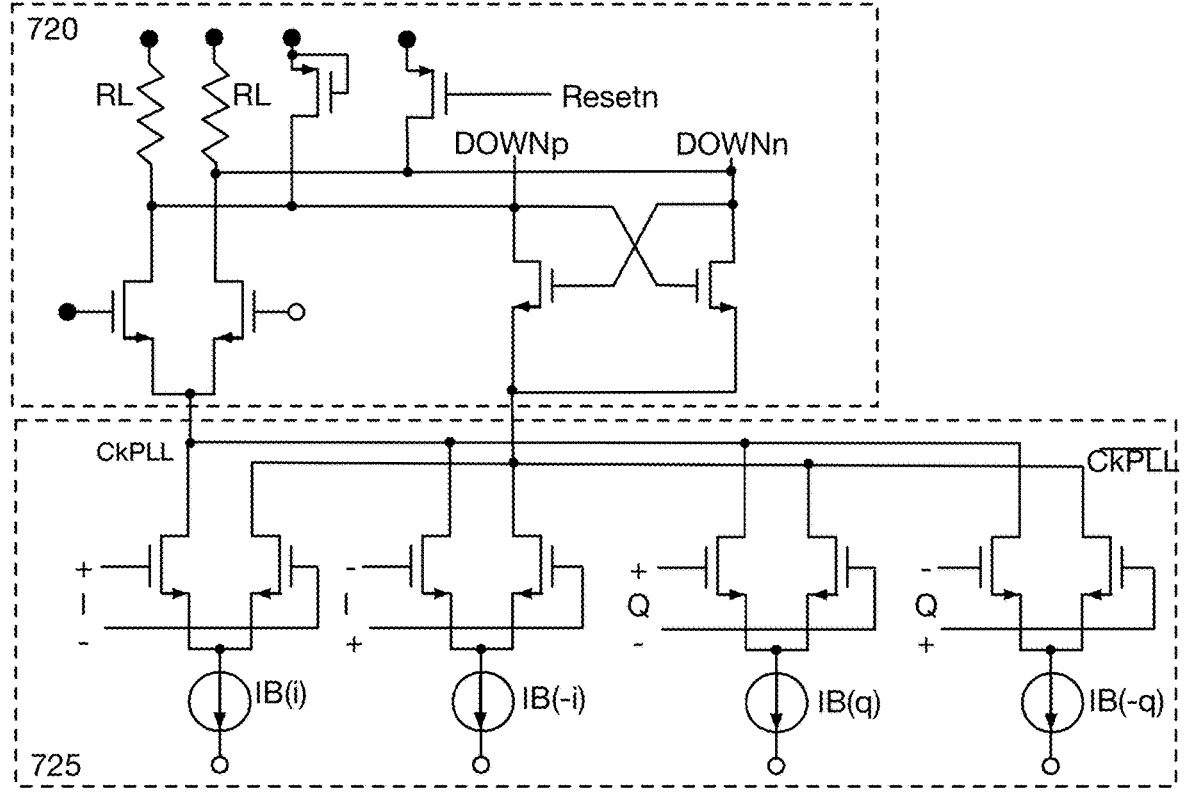

Substituting the clocked latch circuit of FIG. 6B into each D flip-flop instance of FIG. 4B produces the alternative embodiment shown in FIGS. 7A and 7B. D flip-flop 710 is clocked by the received clock CkRef, which is passed through phase interpolator 715. As an example and for purposes of explanation, without a configured phase offset (or a desired offset of 0 degrees), current source IA would be set to "mix" input CkRef at 100% proportion, and the other three current sources set to zero current. D flip-flop 720 is clocked by local clock CkPLL, which is obtained by configuration of phase interpolator 725 current sources IB(i), IB(−i), IB(q), and IB(−q), which in turn controls the relative proportions and polarities of I and Q clocks being combined. In one embodiment, I is obtained from ph000, −I from ph180, Q from ph090, and −Q from ph270, as seen in FIG. 3. A simple CIVIL OR gate 730 drives the reset function for flip-flops 710 and 720.

It should be noted that in this one embodiment the majority of phase interpolator 715 is functionally disabled and retained only to preserve the same parasitic load characteristics as are presented by active phase interpolator 725, to maximize circuit symmetry and maintain balanced loading characteristics to minimize secondary effects such as detection bias and drift.

Integrated Phase Detector, Interpolation, and Charge Pump

As previously described, PLL phase detector outputs are typically used to drive a charge pump circuit, the output of which is an analog error signal used to control the VCO. The described improvement from reduced capacitance and resulting higher circuit speed in integrating the PLL phase detector and clock adjustment phase interpolator may be further extended by also integrating elements of the charge pump in the same manner.

Figure 8:
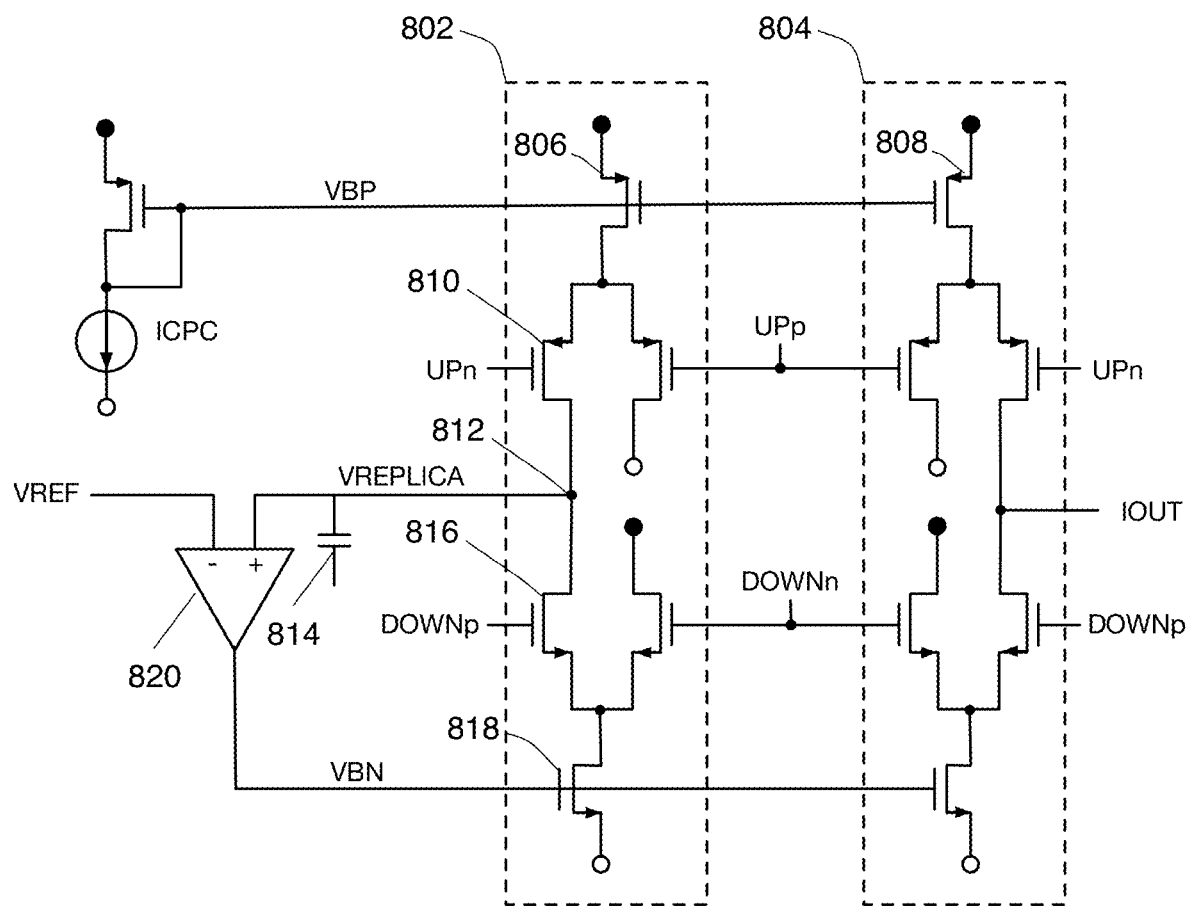
FIG. 8 is a schematic diagram of one embodiment of a charge pump suitable for further integration with a phase comparator embodiment.

In this combined embodiment, the charge pump control signals UPp, UPn, DOWNp, and DOWNn provided by the embodiment shown in FIGS. 7A and 7B directly control the charge pump embodiment of FIG. 8 to produce output IOUT. Current source ICPC and voltage reference VREF may be configured to scale and adjust the IOUT range. One familiar with the art will note the significant symmetry in the circuit of FIG. 8, allowing accurate tracking between generation of VREPLICA and IOUT signals.

FIG. 8 is a schematic of a charge pump circuit with improved charge/discharge current balancing, in accordance with some embodiments. The circuit 800 includes two parallel charge pumps 802, 804: the two differential pairs within charge pump 804 generate an output current representing a phase error in response to the up and down pulses, and the two differential pairs of charge pump 802 are used to set the discharge current to be equal to the charge current as described below. Specifically, the current source ICPC sets a charging current level by providing a corresponding bias voltage VBP through a current mirroring circuit to drive the top current sources 806, 808 of the two charge pumps so as to also provide ICPC to each charge pump 802, 804. When UPn goes low and turns on FET 810, the node 812 is charged (capacitive element 814 is either a discrete cap or a parasitic cap) by the charging current ICPC provided by FETs 806, 810. In a balanced condition (i.e., in the absence of a phase error), the amount of current that is then discharged during a high DOWNp signal through the bottom FET 816 should bring the node 812 back to the VREF value. If the discharge current is too low and the voltage VREPLICA increases above VREF, then the amplifier 820 will increase the bias voltage VBN to the discharge-current FET 818 to increase the amount of discharge current so that it equals the charge current ICPC and the voltage VREPLICA at node 812 is brought back to VREF. On the other hand, if the discharge current set by VBN on FET 818 is too high, the VREPLICA voltage drops too low, and the amplifier 820 responsively reduces the bias voltage VBN on discharge-FET 818 to bring the charge pump currents into equilibrium.

Figure 24:
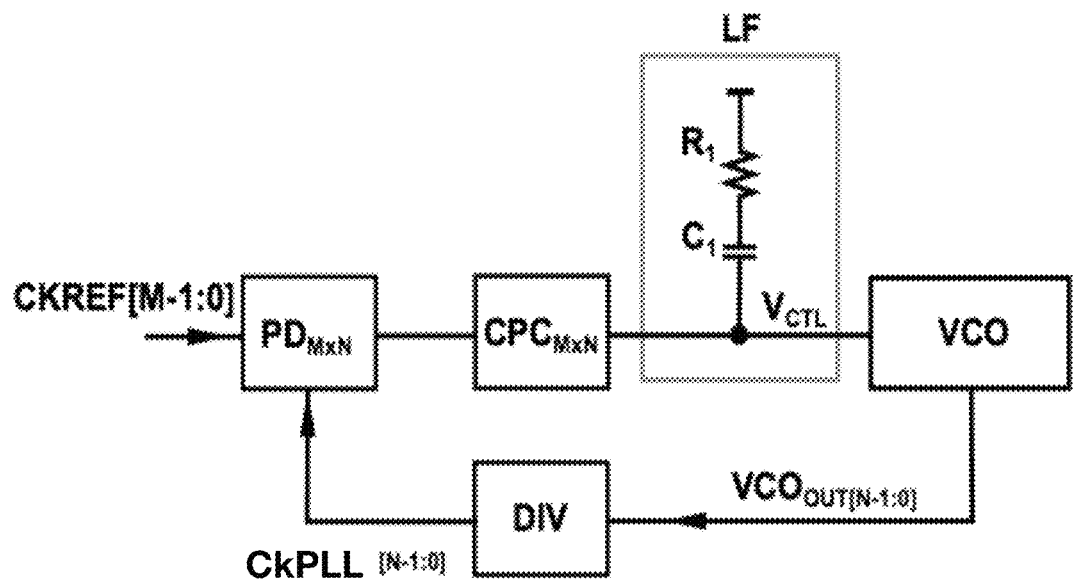
FIG. 24 is a block diagram of an oversampled multi-phase feedback phase-locked loop (MPLL) in accordance with some embodiments.

Second order PLLs (called also charge pump PLLs) have been widely used to implement low noise and high performance synthesizers, clock generators, and clock and data recovery systems. A phase detector (PD), or a phase-frequency detector (PFD) produces a signal proportional to the phase difference between the reference clock (CkRef) and the feedback clock (CkPLL). The resulting error is integrated by charge-pump circuit (CPC) and loop filter (LF) to produce the proper control voltage for the voltage (or sometimes current) controlled oscillator (VCO). An exemplary LF is an RC circuit as shown in FIG. 24. Many modern integrated VCOs are based on differential topology that can provide two complementary outputs. A differential architecture provides more resistivity against supply and substrate noise. LC tank based VCOs and ring oscillators are two main categories of controlled oscillators that have been very widely used in high speed communication systems. Both topologies can be configured to provide two or more output phases, which is essential for multiphase systems and facilitates the enhancements described below.

Other embodiments may be obtained by equivalent combination of phase comparator, phase interpolator, and charge pump elements.

Oversampling of Input Reference Signal

The asymmetric use of the phase interpolators in, as one example, FIGS. 7A and 7B, stems from the different nature of the local clock and reference clock sources. The former is obtained from a multiphase clock source (e.g. an oscillator or divider) inherently capable of providing the multiphase inputs utilized by a phase interpolation element. The latter is generally single phased, obtained from (typically) one received clock source.

In the known art, [Tan] described a combined DLL/PLL structure, in which the voltage controlled delay line incorporated in the PLL VCO is duplicated as an input delay line acting on the reference clock input, and controlled by a single feedback error signal. [Ng] and [Chang] also describe use of a front-end DLL to serve as a frequency multiplier to facilitate generation of very high frequency clocks.

However, if such a controlled delay line is tapped, and so configured that the differential delay between taps is proportional to the time between received clock edges, a received clock passing through such a delay line produces a resulting set of outputs which take on some of the characteristics of a multiphase clock. As one example offered without limitation, the equal-interval outputs of a four tap delay line having an overall delay comparable to the reference clock period will provide outputs having similar characteristic to quadrature phased clock signals. Continuing this example, if each such output is phase compared to an appropriately-selected local clock phase, a series of phase error results will be produced which may be combined to produce a more accurate aggregate clock error signal for the PLL VCO. The delayed versions of the receive clock represent additional opportunities for phase comparison with a clock derived from the VCO, thus providing a higher update rate for the controlled loop, and thus improved PLL loop bandwidth leading to reduced jitter and better noise immunity. That is, using this technique, the update rate of the loop will be increased, which in turn enables the circuit to track and correct the effects of noise and jitter at higher frequencies.

For the delayed phase comparisons to provide meaningful information to the PLL, the delay intervals provided by the delay line must be coordinated with the period between local clock phases, with such controls giving the delay element many of the aspects of a Delay-Locked Loop (DLL.) As seen in the block diagram of FIG. 9, the external clock reference input to the previous PLL embodiment 300 is provided by DLL 910. The received clock signal R5 is presented to tapped delay line 916, producing a series of received clock phases 918. The DLL control loop is provided by phase comparator 912 comparing the received clock with a delayed clock, producing an error value that is Low Pass Filtered 915, producing a Delay Adjust signal controlling the delay line timing.

Within PLL 300, the previous simple phase comparison (320 of FIG. 3) is now performed by multi-phase comparison 920. In one embodiment, XOR gates compare the phase of each received reference clock phase on the N lines (e.g., N=2, 4, 8, etc., and possibly including odd integers as well to obtain other phases such as 60, 120, 180, 240, 300) 918 with a different clock phase from the N lines 965 from phase interpolator 360. Each XOR gate output is converted to an analog signal value, all such analog signal values being summed to produce a composite analog Error result controlling ring oscillator 340, as previously described. In a further embodiment, summation 935 is performed by a weighted summation node comparable to the previously-described MIC mixer, the different selected weights of said summation allowing further control of PLL static and dynamic operational characteristics. Alternatively, each XOR output can be used to drive a separate transistor circuit for injecting or removing charge from a capacitive element to achieve the summation. In a further embodiment, each XOR phase comparator may include a plurality of AND operations implemented as transistor branches, each AND operation configured to provide a current output to a common summation node, the magnitude of each current being independently configurable so as to provide a weighting function to each AND operation. In addition, the PLL 340 of FIG. 9 may be configured to provide a desired phase offset, where the interpolated phases each have the same offset relative the tap delay line signal to which it will be XOR compared.

In some system environments, the described multi-phase reference clock may be directly available from the receiver, as one example where the communications protocol incorporates multiple clock signals.

Figure 10:
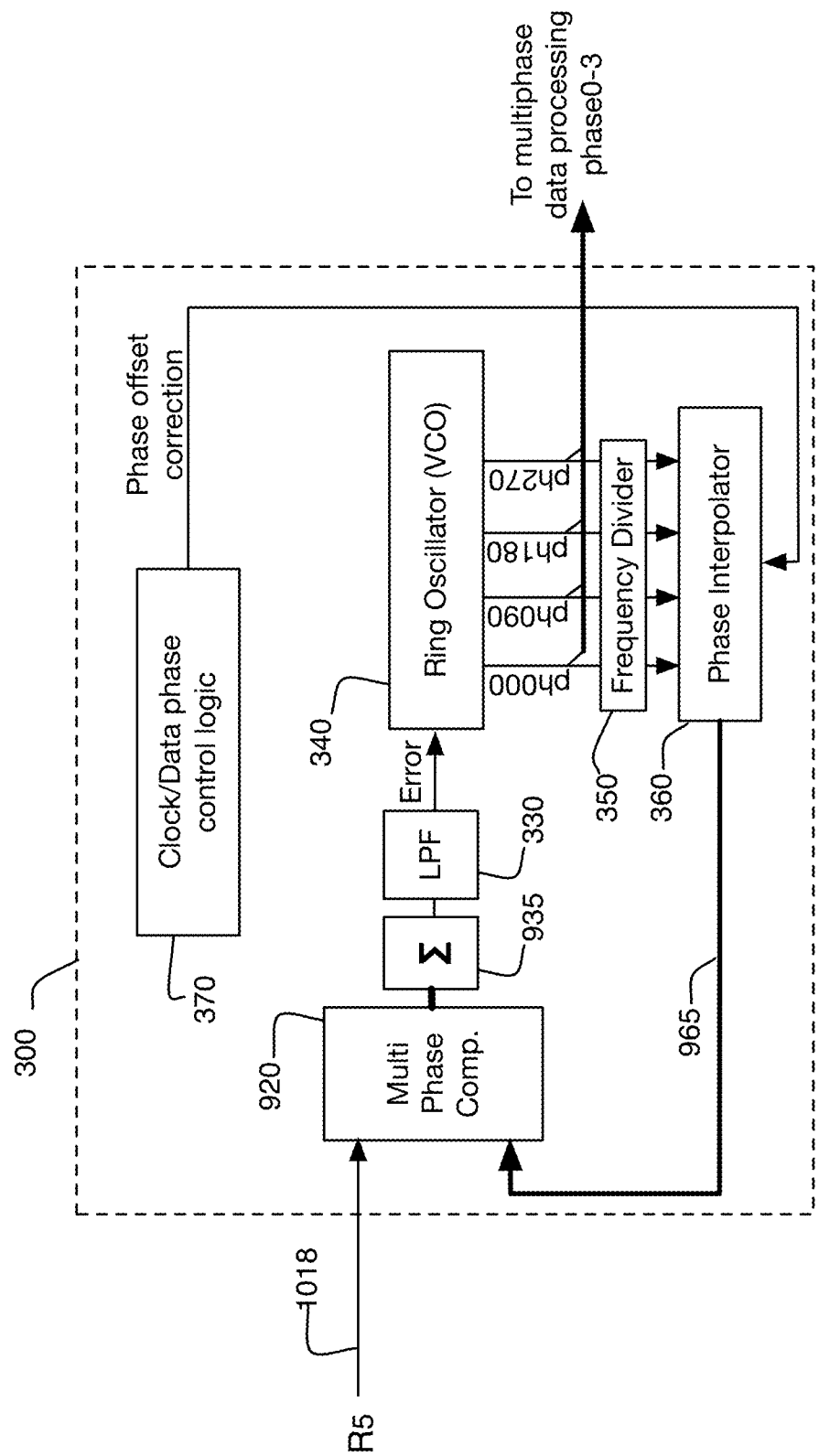
FIG. 10 is a block diagram of a further embodiment in which multiple comparisons are made between a single reference clock and multiple local clock phases.

The additional feedback information provided by the multiple comparison operations may also be obtained without the previously-described DLL front end. FIG. 10 shows an embodiment in which the single received reference signal 1018 enters multi-phase comparator 920 in which the single received reference signal is compared to each of two or more local clock phases 965. As in the previous example, this multiple phase comparison is distinct from that of [Nandwana] in that all of the local clock phases used for comparison are of the same frequency, differing only in phase. In one embodiment, XOR gates compare the phase of the single received reference clock phase 918 with a different clock phase 965 from phase interpolator 360. Each XOR gate output is converted to an analog signal value, all such analog signal values being summed to produce a composite analog Error result controlling ring oscillator 340, as previously described. In a further embodiment, summation 935 is performed by a weighted summation node comparable to the previously described MIC mixer, the different selected weights of said summation allowing further control of PLL static and dynamic operational characteristics. In another embodiment, each XOR phase comparator provides a current output to a common summation node, the magnitude of each current being configurable so as to provide a weighting function. In particular, such weight adjustments may be used to produce additional closed-loop poles and/or zeroes in the PLL time domain transfer function, providing additional control of loop stability.

Figure 14A:
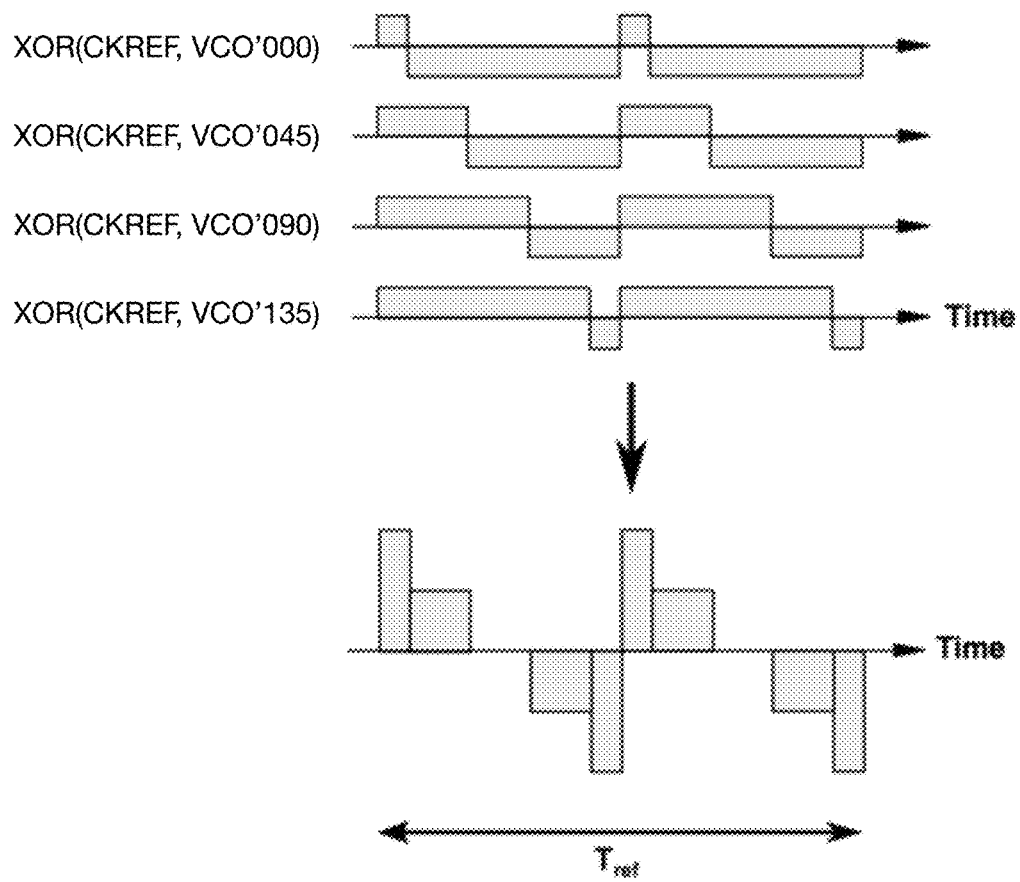
FIGS. 14A and 14B are timing diagrams for an array-XOR phase detector and single-XOR phase detector, respectively, in accordance with some embodiments.

FIG. 14A is a timing diagram of a reference signal CKREF being compared with four phases of the VCO (feedback from the PLL):

XOR(CKREF, VCO'000)
XOR(CKREF, VCO'045)
XOR(CKREF, VCO'090)
XOR(CKREF, VCO'135)

Figure 14B:
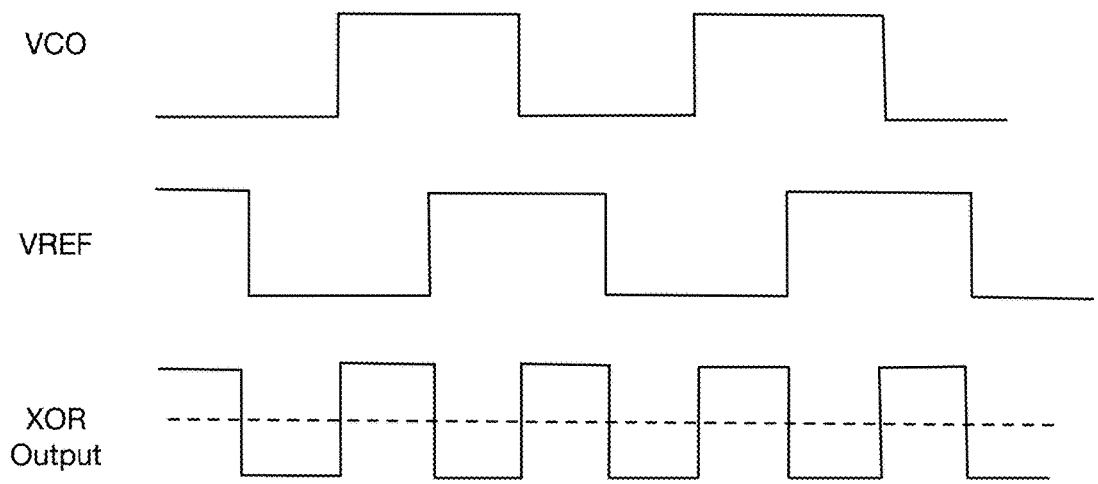

As shown in FIG. 14A, it is assumed all weights are equal, however this is purely for illustrative purposes, and should not be considered limiting in any way. FIG. 14A further includes a summation of the four XOR outputs. As can be seen, in lock condition, the integral of the bottom waveform is zero, and the PLL will lock properly. For convenience, FIG. 14B has been included to illustrate a conventional XOR based phase detectors in which the reference is compared to only one VCO phase. In lock position, the reference and VCO are 90-degree phase shifted, and the output of XOR is a rectangular waveform with an average value equal to zero. One may observe how the two waveforms (simple XOR in the FIG. 14B and array-XOR in FIG. 14A) differ from each other; however in both cases the average value for a given period is zero, and the PLL locks. In embodiments utilizing an array phase detector, a larger number of transitions occur with respect to a single XOR phase detector. As each transition carries information about an edge, a larger number of transitions means that phase comparator has been able to collect more information from VCO and CKREF.

It should be noted that in array-XOR embodiments, some comparisons might be done using XNORs. As such, an XOR or XNOR for different phase comparisons may be selected carefully to ensure system stability.

In at least one embodiment, the weights of said summation are configured such that they decline in proportion to the timing difference of the comparison clock phase relative to the PLL "normal lock" phase. As one example offered without limitation, if ph090 is the normal lock phase of the PLL, the comparison of ph090 and the received reference signal is weighted 1; comparisons of ph045 and ph135 (e.g. a half tap offset from the normal lock phase) are weighted ½; comparison of the received reference signal and ph000 and ph180 (one tap offset from the normal lock phase) are weighted ¼; etc. These various weighted comparison results are then summed to produce a composite signal which when low pass filtered 330, is the Error value controlling PLL VCO 340.

In one embodiment utilizing multiple phase comparators, the deterministic jitter produced by the multiple phase comparisons was seen to occur at a 12.5 GHz rate with equal phase detector weights. Even though the amount of jitter was very small and the jitter rate was well above the loop filter cutoff frequency, the deterministic jitter was significantly reduced with the described weight adjustments, in which weight magnitudes decline in proportion to their offset distance from the primary reference signal sample. In some embodiments, different weighted values are used in a comparator circuit to construct a discrete time domain filter. This property can be used to simplify the design of analog filter 330. For example, with proper weighting values one might construct a discrete time domain zero in the transfer function that provides conditions to make the loop robust.

As with previously described examples, other embodiments may be obtained by equivalent combination of phase comparator, phase interpolator, and charge pump elements.

Matrix Phase Comparisons

In some embodiments, BW of a PLL is limited by the update rate of the loop, which is determined by the frequency of the reference clock. Certainly, using all the available sources of information in system can substantially enhance the efficiency of the correction loop. For example, every phase of the VCO provides a single sample of the oscillator phase during each cycle of the reference clock period, while looking into all the phases of the VCO can provide more detailed information in the time span of Tref shown in FIG. 14B. In conventional PLLs, only one of the VCO phases is fed back into the phase detector. Hence, the phase detector has only part of the available information regarding instantaneous phase of oscillator. The following embodiments utilize different ways of improving loop update rate using a two dimensional phase comparator.

Figure 11A:
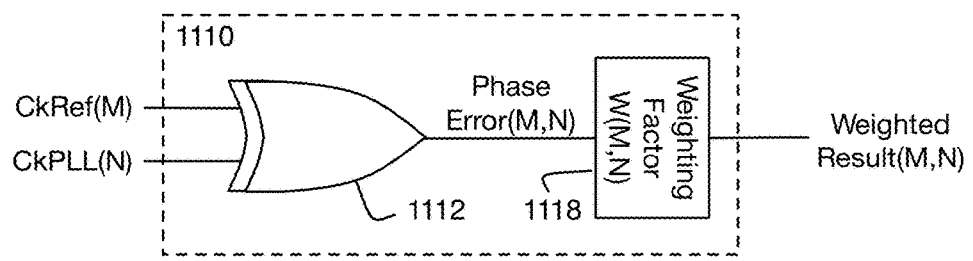
FIG. 11A is a weighted XOR phase detector, in accordance with some embodiments.
Figure 11B:
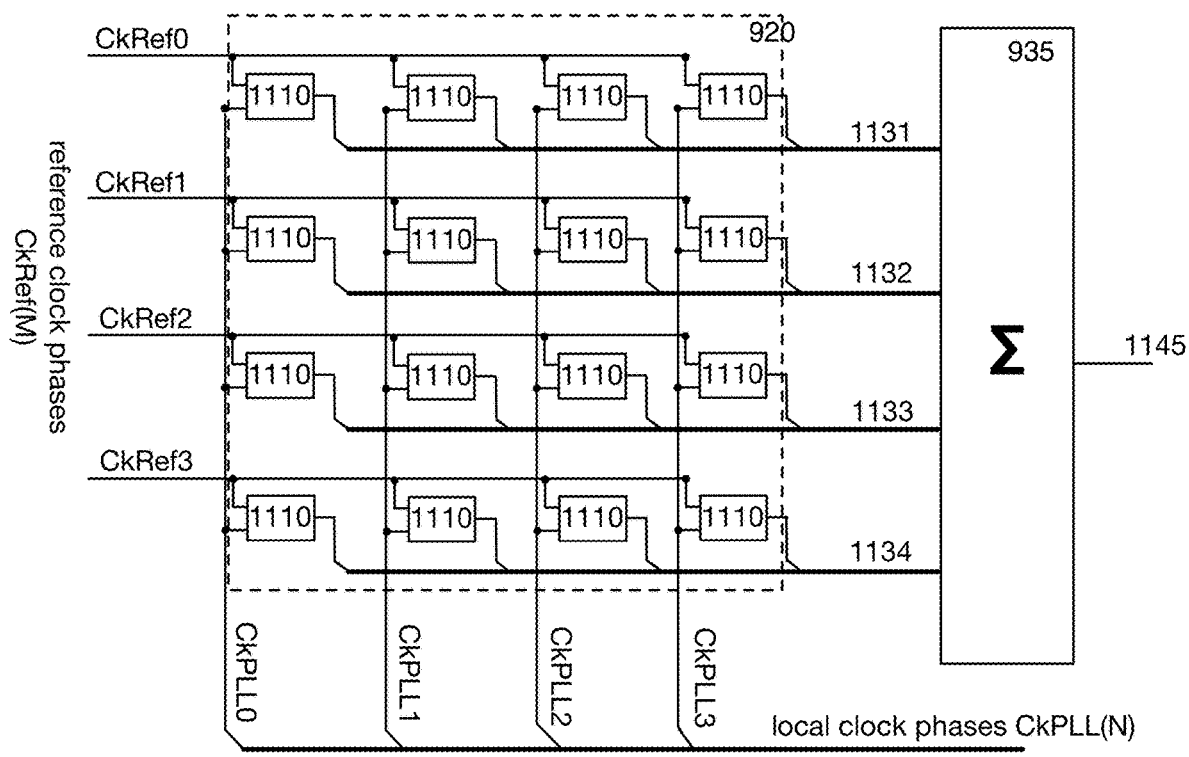
FIG. 11B is a block diagram of one embodiment of a matrix phase comparison of M reference phases and N local clock phases.

The multi-phase comparison of multiple phases derived from a received reference signal and multiple phases derived from the local PLL clock may be generalized into a matrix phase comparator, one embodiment of which is shown in FIG. 11B, with one embodiment of each individual phase comparator in the matrix shown in FIG. 11A. For descriptive purposes, XOR partial phase comparators arranged in a four by four matrix are illustrated, with no limitation implied by those illustrative choices. Embodiments may be organized into rectangular, square, or sparse matrices of any dimensions M and N, with elements of the matrix being composed of any phase comparator described herein and optionally any weighting factor computation described herein. As the local clock phases repeat cyclically, the leftmost and rightmost columns of the matrix should be considered as being logically adjacent in their local clock phase relationship. This may be observed in FIG. 11B. Suppose in FIG. 11B, CKPLL0=0°, CKPLL1=90°, CKPLL2=180°, and CKPLL3=270°. It should be noted that this these numbers are being used purely for illustration. It would thus follow that a fifth local oscillator clock CKPLL4 would equal 360, which would of course be the same phase as CKPLL0. Thus, the left-most and right-most columns should be considered adjacent in accordance with embodiments described above. As used herein, a sparse matrix is any embodiment in which at least one of the described element weights is zero. In some embodiments, one or more number of reference clock phases can be compared to one or more than one phases of the feedback clock. Every extra feedback clock phase (CkPLLN) provides more detailed information about the phase noise of VCO in time domain. Hence, such a phase comparator may more often provide correction signals to the loop filter. In other words, a multi-phase feedback system enables the loop to increase its update rate and correct for phase deviation of VCO at higher rates. Similarly, if there are more number of reference clock phases available, higher resolution phase comparison can be made, and correspondingly correction signals may be applied more often in time. If there is only one reference phase, still a controlled chain of delay line (CDL) can be employed to replicate the reference clock. The bandwidth of control loop for such a delay line needs to be either very high, or very low in order to guarantee that all the phases of the replicated clock phases carry similar jitter characteristics within the frequency range of interest. A generalized two-dimensional phase comparator is depicted in FIG. 11B, in which every phase of the feedback signal can be compared with every phase of the reference clock.

In a full matrix comparison, each of M phases derived from the received reference signal is separately phase compared with each of the N phases derived from the local PLL clock. Each resulting phase error signal is weighted by a configured or predetermined amount, with all (M*N) weighted results summed to produce a composite phase-error signal. An example of one partial phase comparator is shown in FIG. 11A as 1110, composed of XOR phase detector 1112 feeding to result weighting factor 1118. As shown, each partial phase comparator 1110 receiving CKRef (m) and CkPLL(n) may have a corresponding weighting factor W(m,n) for 0≤m<M−1 and 0≤n<N−1. An embodiment of the complete matrix phase comparator 1120 in FIG. 11B is composed of M*N instances of 1110, each accepting one of the M reference phases, herein identified as CkRef0, CkRef1, CkRef2, CkRef3, and one of the N local phase inputs herein identified as CkPLL0, CkPLL1, CkPLL2, CkPLL3, and producing a weighted result e.g. multiple results 1131, 1132, 1133, 1134 as input to summation 935, which produces composite phase-error signal 1145.

Figure 9:
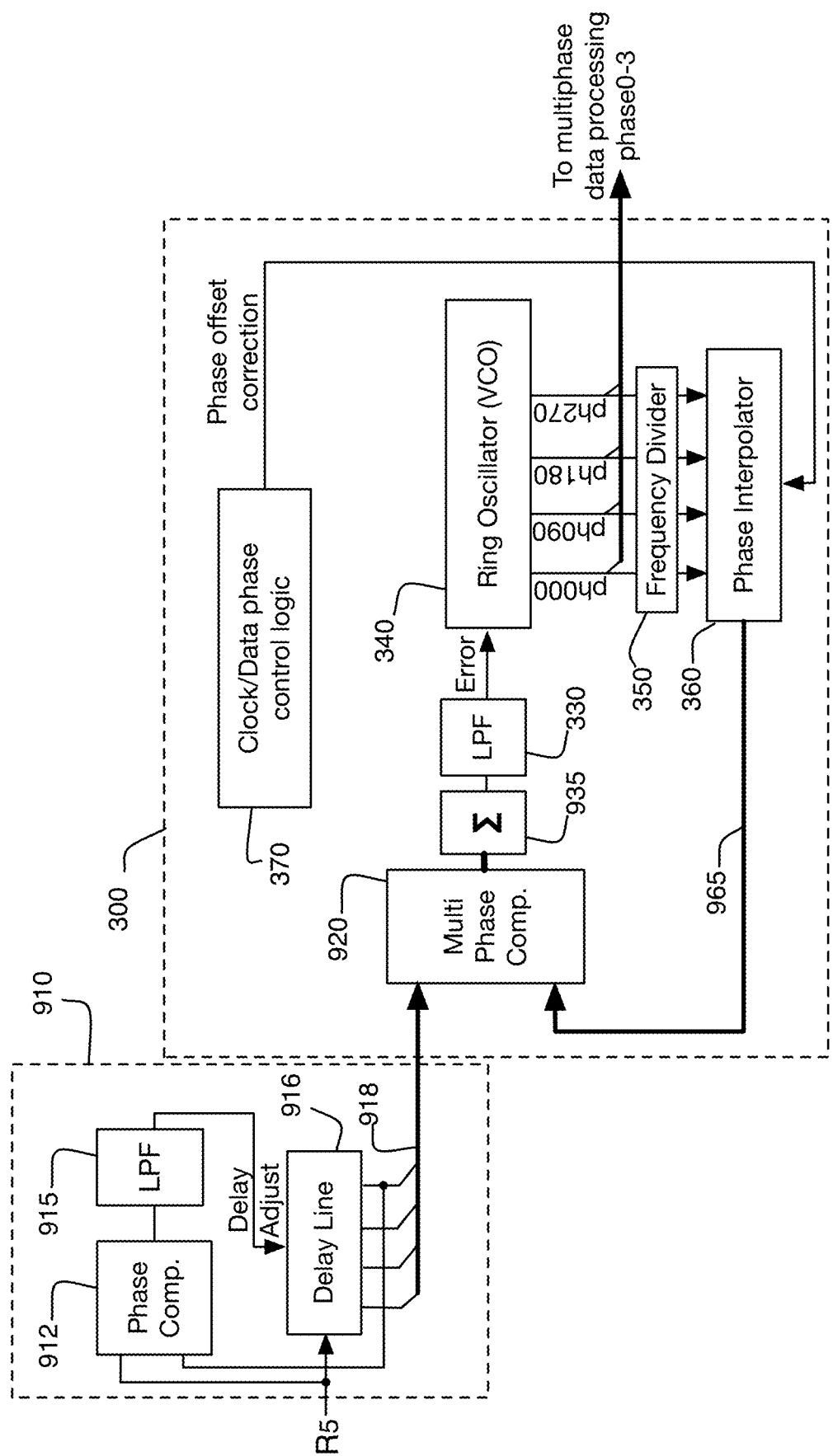
FIG. 9 is a block diagram of a further embodiment in which multiple phases of a reference clock are compared with multiple local clock phases.

One familiar with the art will observe that the previously-described multi-phase comparator 920 of FIG. 9 is equivalent to a partially-populated instance of the present matrix comparator, i.e. having comparators instantiated across a diagonal of the matrix. Functionally, an identical result may be obtained from a full matrix by setting the weights along such a diagonal to a nonzero value, and all other comparator weights to zero. It thus follows that other described behaviors including simulation of phase offsets, introduction of loop time domain zeroes, etc. may be similarly be obtained by selective configuration of matrix weighting factors. In such embodiments, each reference clock phase will be compared with its corresponding feedback clock phase, i.e. CkRef,m versus CkPLLn. The dynamics of such a diagonal comparator are similar to a conventional PLL (CPLL) except that the update rate is N times faster. Higher loop update rate will allow a diagonal PLL to track input jitter and correct jitter of VCO up to higher frequencies. In summary, signal (reference) transfer characteristics, (STF), and VCO noise (jitter) transfer characteristics, (NTF or JTF), of such a system will be N times wider compared with the conventional PLLs.

In at least one embodiment, the matrix comparator of FIG. 11B may be simplified such that different phases of feedback signal (CkPLL) are compared against only one reference clock phase. Such embodiments are especially interesting as generally there is only one single reference clock phase available. In such an implementation W(m,n) are zero unless m=0.

Figure 15:
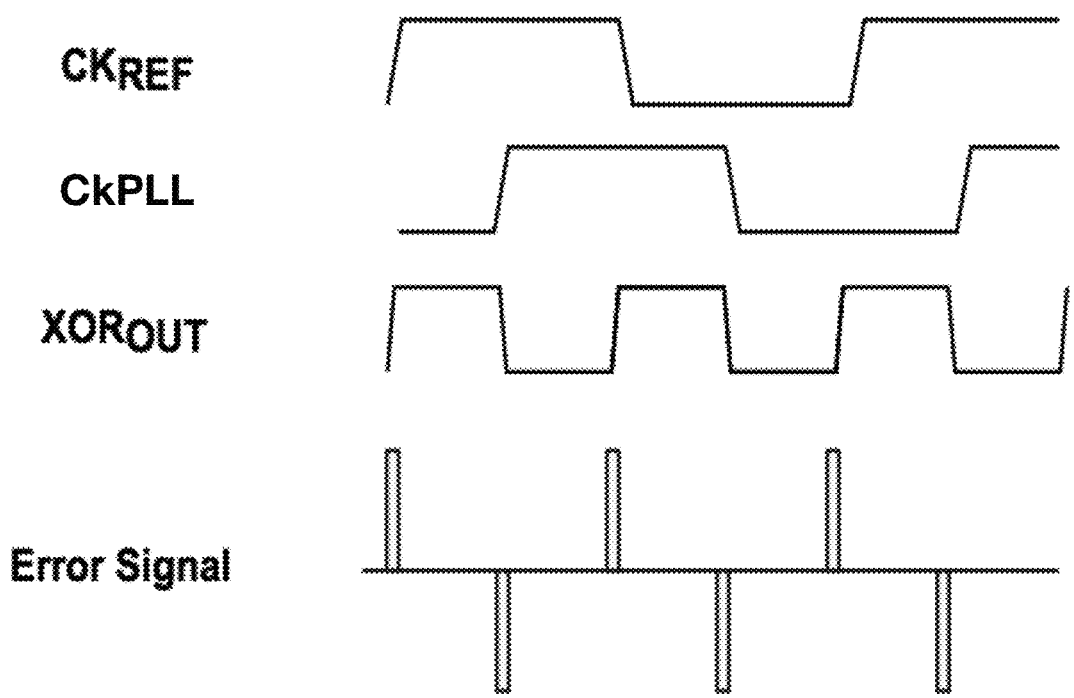
FIG. 15 illustrates XOR-based phase comparator and correction signals applied to a loop filter, in accordance with some embodiments.
Figure 16:
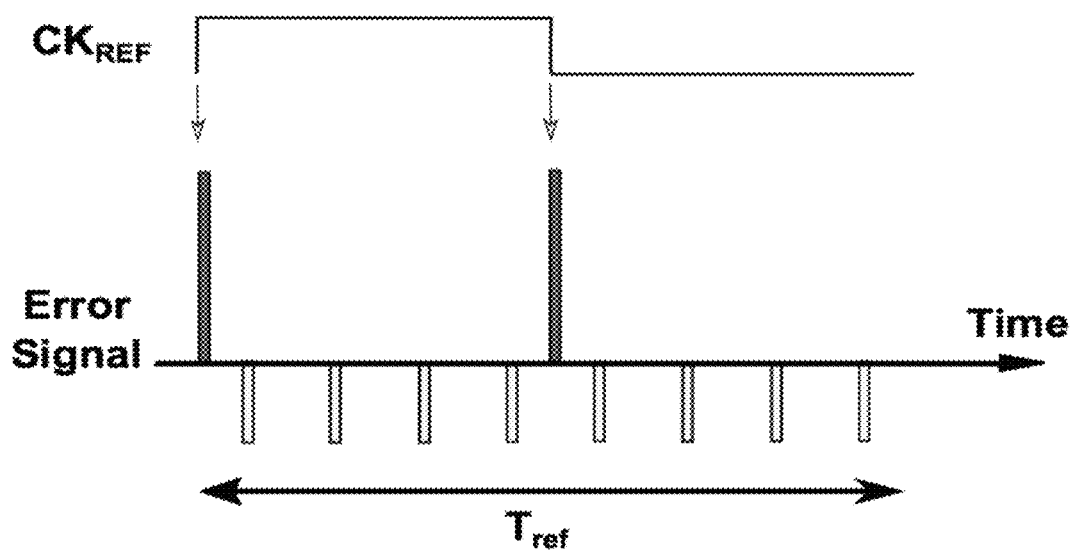
FIG. 16 illustrates time-domain error signals produced by a row-based phase comparator in accordance with some embodiments.

Assuming a four phase feedback, each phase comparator produces a correction signal which eventually will be accumulated onto the capacitor of the loop filter. While under lock condition the integral of the correction signal illustrated in the bottom waveform of FIG. 14A is zero, this signal has its main harmonic at $2f_{ref}$. Any jitter on the reference clock or feedback divider phase will cause some deviations at different edges of the bottom waveform shown in FIG. 14A. The bottom waveform in FIG. 14A shows the correction signal injected into the loop filter. Comparing the waveform depicted in the bottom waveform of FIG. 14A with the waveform of a simple XOR phase comparator shown in FIG. 15, it is evident that the number of transitions happening at the output of comparator during a single reference clock period has been increased by more than a factor of two. While in both waveforms there are two jumps created by the rising and falling edges of CkRef, the number of transitions due to feedback signal has been increased from two in FIG. 15 to eight in FIG. 14A (also shown in FIG. 16). Based on this, the feedback transfer function in a multi-phase diagonal PD will be different form a conventional PD. Due to more number of samples provided by the feedback path in this case, the noise of VCO can be corrected more often, and hence over a wider frequency bandwidth.

A multi-phase or array phase comparator as described above opens new doors to design low noise and wide-band PLLs. Described below are different examples of improving performance of PLLs using array phase comparators.

In some embodiments, array phase comparators provide double edge phase comparison: Using double edges (rising and falling edges) of the reference clock provides the possibility to make two separate phase corrections at every cycle. Hence, the BW of PLL can be potentially increased by a factor of two. In case the duty-cycle of the input reference is not 50%, it will create some ripples at 2·Fref and can increase deterministic jitter (DJ) of the oscillator. Indeed, as the ripple frequency is fairly high, with proper loop filter design it will be possible to reject major part of this DJ.

In some embodiments, array phase comparators provide Inter-VCO-phase comparison. To detect and correct duty-cycle and quadrature mismatch errors (QME), generally designers make comparison between different phases of a VCO. For such correction, the error signal resulted from inter-VCO-phase comparison is heavily filtered and a very low frequency correction signal is applied in a proper point of the system in order to correct for duty-cycle distortion or quadrature mismatch. Embodiments described above may be expanded to detect and correct random jitter of VCO.

Some embodiments of the two-dimensional discrete-time phase comparator provide the possibility to implement a discrete-time filter in front of PLL. This opportunity can be used to implement special transfer functions in order to improve the performance of system. For example, by proper choice of digital filter coefficients (e.g., the weights described above), one may detect and suppress phase noise at special frequencies in order to improve tolerance of system against supply or substrate noise. Some embodiments provide Phase Interpolation: There are different approaches for rotating phase of oscillator in a PLL and adjusting the exact timing of recovered clock based on system requirements. In some embodiments, a diagonal comparator array structure provides the possibility to rotate a phase of the oscillator with respect to the phase of reference clock.

Figure 17:
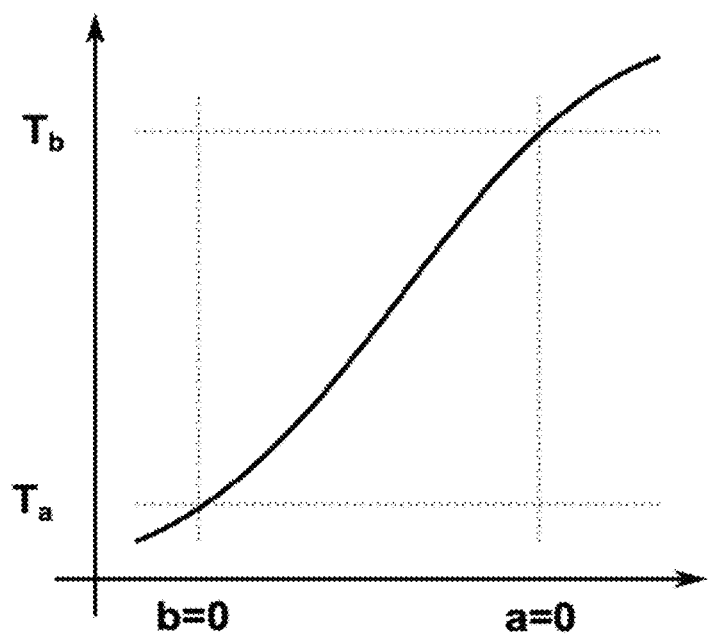
FIG. 17 illustrates phase interpolation based on interpolation a lock point between two consecutive diagonals of a two dimensional phase comparator array, in accordance with some embodiments.

Suppose for a given reference clock CkRefm and a given local oscillator phase CkPLLn, W(m,n)=a for (m−n)=0, W(m,n)=b for |m−n|=1, and zero for the rest of m and n values (noting that n must be considered modulo the number of local oscillator phases, because of its previously-described cyclic nature. Assuming that a+b=c, and c has a fixed value. In this case, by changing a, and b=c−a, it is possible to rotate the phase of VCO. If lock points corresponding to [a,b]=[c,0] and [a,b]=[0,c] are Ta and Tb, respectively, then as depicted in FIG. 17, by changing a (and inversely changing b=c−a) the lock point of oscillator can be adjusted between Ta and Tb.

Figure 18:
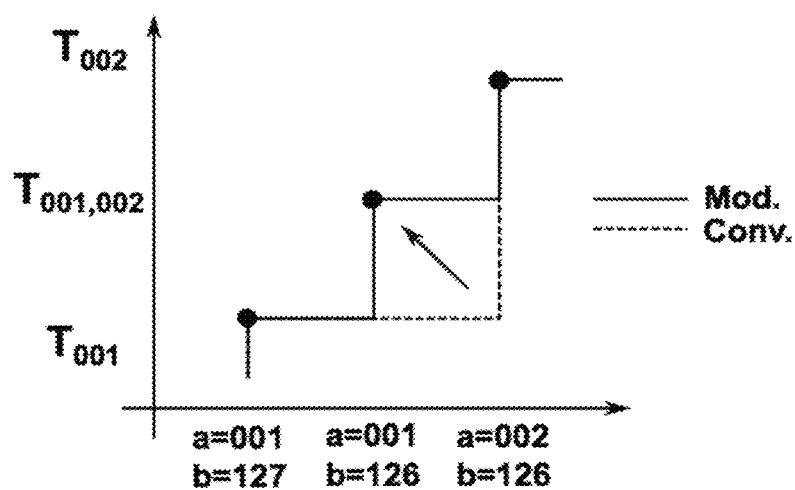
FIG. 18 illustrates improved resolution of a phase interpolator in a diagonal multi-phase detector structure, in accordance with some embodiments.

The same argument is valid for any other combination of the two consecutive sets of |m−n|=k and |m−n|=k+1, where k is an integer number smaller than the size of phase comparator matrices. Suppose a and b are the weights for two consecutive sets of diagonal comparators k and k+1. If a and b are controlled digitally with two independent sets of $N_b$ bits, then the resulted phase interpolator can exhibit $N_b$+1 bits of resolution. Illustrated in FIG. 18, it can be observed that by proper jogging between n(a) and n(b) (control bits corresponding to a and b, respectively), it is possible to add one extra phase point between every two phase steps of the original phase interpolator.

An example of diagonal interpolation is given below, where the main diagonal has a weight a assigned to each element and where an adjacent diagonal has a weight b assigned to each element:

An example of diagonal interpolation is given below, where the main diagonal has a weight a assigned to each element and where an adjacent diagonal has a weight b assigned to each element:

$$\begin{bmatrix} a & b & 0 & 0 \\ 0 & a & b & 0 \\ 0 & 0 & a & b \\ b & 0 & 0 & a \end{bmatrix}$$

Note that due to the cyclical nature of adjacent columns, a weight on the element of b is included at the bottom-left most element of the matrix. Thus, it always remains that an equal number of elements will contain a weight of a and b, providing a linear and symmetric phase relationship, as shown in FIG. 17. Another example of two adjacent diagonals is given below showing the cyclic nature:

$$\begin{bmatrix} 0 & a & b & 0 \\ 0 & 0 & a & b \\ b & 0 & 0 & a \\ a & b & 0 & 0 \end{bmatrix}$$

In an alternative embodiment, interpolation is performed between two adjacent rows or two adjacent columns of a weighting matrix. The concept is very similar to the diagonal embodiment above, in that a first column may have a first fixed phase offset, while a second column has a second fixed phase offset. A weight a may be assigned to each element in the first column and a weight b may be assigned to each element in the second column, where a +b=c, as described above. Also, it should be noted that the left-most columns and right-most columns should be considered adjacent due to the cyclical nature of the local oscillator clocks. Thus, interpolating the weights a and b in each column will provide an intermediate phase in between the first and second fixed phases.

In an alternative embodiment, interpolation can be performed between two adjacent rows or two adjacent columns of a matrix. The concept is very similar to the diagonal embodiment above, in that a first column may have a first fixed phase offset, while a second column has a second fixed phase offset. A weight a may be assigned to each element in the first column and a weight b may be assigned to each element in the second column, where a +b=c, as described above. Also, it should be noted that the left-most columns and right-most columns should be considered adjacent due to the cyclical nature of the local oscillator clocks. Thus, interpolating the weights a and b in each column will provide an intermediate phase in between the first and second fixed phases.

Phase Comparator Architecture

The flexibility and architectural simplicity of a matrix comparator may be offset by the potential complexity of its embodiment, in both the number of comparators used to fill an array of M×N elements, and in the implementation of the required weighting or scaling factor for each of those elements.

Figure 19A:
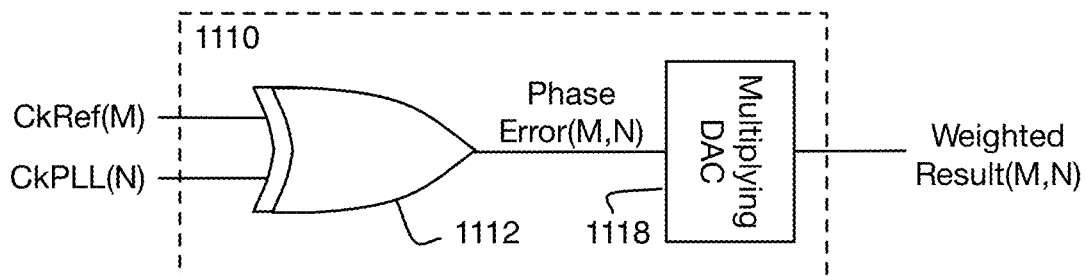
FIGS. 19A-19D illustrate various partial phase comparator architectures, in accordance with some embodiments.

As a non-limiting example, a PLL utilizing a matrix comparison of each of eight VCO clock phases against a single reference clock input includes eight comparator elements, each associated with a configurable or adjustable scaling factor, and one summation node to produce a combined error result. In one such embodiment shown in FIG. 19A, each partial phase comparator 1110 incorporates a multiplying DAC structure to implement the weighting factor as in 1118. In some embodiments, the weighting signal selectively enables one or more switching elements, which may include a transistor switch and a current source, for example. Thus the more switching elements are enabled, a higher weight will be applied to the partial phase-error signal.

Figure 19B:
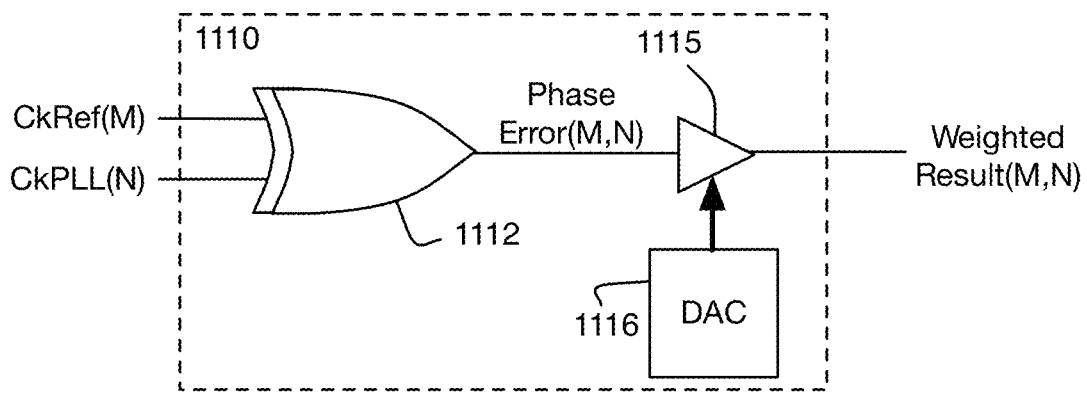

As the distributed capacitance of the DAC structure in the signal path may unreasonably degrade signal integrity, an alternative embodiment moves the DAC out of the signal path. In this second embodiment, a DAC element 1116 is used to scale or adjust supply voltages to a digital buffer element 1115 as in FIG. 19B, resulting in a scaled or weighted signal output.

Figure 19C:
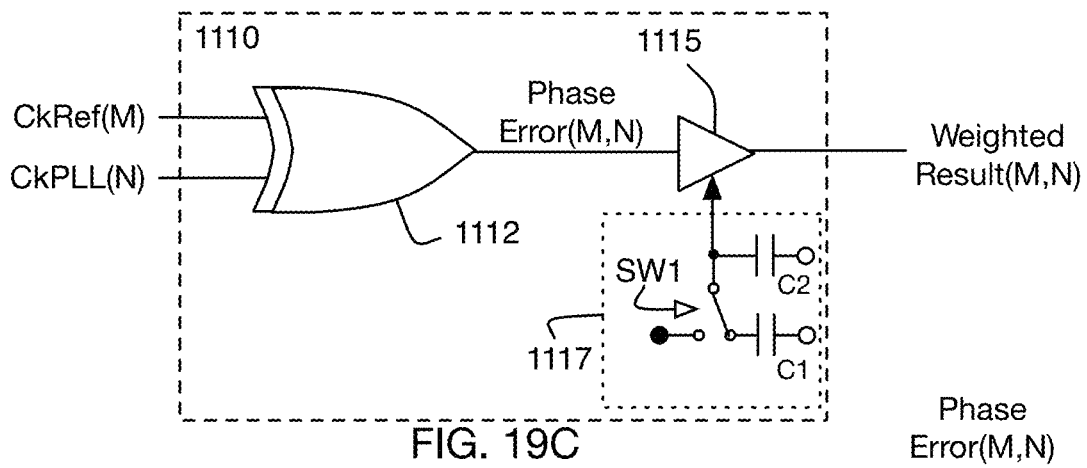

Circuit applications requiring low power operation may be incompatible with resistive DAC usage, thus a further embodiment utilizes switched capacitor technology. In this third embodiment of FIG. 19C, the scaled or adjusted supply voltages for buffer 1115 are produced dynamically 1117, by dumping measured amounts of charge from one or more source capacitances C1 into the buffering device's power rail capacitance C2. In this illustrative example switch SW1 is shown performing this charge transfer; switching transistors would be used in a practical embodiment, as well understood in the art, and either or both of C1 and C2 may be composed of discrete as well as parasitic or distributed capacitances.

Figure 19D:
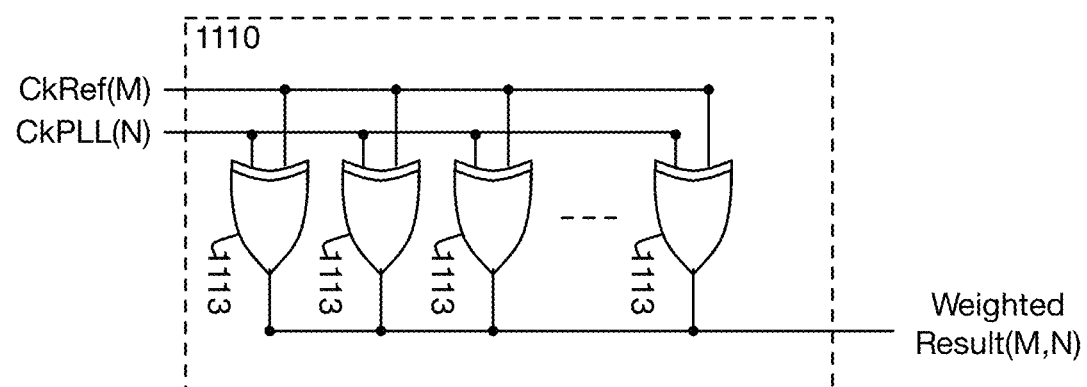

An alternative fourth embodiment shown as FIG. 19D does not attempt to adjust or modify the signal output of a single phase comparator, but instead utilizes a parallel set of phase comparators 1113 producing partial phase-error signal that when combined collectively produce composite phase-error signal. In such an embodiment, the output drive capability of an individual phase comparator 1113 is constrained, e.g. by the transistor dimensions of its output driver. As one example, a composite phase-error signal may be produced by passive summation of the individual partial phase-error signals, and the overall output amplitude weighted or controlled by enabling or disabling phase comparators within the set, either individually (as one example, controlled by a thermometer code,) or in groups (as another example, controlled by a binary weighted code.)

Figure 20:
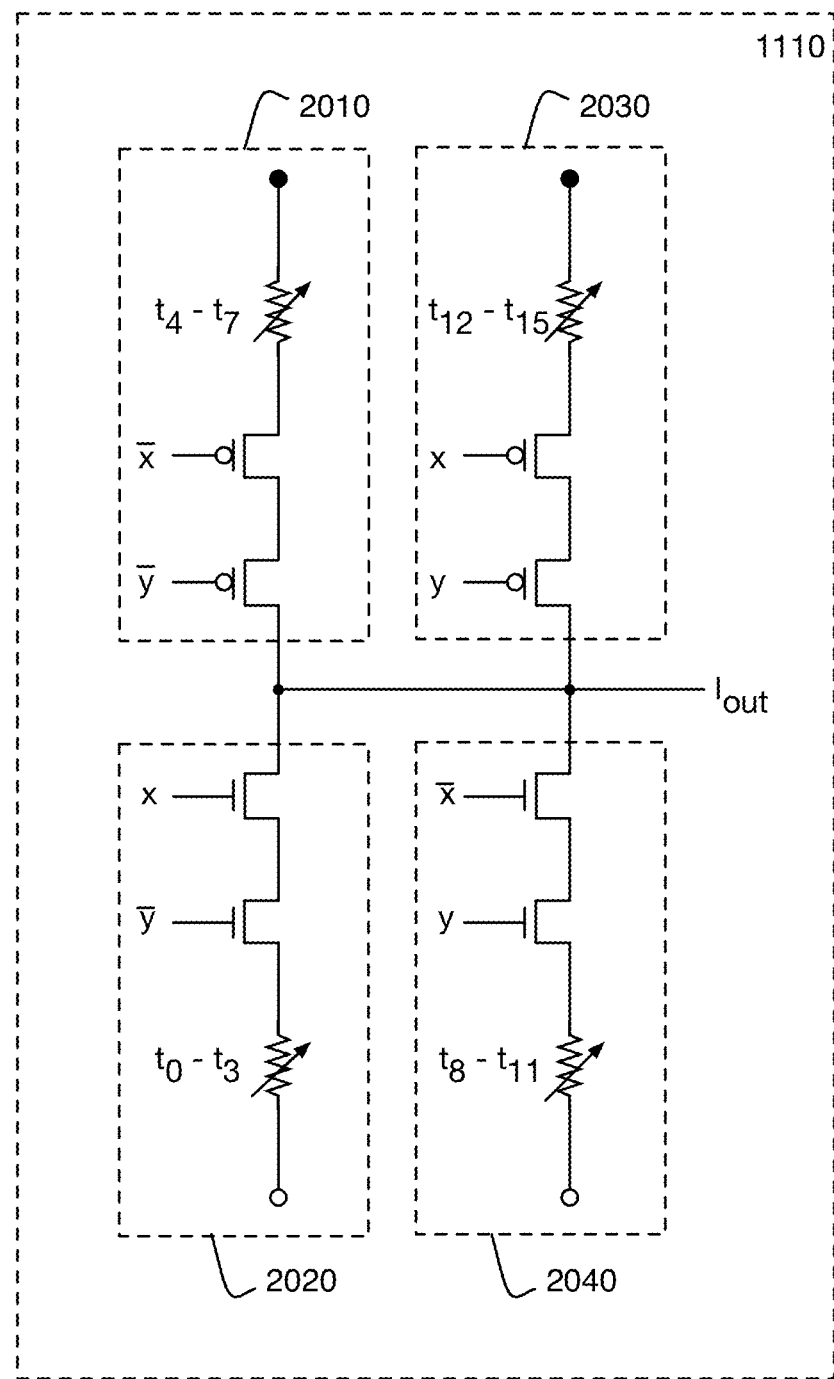
FIG. 20 illustrates an exemplary XOR phase comparator architecture, in accordance with some embodiments.
Figure 21:
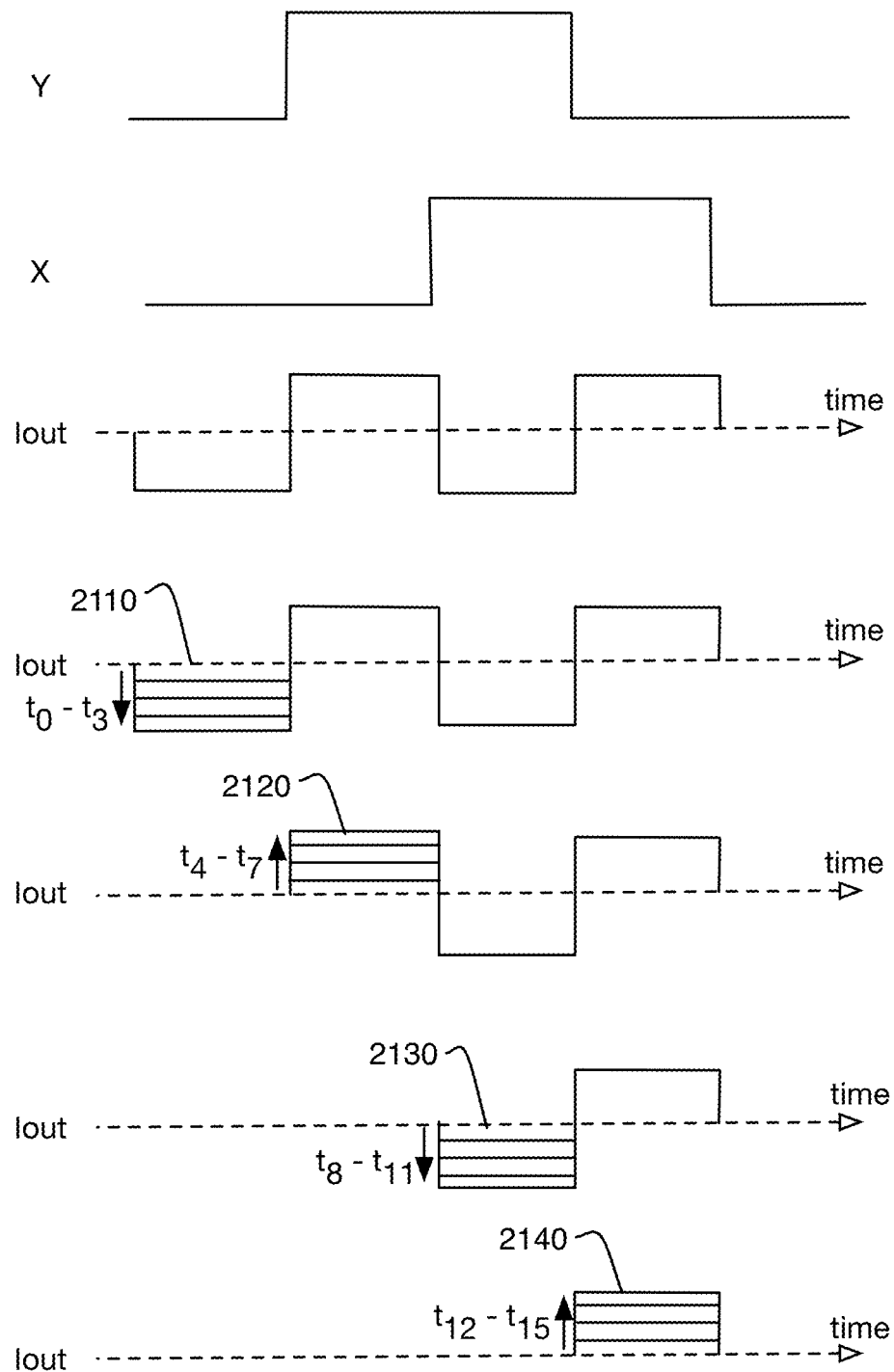
FIG. 21 illustrates a timing diagram of output currents Iout of an XOR phase comparator shown in FIG. 20, in accordance with some embodiments.

During high-speed simulation of that fourth embodiment, transient output variations were observed within the gate propagation time of the XOR phase detector element, that is, at a finer granularity than the overall behavior of the XOR gate as a whole. It was noted that an exclusive-OR function may be decomposed into distinct NOT-AND-OR logic elements as described by the well-known Boolean equation $(x \cdot \bar{y})+(\bar{x} \cdot y)$, and the observed behavior suggested that variations among the different current paths within the gate implementation were producing the observed variations. This lead to the embodiment of FIG. 20, where the four signal paths 2010, 2020, 2030, 2040 are composed of series transistors forming transistor branches configured to respectively compute the logical cases $\bar{x} \cdot \bar{y}$, $x \cdot \bar{y}$, $\bar{x} \cdot y$, $x \cdot y$, each path further includes an adjustable or configurable impedance which may be a resistor, a current source/sink, or in some embodiments may be implemented as a scaling of transistor geometry to constrain current flow in that signal path. A timing diagram illustrating the output Iout resulting from inputs X and Y is shown in FIG. 21.

Adjustment of the four signal path impedances by introducing path resistance, scaling transistor dimensions, or directly adjusting current flows may be used to control output amplitude within the overall response of the XOR gate as a whole, thus producing the desired weighing function. As one example, consider each signal path impedance in FIG. 20 as being composed of four parallel resistors each controlled by a transistor switch. In such a case, a portion of a weighting signal which may be a four-bit thermometer code $t_0$-$t_3$ (as one example offered without limitation) can enable four distinct levels of current flow within signal path 1920, which may be seen in FIG. 21 to adjust one segment 2110 of the overall output Iout. Continuing this example, $t_4$-$t_7$ adjusts segment 2120, $t_8$-$t_{11}$ adjusts segment 2130, and $t_{12}$-$t_{15}$ adjusts segment 2140. Although in some embodiments the weights of each of the four segments will be adjusted identically, this is not required. As examples, $t_0$-$t_3$ and $t_4$-$t_7$ may be configured to different values than $t_8$-$t_{11}$ and $t_{12}$-$t_{15}$ to provide increased overall adjustment granularity as previously described relative to FIG. 5. As another example, $t_0$-$t_3$ and $t_8$-$t_{11}$ may be configured to different values than $t_4$-$t_7$ and $t_{12}$-$t_{15}$ to intentionally introduce a DC offset at the output.

Independently adjusting the four segments of each XOR operation may also facilitate the previously-described matrix comparator operations, including interpolation. As one example, two XOR comparators as in FIG. 20 with outputs connected to a common summation node may be used to compare a reference clock with two local clock phases, as previously described. If interpolation control values a, b, c, d represent the weighting signals applied to the first XOR segments ($t_0$-$t_3$, $t_4$-$t_7$, $t_8$-$t_{11}$, $t_{12}$-$t_{15}$), and 1-$a$, 1-$b$, 1-$c$, 1-d represent the weighting signals applied to the second XOR segments, the common summation node result corresponds to an interpolation between the first and second local clock phase comparisons, with the interpolation control values permitting adjustment of the effective clock phase.

Alternatively, scaled transistors or explicit current source/sink circuits may be used instead of resistors to control current flow; as in the resistive example, different numbers of enabled and disabled parallel current paths may be used to adjust the overall output Iout. the portions of the weighting signal above collectively form the weighting signal $t_0$-$t_{15}$ for the corresponding partial phase comparator.

The adjustable or configurable elements described herein may be combined with or equivalently be substituted by comparable known art elements, including without limitation R-2R ladder structures controlled by transistor switches, resistive chain structures controlled by transistor switches, equal-value or binary-weighted resistors configured in series- or parallel-connected combination by transistor switches, and fixed and/or configurable current sources and current sinks.

Specific values and quantities described in examples are provided to facilitate explanation, without implying limitation.

Simulations

Figure 22:
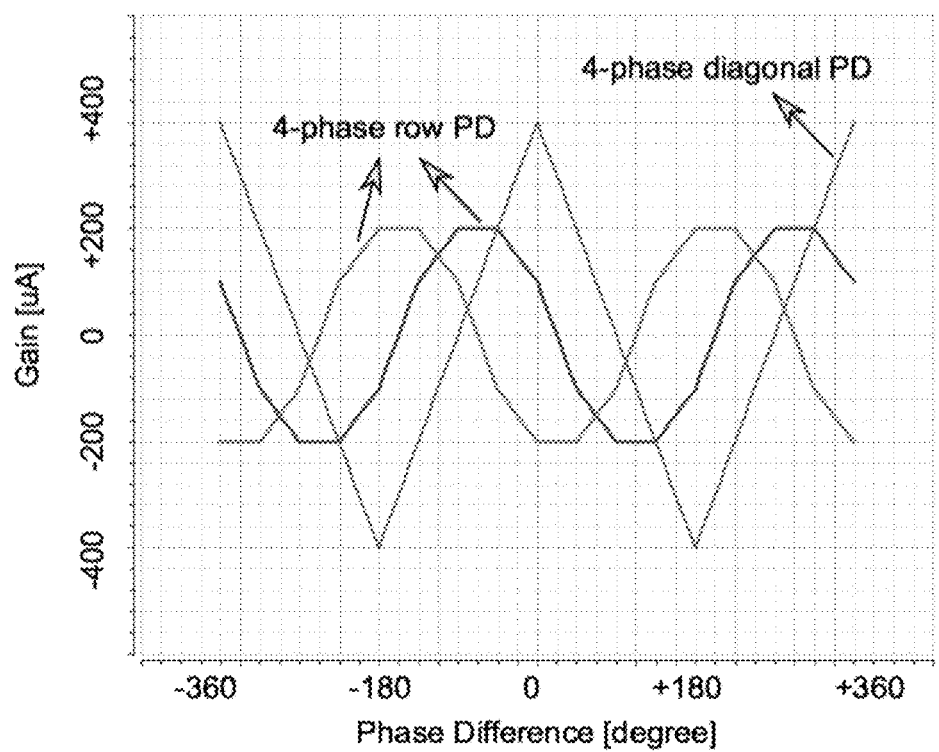
FIG. 22 is a simulated phase comparator response, in accordance with some embodiments.

The steady state response of two different types of phase comparators are shown in FIG. 22. In these simulations XOR based phase comparator cells have been utilized. The gain of a diagonal phase comparator versus input phase difference is very similar to a simple XOR phase comparator. The main difference between the two phase comparators is that error signal produced by a diagonal phase comparator is distributed in time. The row phase comparator, however, exhibits a different response. As can be seen, depending on which row of the matrix comparator has been selected, the response exhibits a different shift in time. FIG. 22 shows the response for two different cases.

An MCPLL (matrix phase comparator based CPLL) has been designed in a conventional 28-nm CMOS technology. A current steering architecture with $K_{VCO} \approx 20$ GHz/V is selected for the VCO. A loop filter as shown in FIG. 24 is chosen to be R1=100Ω in series to C1=20 pF with ICPC=100 µA. The reference clock frequency is 6.25 GHz with $N_{div}$=1. The XOR CPLL is based on 2R×2F architecture (comparing 2 reference phases with 2 feedback phases at every reference clock cycle). For the implemented MCPLL, a 2R×4F architecture has been chosen.

Figure 23:
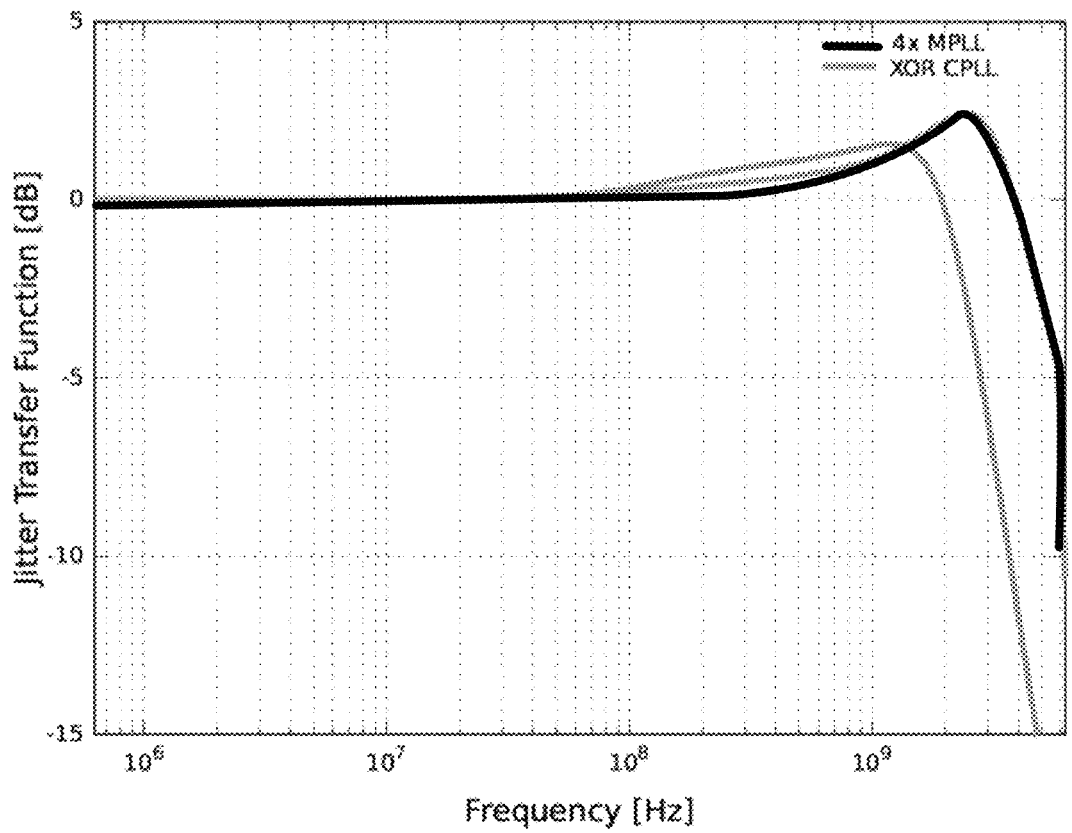
FIG. 23 is a simulation of a phase-locked loop bandwidth, in accordance with some embodiments.

FIG. 23 shows the transfer characteristics of the two PLLs simulated in transistor level. As shown, the input signal is sampled at 2fref, hence the system Nyquist rate is fref. Because of that, as depicted in FIG. 22, both PLLs have a null at fref=6.25 GHz. The parasitic pole of the VCO in addition to the parasitic pole at the output of CPC cause 1.2 and 2.4 dB peaking in CPLL and MPLL, respectively, for the two PLLs. It can be seen also that the MCPLL transfer characteristic stays closer to 0 dB between 100 MHz to 1.2 GHz. The cutoff frequency for the two PLLs are 2.48 (=40% of fref) and 5.02 GHz (=80% of fref), respectively. Therefore, it can provide better jitter tracking. Moreover, MCPLL generates 55 fs of rms jitter, while jitter generation for CPLL is 79 fs rms. Due to higher BW, the phase noise of VCO in MCPLL is filtered out over a wider range and because of that this architecture exhibits considerably lower jitter generation, comparable to performance of LV VCO based PLLs.

Data-Driven Phase Comparator

Figure 25:
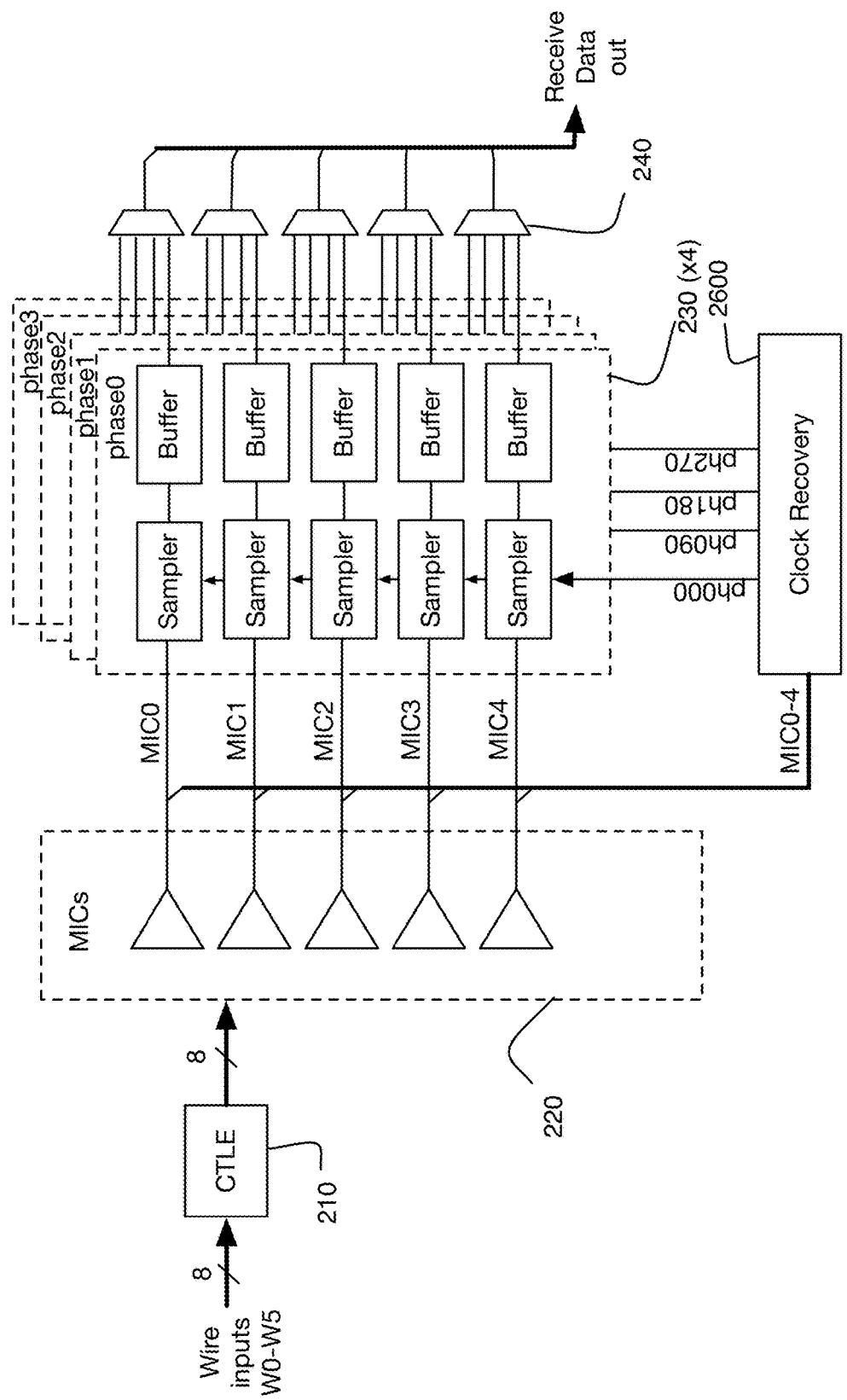
FIG. 25 is a block diagram of a receiver, in accordance with some embodiments.
Figure 26:
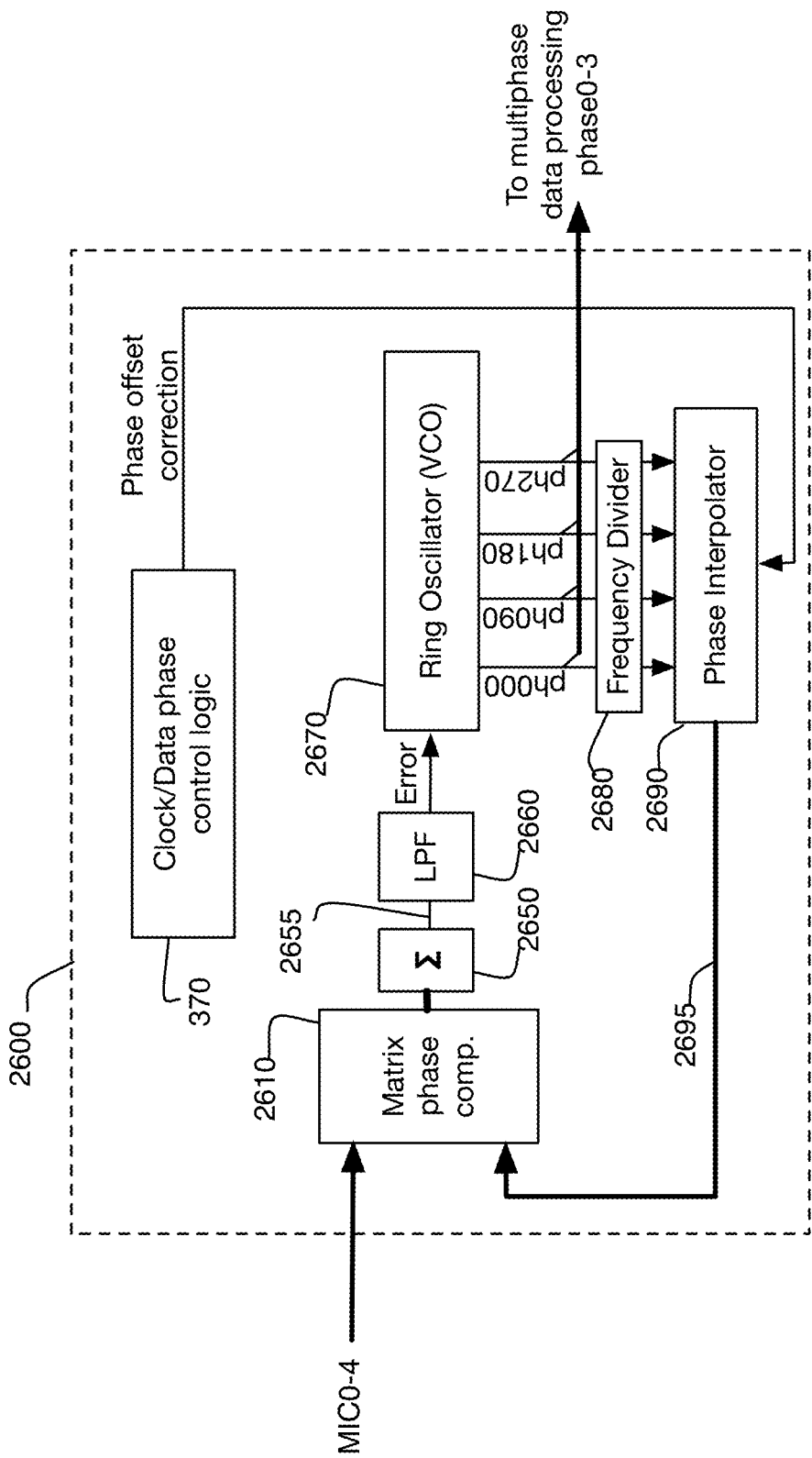
FIG. 26 is a block diagram of a clock recovery circuit operating on detected data signals, in accordance with some embodiments.

In some embodiments, the above-described matrix phase comparator architecture may be applied to extraction of a clock signal from transitions occurring on multiple data sub-channels, as one example on the various sub-channels of a vector signaling code communicated over a multi-wire bus. In such embodiments, vector signaling codes with guaranteed transition density over time, such as taught by [Shokrollahi I] are amenable to such combination. FIG. 25 illustrates a receiver utilizing a data-driven phase comparator, in which data signals received in parallel from MIC0-MIC4 are monitored for transitions, providing clock phase information to Clock Recovery 2600 and thus controlling the phase of sampling clocks ph000, ph090, ph180, ph270. FIG. 26 provides a more detailed view of Clock Recovery 2600, which utilizes matrix phase comparator 2610.

Considering the multiple data inputs being monitored by such a system, several operational considerations are apparent. First, as any received data bit may remain in either the "1" or "0" state in consecutive unit intervals, only data transitions between those states are relevant to PLL phase. In particular, between any two consecutive unit intervals a transition may or may not occur in any given data bit; indeed, no transition may occur on any data bit in a given clock interval. If a transition does occur, the matrix phase comparator may utilize the timing of that transition to update the PLL clock phase, while if no transition occurs, the PLL clock may be allowed to continue unchanged. If two or more data lines transition in the same clock interval, the timing errors derived from each such transition may be summed, which is consistent with the previously-described matrix phase comparator behavior.

Figure 29:
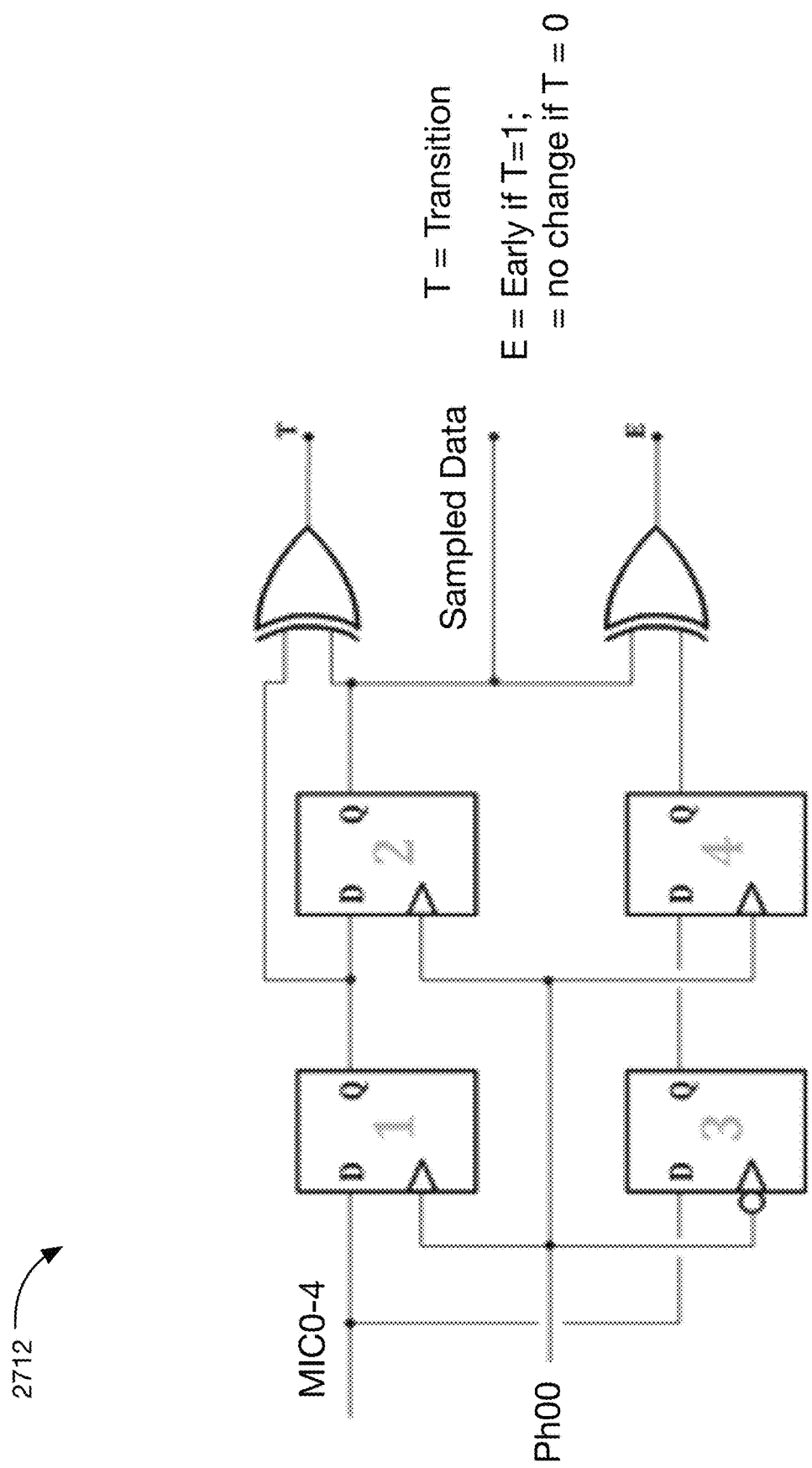
FIG. 29 is a block diagram of an edge-triggered bang-bang phase detector.
Figure 30:
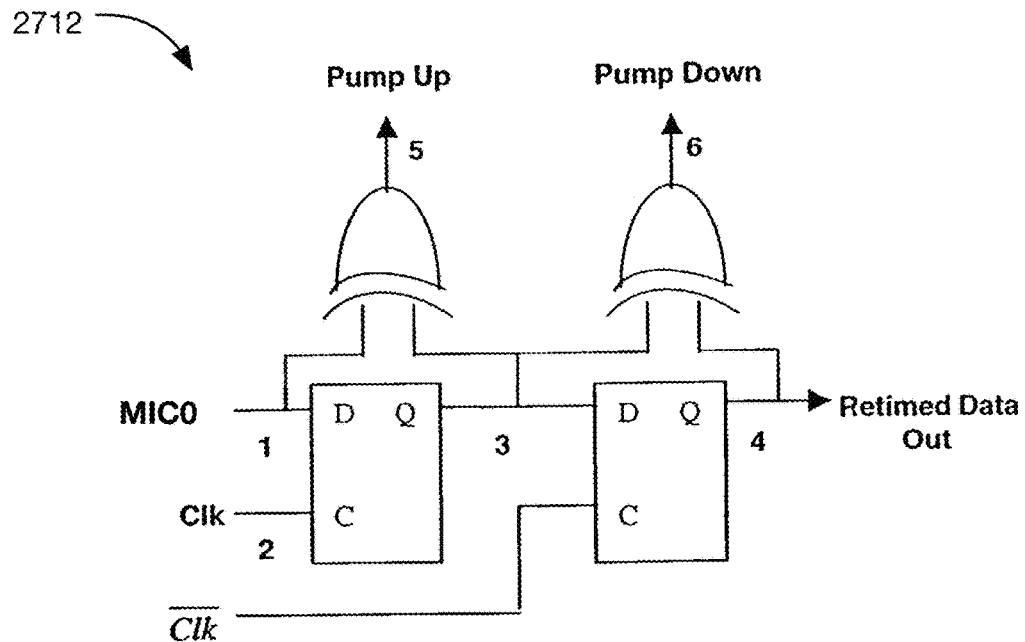
FIG. 30 is a block diagram of a linear edge-triggered phase detector.
Figure 31:
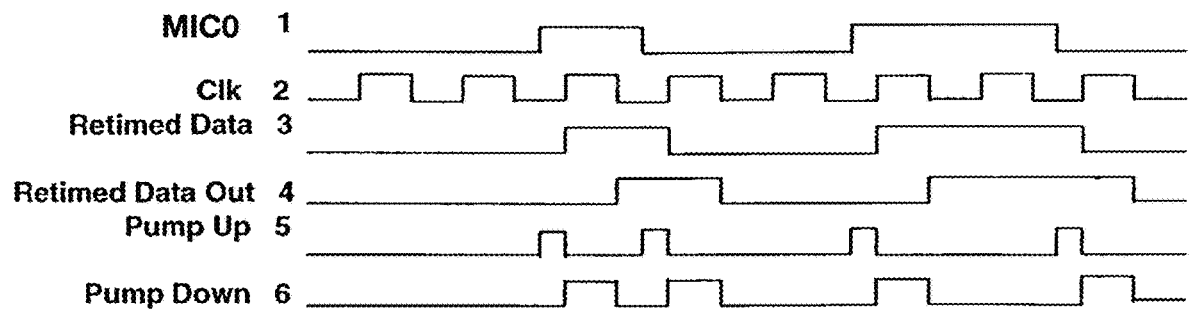
FIG. 31 is a wave-form associated with the linear edge-triggered phase detector of FIG. 30.

This behavior suggests that a state-machine phase detector may be a suitable candidate for the phase comparison elements of the comparison matrix, as such designs may be configured to respond only to signal transitions rather than signal level, and may be configured to output a "no change" result in the absence of a signal transition. In some embodiments, the partial phase comparators 2712 may take the form of edge-triggered bang-bang detectors configured to generate partial phase-error signals in response to determining a transition occurred. A block diagram of an exemplary edge-triggered bang-bang phase detector is shown in FIG. 29. In some embodiments, the partial phase comparators may take the form of linear edge-triggered phase detectors to generate partial phase-error signals in response to determining a transition occurred. A block diagram of a linear edge-triggered phase detector is illustrated in FIG. 30, and a corresponding waveform is shown in FIG. 31.

Another embodiment may incorporate data signal transition detectors, one example including an XOR gate comparing a data signal with a slightly time delayed copy of the same data signal, for example after passing through a logic buffer gate. Such an embodiment will output a logical pulse at each transition, and the edge of such pulse may be phase compared to a PLL clock edge, using any phase detector as previously described. An advanced embodiment may further incorporate a gating or time windowing function in partial phase detectors to produce a "no change" error result from any partial phase detector not receiving a data signal transition in a given time interval.

FIG. 26 illustrates one embodiment of a multi-line Clock Recovery 2600. MIC0-MIC4 are the detected vector signaling code sub-channels (i.e. decoded data bits) for a code similar to that used in the example of FIG. 2. Any transition on a detected vector signaling code sub-channel may produce a partial phase-error signal relative to one or more local clock phases, each such partial phase-error signal being (in this example) an analog signal either pulsing up, pulsing down, or remaining unchanged. The summation 2650 of all partial phase-error signals is low pass filtered 2660, with the result used to adjust the VCO 2670 frequency. In some embodiments, if the transmission medium has significantly different propagation velocity for different propagation modes, various sub-channels may experience eye-closures, resulting in inter-sub-channel skew. In order to offset such inter-sub-channel skew, the phase interpolator 2690 may be configured to independently adjust phases of each local oscillator signal according to the associated data signal in order to correct for such sub-channel specific skew. Alternatively, analog delay elements (not shown) may be used to introduce sub-channel specific delay to compensate for sub-channel specific skew.

Figure 27:
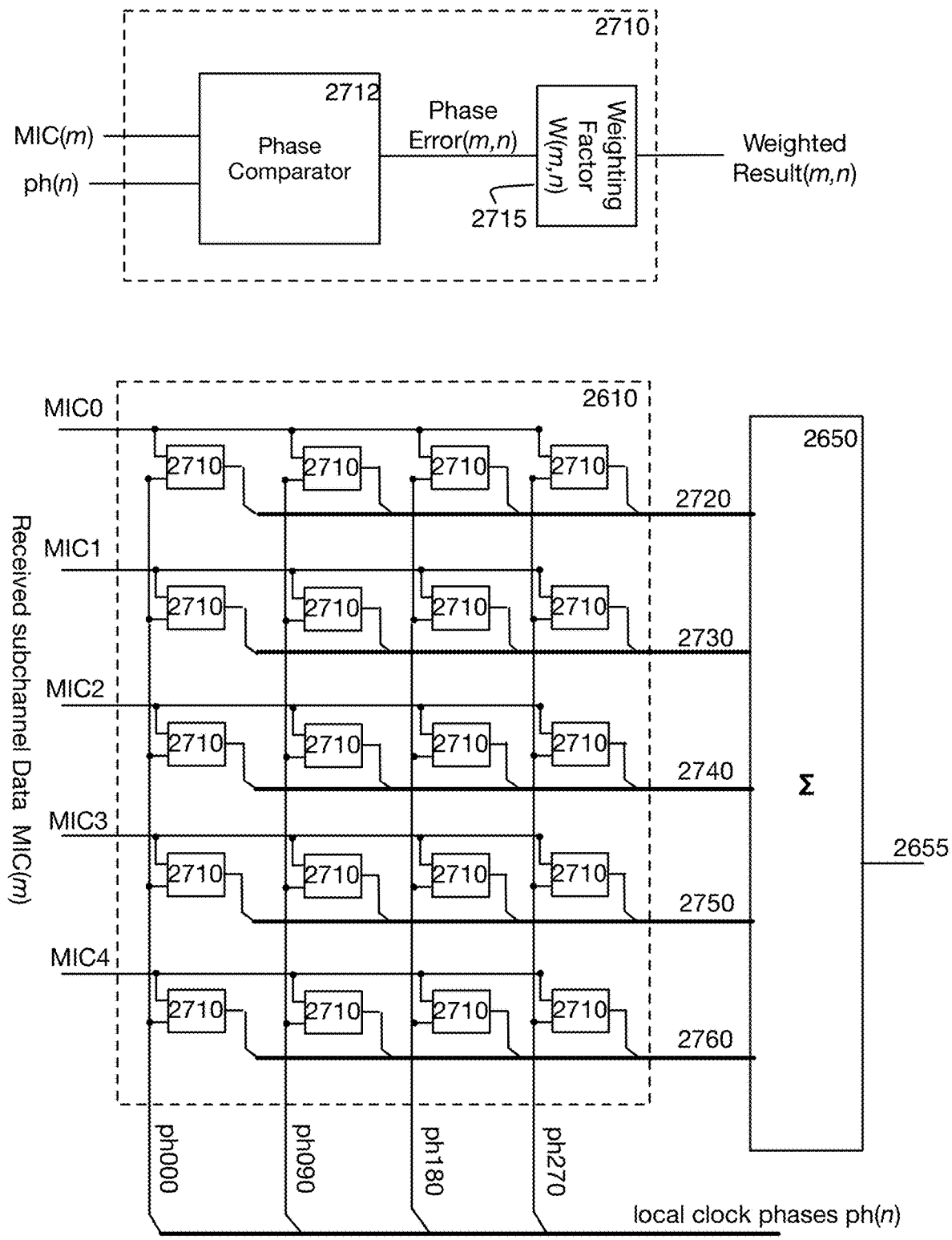
FIG. 27 is a block diagram of a matrix phase comparator operating on detected data signals, in accordance with some embodiments.

FIG. 27 further illustrates one embodiment of Matrix Phase Detector 2610, as including an array of component phase detectors 2710. As one example not implying limitation, each partial phase detector 2710 may in turn include an edge-sensitive state machine phase detector, charge pump, and configurable weighting function, as described in [Tajalli IV]. Matrix phase detector 2610 thus compares each of detected data signals MIC0-MIC4 to four phases of local PLL clock ph0, ph090, ph180, ph270, with each such comparison 2712 producing a phase comparison result that is subsequently weighted 2715. In one particular embodiment, the weighted results are produced as analog currents, thus all such results 2720, 2730, 2740, 2750, 2760 may be summed by mutual connection at a current summation node 2650, producing composite phase error signal 2655 directly. As will be obvious to one familiar with the art, comparable results may also be produced by explicit summation of voltages, numerical computation, etc. thus no limitation is implied. In some embodiments, partial phase comparator 2710 may further receive the Transition_EN enable signal (not shown) to selectively output the corresponding partial phase error signal. In some embodiments, each partial phase comparator 2710 receives a corresponding Transition_EN (m) signal associated with the corresponding detected data signal received at the partial phase comparator 2710. For example, MIC0 may have an associated enable signal Transition_EN0, MIC1 may have an associated enable signal Transition_EN1, etc.

The weights of the individual matrix comparison elements 2710 of matrix phase comparator 2610 may be set uniformly (i.e. with a transition on any data signal equally affecting all clock phases,) or non-uniformly such that particular clock phases are more less affected. As described in [Tajalli IV], other effects including simulation of phase offsets, introduction of loop time domain zeroes, etc. may be obtained by selective configuration of matrix weighting factors.

FIG. 26 shows one embodiment of multi-line Clock Recovery 2600. MIC0-MIC4 are the detected vector signaling code sub-channels (i.e. detected data signals or decoded data bits after slicing and sampling) for a code similar to that used in the example of FIG. 2. Any transition on a detected data signal may produce a phase error relative to one or more local clock phases, each such phase error being (in this example) an analog signal either pulsing up, pulsing down, or remaining unchanged. The summation 2650 of all phase errors is low pass filtered 2660, with the result used to adjust the VCO 2670 frequency.

Figure 28:
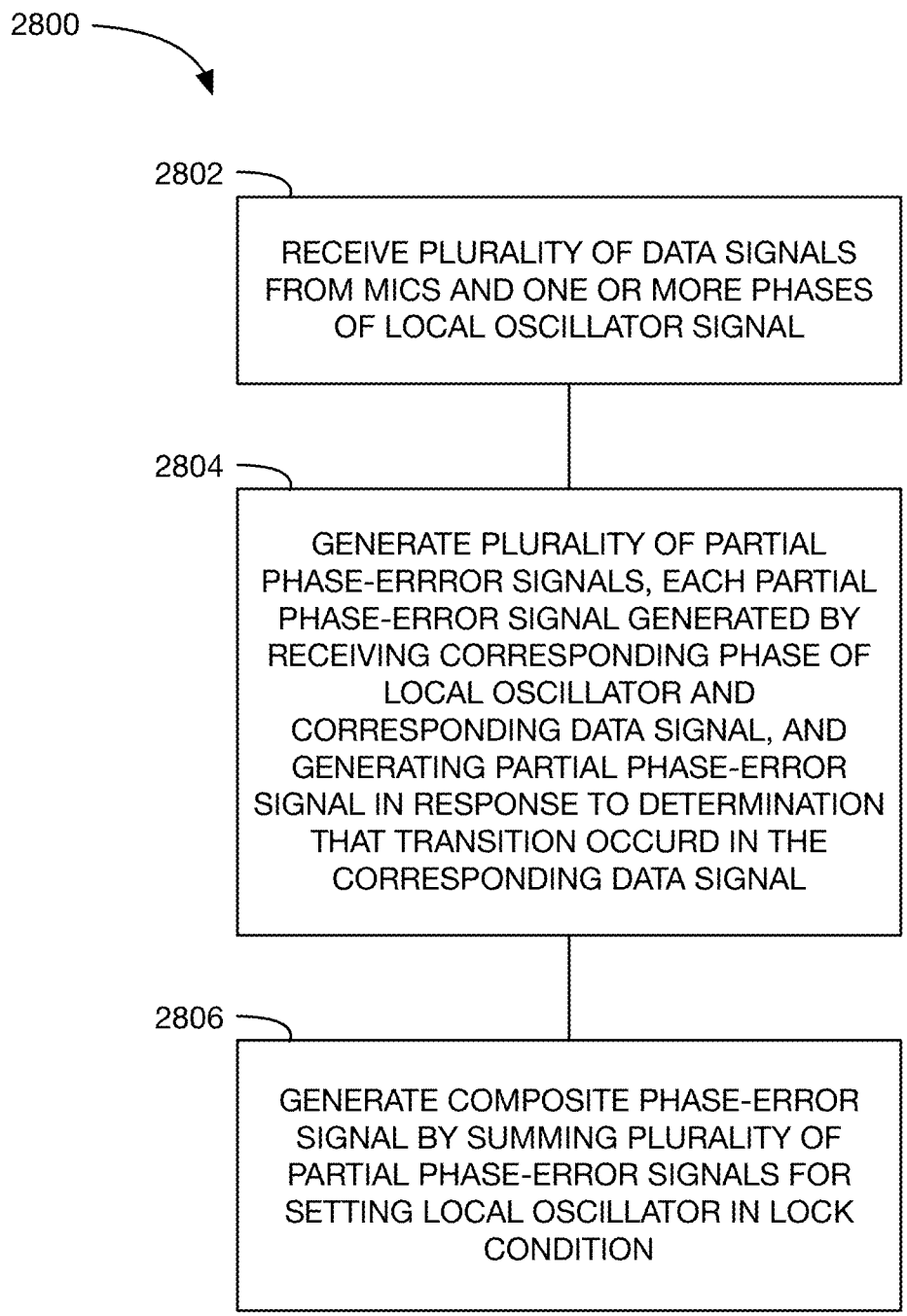
FIG. 28 is a flowchart of a method, in accordance with some embodiments.

FIG. 28 is a flowchart of a method 2800, in accordance with some embodiments. As shown, method 2800 includes receiving 2802, at a data-driven phase comparator circuit, a plurality of data signals in parallel from a plurality of multi-input comparators (MICs) connected to a multi-wire bus, wherein at least one MIC is connected to at least three wires of the multi-wire bus, and one or more phases of a local oscillator signal, the data-driven phase comparator circuit comprising a plurality of partial phase comparators, generating 2804, a plurality of partial phase-error signals using the partial phase comparators, each partial phase-error signal generated by receiving (i) a corresponding phase of the local oscillator signal and (ii) a corresponding data signal of the plurality of data signals and responsive to a determination that a transition occurred in the corresponding data signal, generating the partial phase-error signal based on a comparison of the corresponding phase of the local oscillator signal and the corresponding data signal, and generating 2806 a composite phase-error signal by summing the plurality of partial phase error signals, the composite phase-error signal for setting a local oscillator generating the one or more phases of the local oscillator signal in a lock condition.

In some embodiments, the partial phase-error signals are analog signals formed using respective charge pump circuits. In such embodiments, the method further includes filtering the composite phase-error signal.

In some embodiments, the method further includes introducing, for a given partial phase comparator, a sub-channel specific delay into the corresponding phase of the local oscillator signal, the sub-channel specific delay associated with the data signal received at the given partial phase comparator.

In some embodiments, the comparison of the corresponding phase of the local oscillator signal and the corresponding data signal is formed using a linear edge-triggered phase detector. Alternatively, the comparison of the corresponding phase of the local oscillator signal and the corresponding data signal may be formed using an edge-triggered bang-bang phase detector.

In some embodiments, the method further includes applying a weight to the partial phase-error signal. In some embodiments, the plurality of data signals have a collective transition density above a predetermined threshold. In some embodiments, the method further includes outputting a no-change result in response to determining no transition occurred. In such embodiments, outputting the no-change result includes setting the partial phase comparator in a high-impedance state.

PLL Startup

In many communications environments, the minimum transition density of data signals may be low, thus for relatively long periods of time the PLL oscillator must continue running with no change in frequency. As previously described, selection of a phase detector design capable of being configured to produce a "no change" output in the absence of data transitions helps satisfy this requirement, as does selection of an oscillator with good stability characteristics.

At startup, however, the situation may be quite different. The VCO may start oscillation at very high or very low frequency relative to its desired operating frequency, and the density of transitions received on data lines may be very high, especially if an initialization procedure transmits training patterns or other special data sequence as part of CTLE adjustment or other receiver calibration. Thus, it is possible that PLL lock may take considerable time, or may result in VCO operation at the wrong frequency.

[Tajalli III] describes a "Frequency Lock Assist" for PLL initialization, composed of an additional phase/frequency detector that can override spurious frequency excursions and force the PLL into a normal operational mode, at which point its normal phase comparator may take over.

Multi-Modal Data-Driven Clock Recovery Circuit

Figure 32:
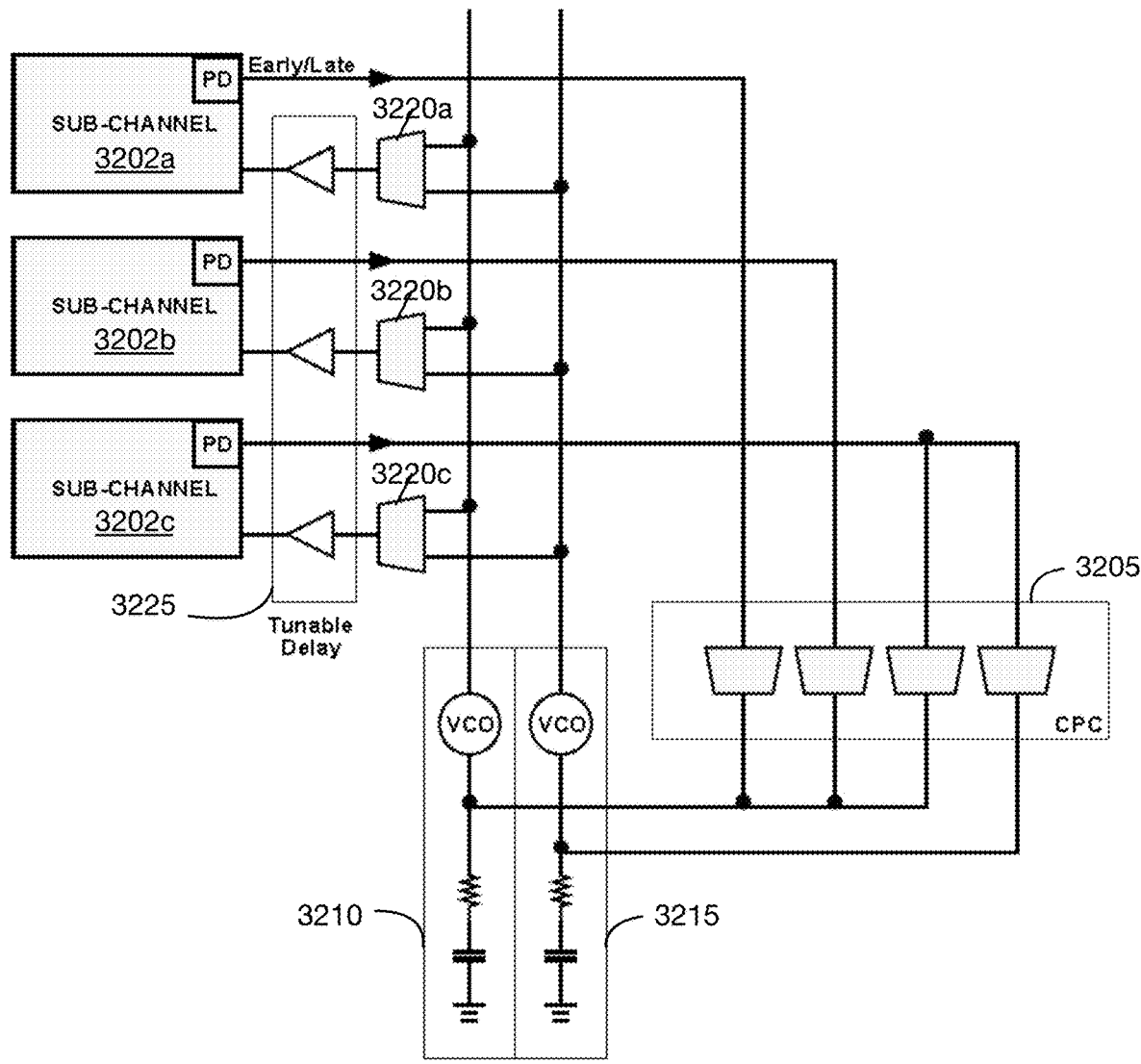
FIG. 32 is a block diagram of a multi-modal data-driven clock recovery circuit, in accordance with some embodiments.
Figure 33:
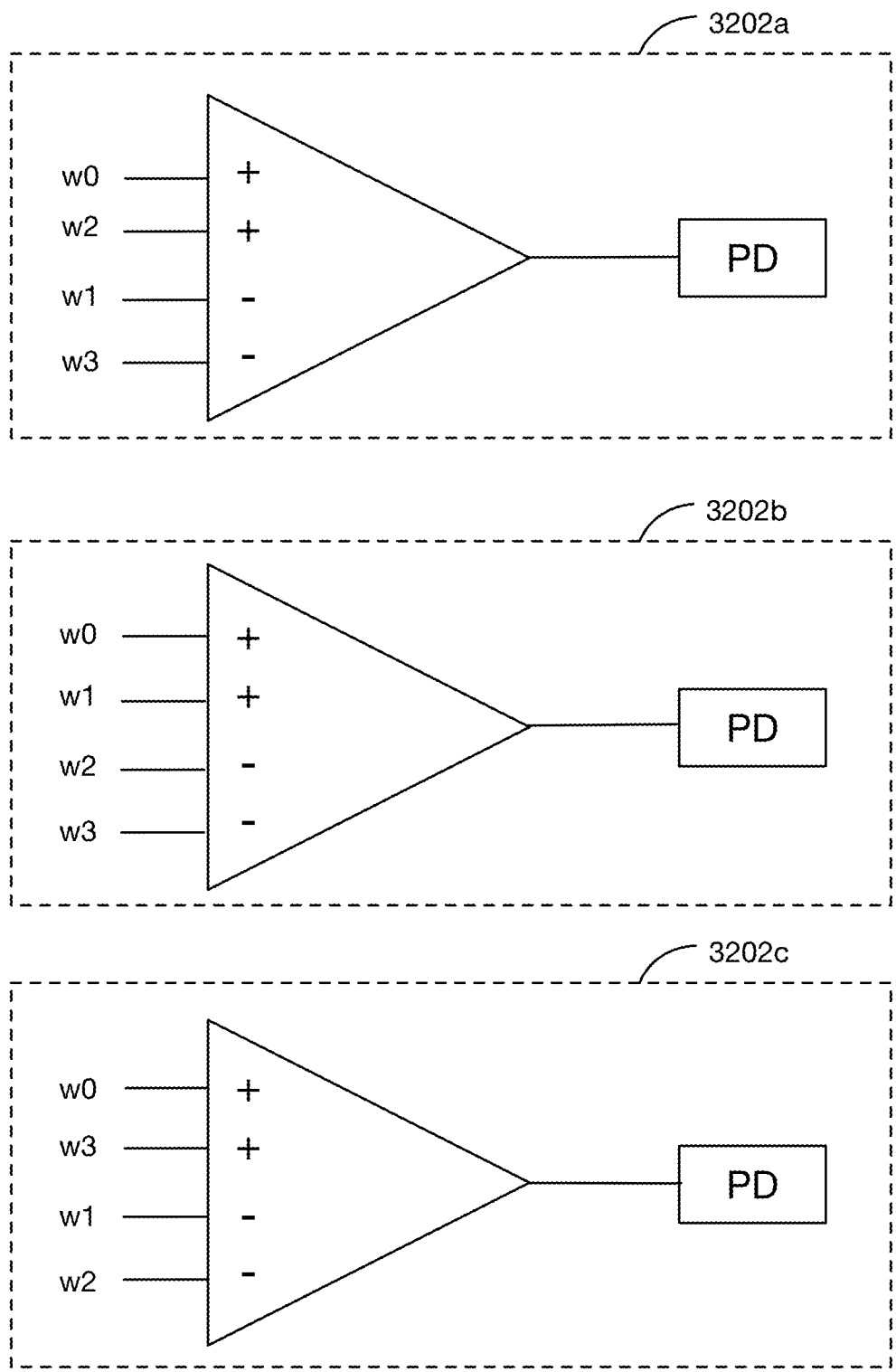
FIG. 33 is a network of ensemble non-return-to-zero (ENRZ) multi-input comparators (MICs), in accordance with some embodiments.
Figure 34:
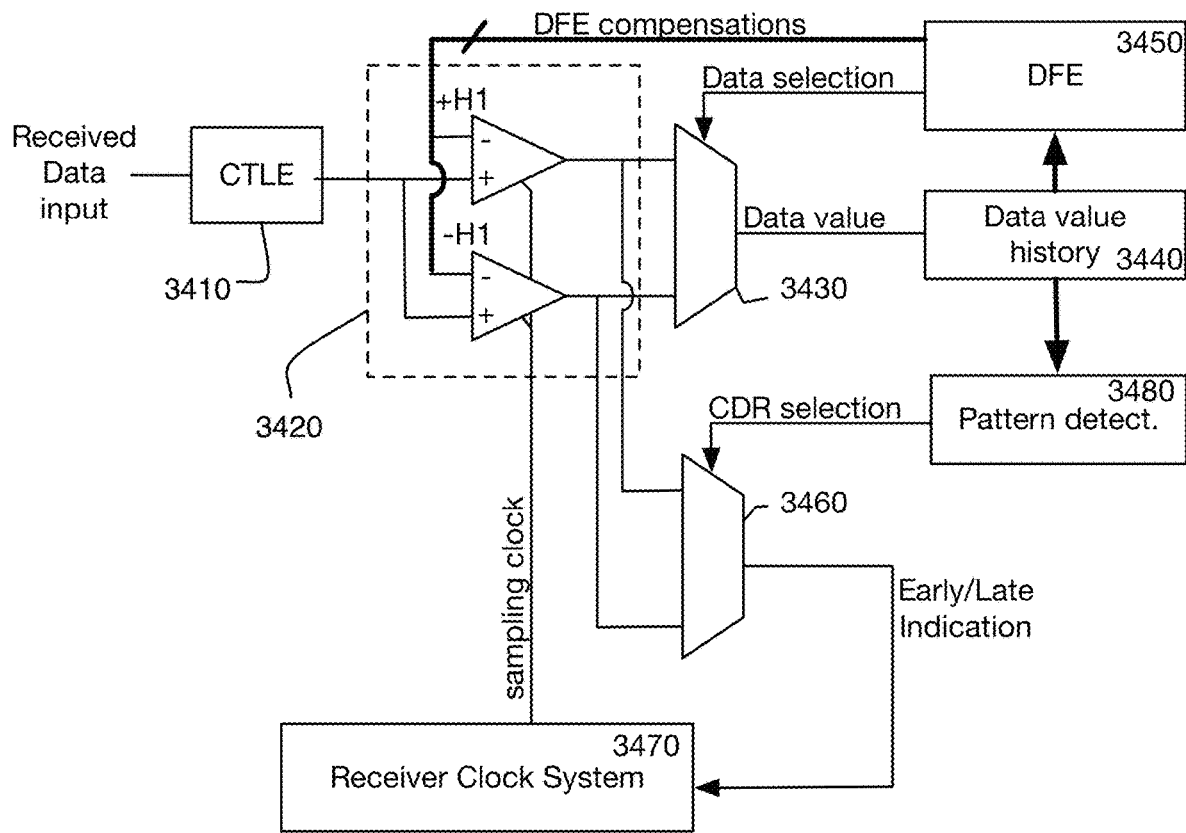
FIG. 34 is a block diagram of a sampling device incorporating speculative decision feedback equalization (DFE), in accordance with some embodiments.

In some embodiments, a data-driven clock recovery circuit may be configurable to operate in various modes, including a legacy mode. FIG. 32 illustrates an exemplary multi-modal data-driven clock recovery circuit, in accordance with some embodiments. As shown, the multi-modal data-driven clock recovery circuit includes a plurality of sub-channels 3202a/3202b/3202c, which may take the form of sub-channel MICs as shown in FIG. 33 and may also have a multi-phase receiver configuration similar to FIG. 25. Further, each sub-channel may include a data-driven phase detector (PD) element configured to generate a respective data-driven phase-error signal representing an early/late indication with respect to sampling clocks provided by local oscillators 3210 and/or 3215. In particular, such a data-driven PD may be implemented as shown in FIG. 34, where two separate slicer elements 3420 are used to measure the output of the MIC. Note that each slicer uses a speculative DFE-based offset voltage, where one slicer uses the positive speculative DFE correction value +H1, and the other uses a negative speculative DFE correction value –H1, both of which are applied via the DFE compensations connections. Thus, one such speculative DFE correction value is associated with a speculative or "unrolled" DFE correction value assuming the previous data bit was a one, and the other such speculative DFE correction value is associated with a speculative or "unrolled" DFE correction value assuming the previous data bit was a zero. In such embodiments, once a data decision for a prior bit that was conveyed on the sub-channel has been made by DFE unit 3450, that decision may be used to select one slicer output as a valid data signal having had an appropriate DFE compensation applied to it (by via mux 3430), while the other slicer (offset in the opposite amplitude direction) may provide a useful early/late determination and is selected by mux 3460 as an early/late detection. In some embodiments, pattern detect 3480 verifies a transition has occurred in the sub-channel output, thus verifying that the early-late indication is valid and may thus be used to form a valid data-driven phase-error signal. Charge pump circuits 3205 may receive the early-late indications and provide data-driven phase-error signals that are subsequently combined to form a composite phase-error signal to provide to local oscillator 3210, which may include a loop filter illustrated by the series-connected resistor and capacitor. Note that in the embodiment shown in FIG. 32, the local oscillator control signal is generated in the analog signal domain and thus provides a loop bandwidth that is generally higher than loop control based solely on digital error filtering and integration/accumulation.

In a first mode of operation, the circuit may utilize all three sub-channel outputs generated by sub-channels 3202a/3202b/3202c. The number of sub-channels is shown as three purely for illustrative purposes, and is not considered limiting, as higher orders of orthogonal ensemble non-return-to-zero (ENRZ) signaling may be used. In some embodiments, each sub-channel device 3202a/3202b/3202c may include a MIC, and additionally may include a sampling circuit. FIG. 33 illustrates an exemplary configuration of a network of three MICs, in accordance with some embodiments. The network of MICs shown in FIG. 33 may be utilized in an ENRZ coding scheme. As shown, the three MICs are connected to a multi-wire bus having four wires, w0-w3. The output of each MIC represents a linear combination of codeword symbols received as signals on the four wires. Each MIC may perform a linear combination according to an input permutation of the wires connected to the MIC, where each input permutation is determined by a respective row of a plurality of mutually orthogonal rows of an orthogonal matrix. FIG. 33 illustrates 3 different wire input permutations that may be determined by rows of a size 4 Hadamard (H4) matrix. For purposes of clock recovery, data signal transitions are compared via phase detectors to a phase of a sampling clock provided by local oscillator 3210 to generate corresponding data-driven phase-error signals. The data-driven phase-error signals formed by individual charge pump circuits 3205 operating on the early/late indications associated with sub-channels undergoing a transition are summed together to generate a composite phase-error signal and provided to local oscillator 3210 to make phase/frequency adjustments to the sampling clock generated by local oscillator 3210. As shown in FIG. 32, the circuit may further include tunable sub-channel specific delay elements 3225 to account for sub-channel specific skew, as described above. Further, in the case that one or more sub-channels do not have data transitions, e.g., by pattern detect circuit 3480, the corresponding charge pump output may be set in a high-impedance state or otherwise output a "no-change" indication.

In a legacy mode of operation, the sub-channel MIC 3202b may be switched off or otherwise disabled, and the circuit may operate in a non-return-to-zero (NRZ) mode of operation, with sub-channel MICs 3202a and 3202c each being configured to receive a respective differential data signal over a respective pair of wires of the four-wires bus, and responsively generate respective NRZ outputs. In such an embodiment, sub-channel MIC 3202a may be connected to wires w0/w1 while wires w2/w3 are disconnected, and similarly sub-channel MIC 3202c may be connected to wires w2/w3 with wires w0/w1 being disconnected. The NRZ output of sub-channel MIC 3202c may be used to generate a phase-error signal for adjusting a second local oscillator 3215 via the right-most charge pump circuit, which may have an independent frequency and/or phase relationship with respect to local oscillator 3210. Selection circuit 3220c (e.g., a multiplexor) directs the sampling clock generated by local oscillator 3215 to a sampler in sub-channel MIC 3202c to generate the early-late indication associated with sub-channel 3202c. Selection circuits 3220a and 3220b are shown for illustrative purposes to illustrate symmetrical loading effects on each sub-channel MIC. In alternative embodiments, selection circuits 3220a and 3220b may be omitted as sub-channels 3202a and 3202b are, in most preferred embodiments, only connected to local oscillator 3210 (e.g., as shown in FIG. 32). In some embodiments, selection circuits 3220a and 3220b may be included for loading purposes and to keep the circuitry consistent across each sub-channel MIC. In such embodiments, the selection circuits 3220a and 3320b connected to local oscillator 3215 may be multiplexors having selection inputs tied to VDD or ground. It should be noted that the combination of sub-channels operating in NRZ mode may vary, and the configuration shown in FIG. 32 illustrates only one possible configuration. In some embodiments, similar operations may be performed using a different number of sub-channels, such as the embodiment utilizing five sub-channel MICs connected to a multi-wire bus including six wires shown in FIG. 25, and described in more detail below.

In some embodiments, a mode controller is used to configure a multi-modal clock recover circuit to operate in an orthogonal differential vector signaling (ODVS) mode (e.g., ENRZ) or an NRZ mode. The mode controller may include protocol processing hardware to interpret protocol messages received over a configuration bus and to configure sub-channel MICs to detect ODVS mode signals, or NRZ mode signals. The mode signal may take the form of a configuration parameter in a message received as part of a bus negotiation sequence. In, for example, an ENRZ ODVS mode, the mode controller connects the plurality of sub-channel MIC devices to the multi-wire bus according to respective wire input permutations of a plurality of wire input permutations, and enables the charge pumps associated with local oscillator 3210. In addition, the sampling clock signal from the output of local oscillator 3210 is provided to a plurality of samplers associated with the sub-channel MIC devices by the mode controller as needed (some embodiments have only 3220c connected to the mode controller signals). Finally, sub-channel-specific delay settings may be applied via the tunable sub-channel specific delay elements 3225 by the mode controller.

In an NRZ mode, the mode controller may configure the plurality of MICs to generate first and second NRZ outputs by disabling inputs from the unused wires for sub-channel MICs 3202a and 3202c (and further disabling MIC 3202b entirely) and may enable the left-most charge pump to provide a first local oscillator control signal to the first local oscillator 3210 generating the first sampling clock and the right-most charge pump to provide a second local oscillator control signal to the second local oscillator 3215 generating the second sampling clock, thereby configuring the two local oscillators 3210 and 3215 to operate independently based on the local oscillator control signals from 3202 a and 3202c respectively. In some embodiments, the mode controller may configured first and second MICs to be connected to respective pairs of adjacent wires, to reduce e.g. crosstalk effects of neighboring wires.

In a further embodiment, configurable sub-channel specific delay elements may be introduced between receiver clock system 3470 and each sub-channel's samplers 3420, to allow incremental correction of timing variations among the multiple sub-channels. Using the previous three sub-channel system as an example offered without implying limitation, it may be observed that the signals received on sub-channel 2 transition later than those of sub-channels 1 and 3, thus the early/late indications from sub-channel 2 indicate an "early" clock, even though sub-channels 1 and 3 do not. Such scenarios may occur due to variation in common mode signal propagation on the four wires of the multi-wire bus. In such a scenario, the delay element associated with sub-channel 2 may be configured to introduce a slight delay, moving its sampling time later relative to the overall clock timing. In at least one embodiment, individual clock source selections may be made for the sub-channel samplers associated with data and clock edge detection, and with auxiliary functions such as gathering statistical eye graph data and calibration. In such an embodiment, clock source selections include at least the unmodified clock provided by the Receiver Clock System, the incrementally delayed clock provided by the configurable delay element and may also include a separately adjustable clock used for statistical eye graph sampling.

Figure 36:
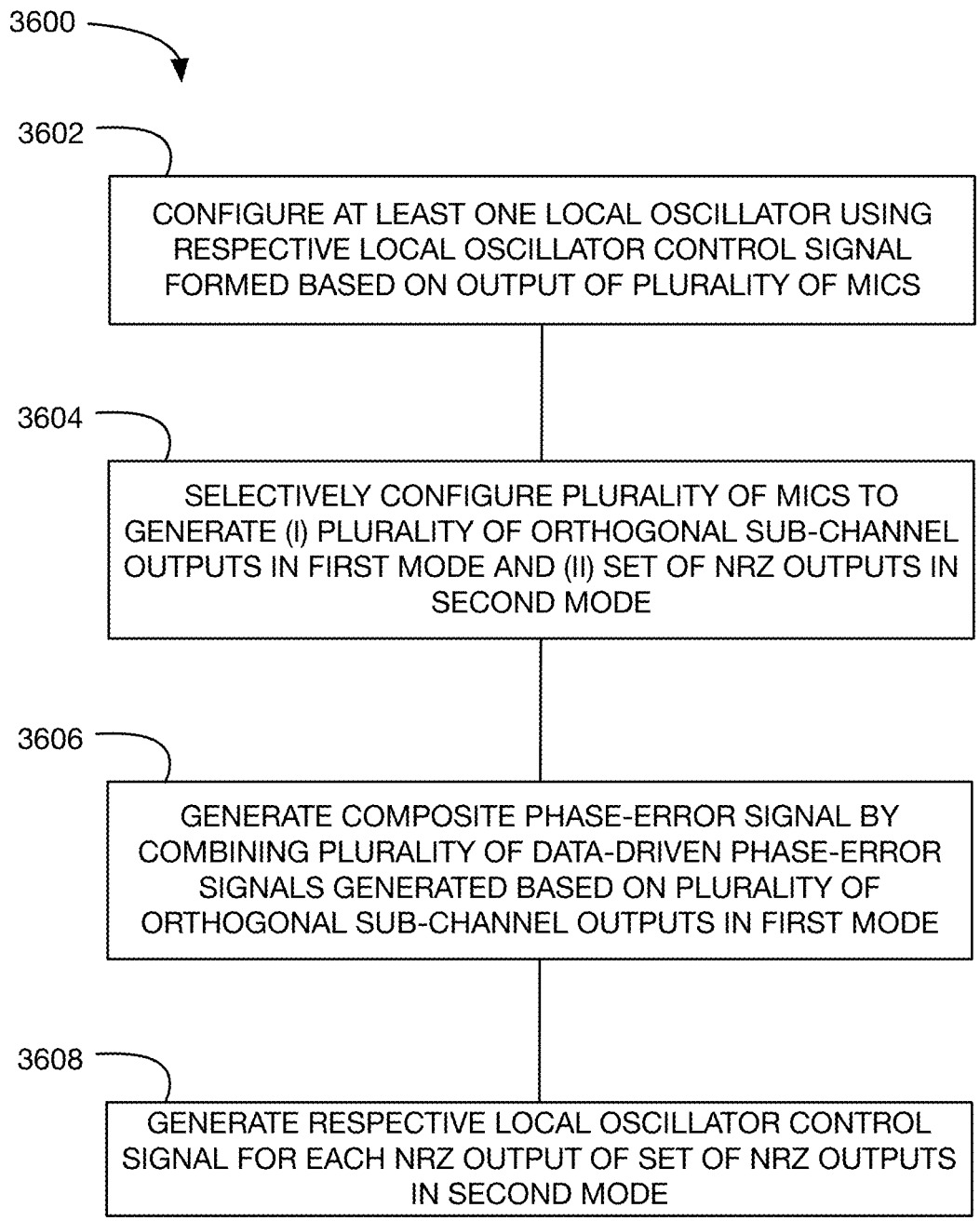
FIG. 36 is a flowchart of a method, in accordance with some embodiments.

FIG. 36 illustrates a flowchart of a method 3600, in accordance with some embodiments. As shown, method 3600 includes configuring 3602 at least one local oscillator of a plurality of local oscillators using a respective local oscillator control signal formed based on outputs of a plurality of MICs connected to a plurality of wires of a multi-wire bus. The plurality of MICs are selectively configured 3604 to (i) generate a plurality of orthogonal sub-channel outputs in a first mode by configuring at least one MIC to compare a set of at least three signals received via respective wires of the multi-wire bus, and (ii) to generate a set of non-return-to-zero (NRZ) outputs in a second mode by configuring a subset of the plurality of MICs to compare signals received on respective pairs of wires of the multi-wire bus. In the first mode, a plurality of data-driven phase-error signals are generated based on the plurality of orthogonal sub-channel outputs and responsively combined 3606 to form a composite phase-error signal, the composite phase-error signal provided to a local oscillator of the plurality of local oscillators. In the second mode, a respective local oscillator control signal is generated 3608 for each NRZ output of the set of NRZ outputs, and responsively providing each respective local oscillator control signal to a respective local oscillator of the plurality of local oscillators.

In some embodiments, the method further includes disabling a MIC of the plurality of MICs in the second mode. In some embodiments, the respective pairs of wires of the multi-wire bus comprise adjacent wires in the second mode, e.g., wires w0,w1 in the first pair and wires w2,w3 in the second pair.

In some embodiments, the local oscillator provides a sampling clock to a plurality of samplers operating on the orthogonal sub-channel outputs in the first mode. In some embodiments, the method further includes applying a respective sub-channel specific delay to the sampling clock prior to providing the sampling clock to each sampler of the plurality of samplers.

In some embodiments, the orthogonal sub-channel outputs are ensemble non-return-to-zero (ENRZ) sub-channel outputs.

In some embodiments, the method further includes connecting the inputs of each MIC of the plurality of MICs to the wires of the multi-wire bus in the first mode according to a respective wire input permutation of a plurality of wire input permutations. In some such embodiments, each wire input permutation of the plurality of wire input permutations corresponds to a respective row of a plurality of rows of an orthogonal matrix.

In some embodiments, each data-driven phase-error signal is formed based on a selection of a speculative decision feedback equalization (DFE) correction value of a pair of speculative DFE correction values, using e.g. the sampler shown in FIG. 34 that includes speculative DFE.

In some embodiments, combining the plurality of data-driven phase-error signals includes forming an analog summation of analog data-driven phase-error signals at a common node.

Figure 35:
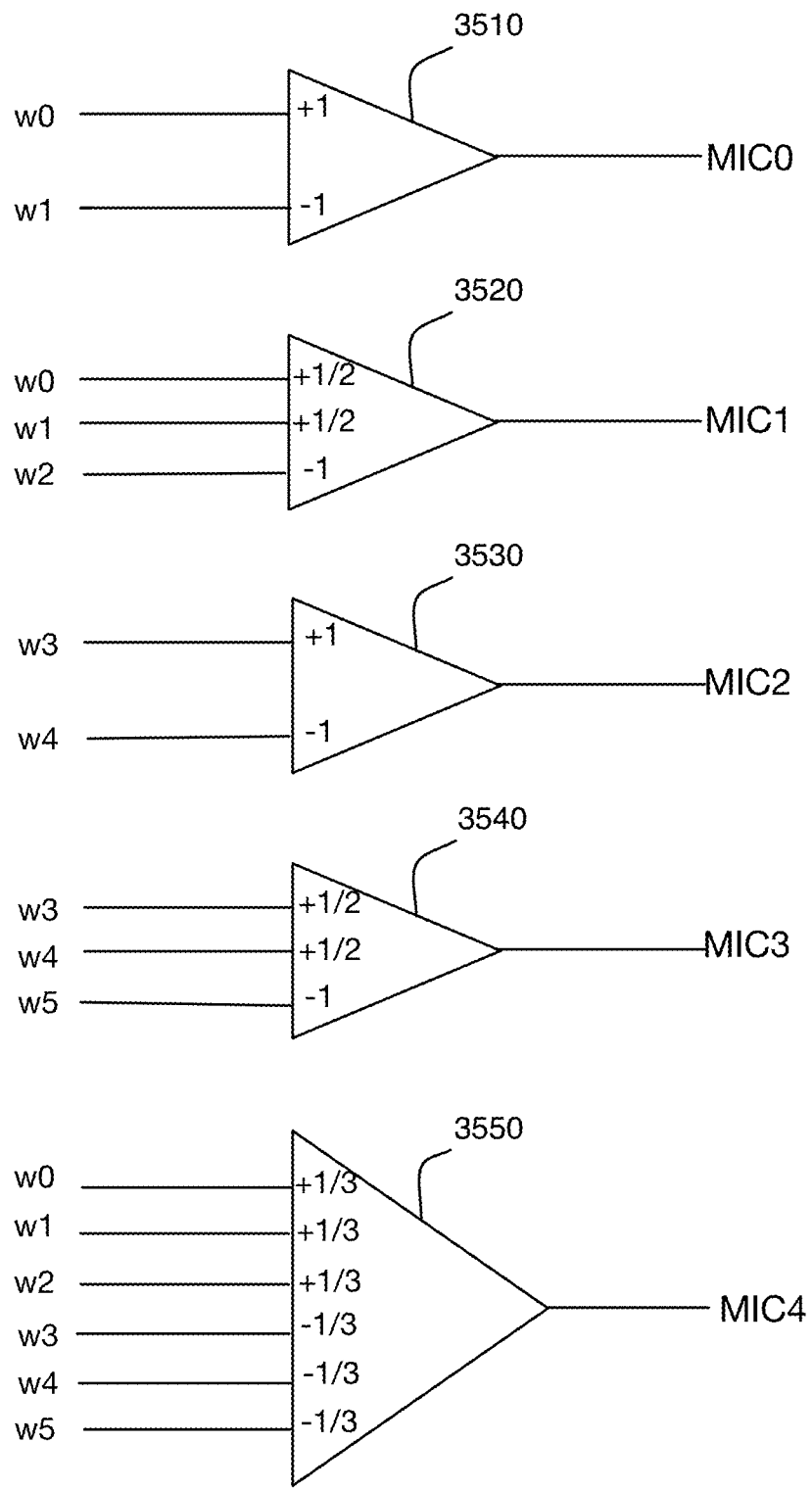
FIG. 35 is a network of MICs, in accordance with some embodiments.

In the above embodiment, the ENRZ ODVS code was described in detail, however it should be noted that other ODVS codes may be used as well. One particular example is the CNR-5 or "Glasswing" code of [Shokrollahi II]. FIG. 35 illustrates a MIC configuration for the Glasswing ODVS code, in accordance with some embodiments. In such embodiments, the clock signal received from MIC5 in FIG. 2 after being transported over two dedicated clock wires could just as easily be received from, as one example MIC4, having been transported as one sub-channel of the vector signaling code also carrying the data. This method of embedding the clock in a vector signaling code sub-channel is described in [Shokrollahi II] and [Holden III]. All of the described clock embedding embodiments therein may be beneficially combined with the PLL and timing control mechanisms described herein, without limitation. Furthermore, particular embodiments may similarly operate on the sub-channel outputs of MIC0-MIC4, analyzing the received data for transitions and using the speculative DFE sampler of FIG. 34 to provide early/late indications for use in generating data-driven phase-error signals. In such an embodiment, an NRZ mode may be used by disabling MICs 3520, 3540, and 3550, and enabling MICs 3510 and 3530 to detect differential NRZ signals transmitted on wires w0,w1 and w3,w4, respectively. Furthermore, ODVS mode may be configured by enabling all of the MICs of FIG. 35 and modifying FIG. 32 to account for a total of 5 sub-channel MICs, rather than the 3 sub-channel MICs shown in FIG. 32.

The invention claimed is:

1. An apparatus comprising:
a plurality of multi-input comparators (MICs), each MIC configured to generate a respective MIC output by forming a linear combination of signals selected from wires of a multi-wire bus;
a first local oscillator configured to generate a first sampling clock and a second local oscillator configured to generate a second sampling clock;
a plurality of phase detectors, each phase detector configured to determine a data-driven phase error signal at each respective MIC output;
a mode controller for selecting between a first mode and a second mode:
wherein responsive to selection of the first mode, the mode controller is configured to:
configure the plurality of MICs by connecting inputs of each MIC to all the wires of the multi-wire bus according to a respective input permutation associated with a respective orthogonal sub-channel of a plurality of orthogonal sub-channels, the plurality of MICs generating a plurality of orthogonal sub-channel outputs;
configure the plurality of phase detectors to generate a composite phase-error signal to adjust the first local oscillator, the composite phase-error signal generated by forming a summation of the data-driven phase-error signals determined by the plurality of phase detectors, the data-driven phase-error signals associated with the plurality of orthogonal sub-channel outputs; and,
wherein responsive to selection of the second mode, the mode controller is configured to:
configure the plurality of MICs to generate first and second non-return-to-zero (NRZ) outputs by connecting inputs of a first MIC to a first pair of wires of the multi-wire bus and connecting a second MIC to a second pair of wires of the multi-wire bus;
configure the plurality of phase detectors generate a first local oscillator control signal to adjust the first local oscillator and to generate a second local oscillator control signal to adjust the second local oscillator.

2. The apparatus of claim 1, wherein the mode controller is configured to disable at least one MIC of the plurality of MICs in the second mode.

3. The apparatus of claim 1, wherein the first pair of wires of the multi-wire bus and the second pair of wires of the multi-wire bus correspond to adjacent pairs of wires.

4. The apparatus of claim 1, wherein each MIC of the plurality of MICs comprises a corresponding sampling circuit configured to generate the respective MIC output.

5. The apparatus of claim 4, further comprising a respective sub-channel specific delay element connected to the corresponding sampling circuit, the respective sub-channel specific delay element configured to receive the first sampling clock and to output a corresponding sub-channel specific sampling clock to the corresponding sampling circuit.

6. The apparatus of claim 1, wherein the plurality of orthogonal sub-channel outputs are ensemble non-return-to-zero (ENRZ) sub-channel outputs.

7. The apparatus of claim 1, wherein the mode controller is configured to connect the inputs of each MIC of the plurality of MICs to the wires of the multi-wire bus in the first mode according to a respective wire input permutation of a plurality of wire input permutations.

8. The apparatus of claim 7, wherein each wire input permutation of the plurality of wire input permutations corresponds to a respective row of a plurality of rows of an orthogonal matrix.

9. The apparatus of claim 1, wherein each data-driven phase error signal is generated based on a selection of a speculative decision feedback equalization (DFE) correction value of a pair of speculative DFE correction values.

10. The apparatus of claim 1, further comprising a summation circuit configured to receive the plurality of data-driven phase-error signals and to responsively generate the composite phase-error signal.

11. A method comprising:
configuring at least one local oscillator of a plurality of local oscillators using a respective local oscillator control signal formed based on outputs of a plurality of multi-input comparators (MICs) connected to a plurality of wires of a multi-wire bus;
selectively configuring the plurality of MICs to (i) generate a plurality of orthogonal sub-channel outputs in a first mode by configuring at least one MIC to compare a set of at least three signals received via respective wires of the multi-wire bus, and (ii) to generate a set of non-return-to-zero (NRZ) outputs in a second mode by configuring a subset of the plurality of MICs to compare signals received on respective pairs of wires of the multi-wire bus;

generating, in the first mode, a plurality of data-driven phase-error signals based on the plurality of orthogonal sub-channel outputs and forming a composite phase-error signal by combining the plurality of data-driven phase-error signals, the composite phase-error signal provided to a local oscillator of the plurality of local oscillators; and generating, in the second mode, a respective local oscillator control signal for each NRZ output of the set of NRZ outputs, and providing each respective local oscillator control signal to a respective local oscillator of the plurality of local oscillators.

12. The method of claim 11, further comprising disabling a MIC of the plurality of MICs in the second mode.

13. The method of claim 11, wherein the respective pairs of wires of the multi-wire bus comprise adjacent wires in the second mode.

14. The method of claim 11, wherein the local oscillator provides a sampling clock to a plurality of samplers operating on the orthogonal sub-channel outputs in the first mode.

15. The method of claim 14, further comprising applying a respective sub-channel specific delay to the sampling clock prior to providing the sampling clock to each sampler of the plurality of samplers.

16. The method of claim 11, wherein the orthogonal sub-channel outputs are ensemble non-return-to-zero (ENRZ) sub-channel outputs.

17. The method of claim 11, further comprising connecting the inputs of each MIC of the plurality of MICs to the wires of the multi-wire bus in the first mode according to a respective wire input permutation of a plurality of wire input permutations.

18. The method of claim 17, wherein each wire input permutation of the plurality of wire input permutations corresponds to a respective row of a plurality of rows of an orthogonal matrix.

19. The method of claim 11, wherein each data-driven phase-error signal is formed based on a selection of a speculative decision feedback equalization (DFE) correction value of a pair of speculative DFE correction values.

20. The method of claim 11, wherein combining the plurality of data-driven phase-error signals comprises forming an analog summation of analog data-driven phase-error signals at a common node.

* * * * *